(12) United States Patent
Ide et al.

(10) Patent No.: US 8,817,559 B2
(45) Date of Patent: Aug. 26, 2014

(54) SEMICONDUCTOR DEVICE AND MANUFACTURING METHOD THEREOF

(75) Inventors: Akira Ide, Tokyo (JP); Shinji Furumi, Kanagawa (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 195 days.

(21) Appl. No.: 13/364,017

(22) Filed: Feb. 1, 2012

(65) Prior Publication Data

US 2012/0195144 A1    Aug. 2, 2012

(30) Foreign Application Priority Data

Feb. 2, 2011    (JP) .................... 2011-020539

(51) Int. Cl.
*G11C 29/04* (2006.01)
*H01L 21/02* (2006.01)

(52) U.S. Cl.
USPC .................... 365/200; 438/4; 257/E21.002

(58) Field of Classification Search
None
See application file for complete search history.

(56) References Cited

U.S. PATENT DOCUMENTS

| | | | |
|---|---|---|---|
| 6,269,030 B1 | 7/2001 | Hara | |
| 6,388,941 B2 | 5/2002 | Otori et al. | |
| 6,586,823 B2 | 7/2003 | Ohmura et al. | |
| 6,697,292 B1 | 2/2004 | Fukuda | |
| 6,940,765 B2 | 9/2005 | Kyung | |
| 7,263,010 B2 | 8/2007 | Iwai et al. | |
| 7,421,636 B2 | 9/2008 | Kang et al. | |
| 7,688,663 B2 | 3/2010 | Chu et al. | |
| 8,023,347 B2 | 9/2011 | Chu et al. | |
| 2002/0006062 A1 | 1/2002 | Otori et al. | |
| 2003/0030135 A1 | 2/2003 | Ohmura et al. | |
| 2004/0066684 A1* | 4/2004 | Ito .................................. 365/201 | |
| 2004/0246791 A1* | 12/2004 | Nagata et al. ................. 365/200 | |
| 2005/0041491 A1 | 2/2005 | Kyung | |
| 2006/0221729 A1 | 10/2006 | Iwai et al. | |
| 2006/0271831 A1 | 11/2006 | Kang et al. | |
| 2009/0040861 A1* | 2/2009 | Ruckerbauer ............ 365/230.03 | |
| 2009/0141577 A1 | 6/2009 | Chu et al. | |
| 2010/0142299 A1 | 6/2010 | Chu et al. | |
| 2012/0182816 A1 | 7/2012 | Ide et al. | |

FOREIGN PATENT DOCUMENTS

| | | |
|---|---|---|
| JP | 2001-35186 A | 2/2000 |
| JP | 2001-052497 A | 2/2001 |
| JP | 2002-025289 A | 1/2002 |
| JP | 2003-59288 A | 2/2003 |
| JP | 2004-296054 A | 10/2004 |
| JP | 2004-303343 A | 10/2004 |
| JP | 2005/71582 A | 3/2005 |
| JP | 2006-286141 A | 10/2006 |
| JP | 2006-338854 A | 12/2006 |
| JP | 2007-234155 A | 9/2007 |

(Continued)

*Primary Examiner* — Hoai V Ho
*Assistant Examiner* — James G Norman
(74) *Attorney, Agent, or Firm* — Sughrue Mion, PLLC

(57) ABSTRACT

Such a device is disclosed that includes: redundancy circuits for replacing defective memory cells included in a memory cell array; an electrical fuse circuit that stores addresses of the defective memory cells; a data determination circuit that generates a determination signal by determining whether test data read from the memory cell array is correct or incorrect; and an analysis circuit that supplies, in a first operation mode, the electrical fuse circuit with an address signal supplied when the determination signal is activated, and supplies, in a second operation mode, the electrical fuse circuit with an address signal supplied when a data mask signal supplied from outside is activated irrespective of the determination signal.

13 Claims, 39 Drawing Sheets

(56) References Cited

FOREIGN PATENT DOCUMENTS

| JP | 2007-328914 A | 12/2007 |
| JP | 2009-134842 A | 6/2009 |
| JP | 2012-108973 A | 6/2012 |
| JP | 2012-150860 A | 8/2012 |

* cited by examiner

144

| FMI<0> | D | x0 | y0 | x1 | y1 | z |
| --- | --- | --- | --- | --- | --- | --- |
| FMI<1> | D | x0 | y0 | x1 | y1 | z |
| FMI<2> | D | x0 | y0 | x1 | y1 | z |
| FMI<3> | D | x0 | y0 | x1 | y1 | z |
| ⋮ | | | ⋮ | | | |
| FMI<N> | D | x0 | y0 | x1 | y1 | z |

FIG.6

| Fail Bit Map Image | FMI Code ||||||
|---|---|---|---|---|---|---|
| | D | x0 | y0 | x1 | y1 | z |
| (empty grid) | Null | - | - | - | - | - |
| (grid with bit 1) | Sn | X-Add of "bit 1" | Y-Add of "bit 1" | - | - | Z-Add of "bit 1" |
| (grid with bits 1,2 horizontal) | Bx | X-Add of "bit 1" | Y-Add of "bit 1" | X-Add of "bit 2" | Y-Add of "bit 2" | Z-Add of "bit 1" |
| (grid with bits 1,2 vertical) | By | X-Add of "bit 1" | Y-Add of "bit 1" | X-Add of "bit 2" | Y-Add of "bit 2" | Z-Add of "bit 1" |
| (grid with bits 1,2,3) | Tr | X-Add of "bit 1" | Y-Add of "bit 1" | X-Add of "bit 2" | Y-Add of "bit 3" | Z-Add of "bit 1" |
| (grid with bits 1,2,3,4) | Sq | X-Add of "bit 1" | Y-Add of "bit 1" | X-Add of "bit 4" | Y-Add of "bit 4" | Z-Add of "bit 1" |
| (grid with bits 1,2,3 horizontal) | Cx | X-Add of "bit 1" | Y-Add of "bit 1" | X-Add of "bit 3" | Y-Add of "bit 3" | Z-Add of "bit 1" |
| (grid with bits 1,2,3 vertical) | Cy | X-Add of "bit 1" | Y-Add of "bit 1" | X-Add of "bit 3" | Y-Add of "bit 3" | Z-Add of "bit 1" |

FIG.7

| D<2> | D<1> | D<0> | code |
|---|---|---|---|
| 0 | 0 | 0 | Null |
| 0 | 0 | 1 | Sn |
| 0 | 1 | 0 | Bx |
| 0 | 1 | 1 | By |
| 1 | 0 | 0 | Tr |
| 1 | 0 | 1 | Sq |
| 1 | 1 | 0 | Cx |
| 1 | 1 | 1 | Cy |

FIG.8

| D | xeq0 | yeq0 | xeq1 | yeq1 | zeq | Ovf | Command |
|---|---|---|---|---|---|---|---|
| Null | X | X | X | X | X | 0 | null_to_sn |
| Sn | 0 | 0 | X | X | 1 | 0 | nop |
| Sn | 0 | 1 | X | X | 1 | 0 | sn_to_by |
| Sn | 1 | 0 | X | X | 1 | 0 | sn_to_bx |
| Sn | 1 | 1 | X | X | 1 | 0 | exit |
| Bx | 1 | 0 | X | 0 | 1 | 0 | bx_to_cx |
| Bx | 1 | X | X | 1 | 1 | 0 | exit |
| Bx | 1 | 1 | X | X | 1 | 0 | exit |
| Bx | 0 | 1 | X | X | 1 | 0 | bx_to_tr1 |
| Bx | 0 | 0 | 1 | X | 1 | 0 | nop |
| Bx | 0 | 0 | 0 | 1 | 1 | 0 | bx_to_tr2 |
| Bx | 0 | 0 | 0 | 0 | 1 | 0 | nop |
| By | 1 | 0 | X | X | 1 | 0 | by_to_tr1 |
| By | 1 | 1 | X | X | 1 | 0 | exit |
| By | 0 | 1 | 0 | X | 1 | 0 | by_to_cy |
| By | 0 | 1 | 1 | X | 1 | 0 | exit |
| By | 0 | 0 | 1 | 0 | 1 | 0 | by_to_tr2 |
| By | 0 | 0 | 1 | 1 | 1 | 0 | exit |
| By | 0 | 0 | 0 | X | 1 | 0 | nop |
| Tr | 1 | 0 | X | 0 | 1 | 0 | tr_to_sncx |
| Tr | 1 | 1 | X | X | 1 | 0 | exit |
| Tr | 1 | X | X | 1 | 1 | 0 | exit |
| Tr | 0 | 1 | 0 | X | 1 | 0 | tr_to_sncy |
| Tr | 0 | 1 | 1 | X | 1 | 0 | exit |
| Tr | 0 | 0 | 1 | 1 | 1 | 0 | tr_to_sq |
| Tr | 0 | 0 | 1 | 0 | 1 | 0 | nop |
| Tr | 0 | 0 | 0 | X | 1 | 0 | nop |
| Sq | 1 | 0 | X | 0 | 1 | 0 | sq_to_bxcx1 |
| Sq | 1 | 1 | X | X | 1 | 0 | exit |
| Sq | 1 | X | X | 1 | 1 | 0 | exit |
| Sq | 0 | 1 | 0 | X | 1 | 0 | sq_to_bycy1 |
| Sq | 0 | 1 | 1 | X | 1 | 0 | exit |
| Sq | 0 | 0 | 1 | 0 | 1 | 0 | sq_to_bxcx2 |
| Sq | 0 | 0 | 1 | 1 | 1 | 0 | exit |
| Sq | 0 | 0 | 0 | 1 | 1 | 0 | sq_to_bycy2 |
| Sq | 0 | 0 | 0 | 0 | 1 | 0 | nop |
| Cx | 1 | 0 | X | 0 | 1 | 0 | cx_to_cx |
| Cx | 1 | 1 | X | X | 1 | 0 | exit |
| Cx | 1 | X | X | 1 | 1 | 0 | exit |
| Cx | 0 | X | X | X | 1 | 0 | nop |
| Cy | 0 | 1 | 0 | X | 1 | 0 | cy_to_cy |
| Cy | 1 | 1 | X | X | 1 | 0 | exit |
| Cy | X | 1 | 1 | X | 1 | 0 | exit |
| Cy | X | 0 | X | X | 1 | 0 | nop |
|  | X | X | X | X | 0 | 0 | nop |
|  | X | X | X | X | X | 1 | exit |

FIG.15

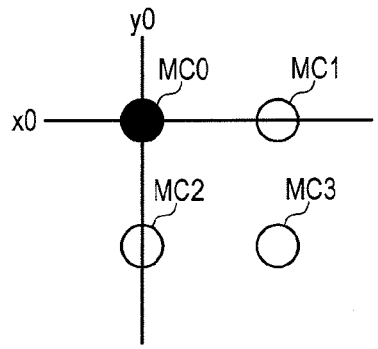
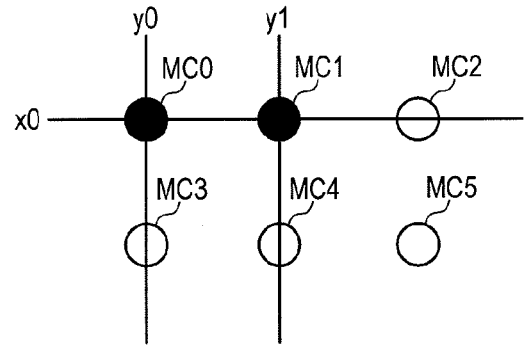
FIG.16A  FIG.16B
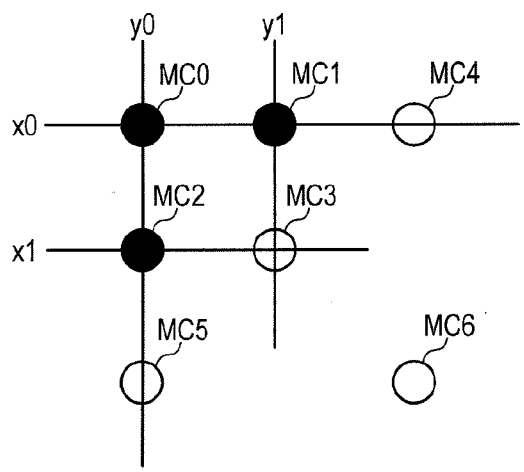
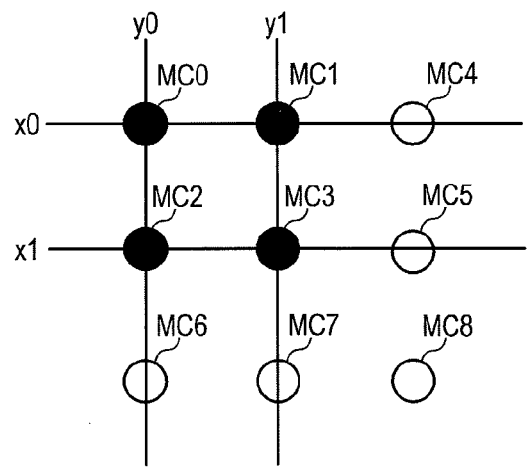
FIG.16C  FIG.16D
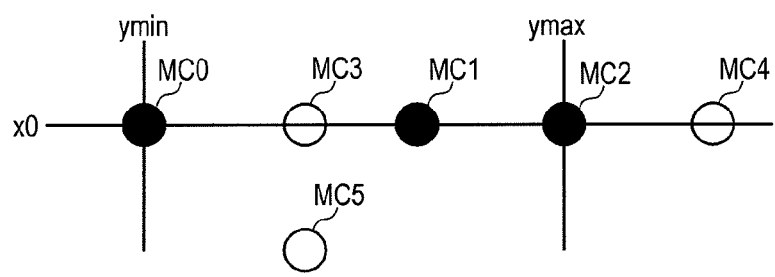
FIG.16E

| Command | Sequencer State Flag | | | |
| --- | --- | --- | --- | --- |
|  | iNull_inc | FMIa_modify | FMI_modify | ReOrder |
| null_to_sn | 1 | 0 | 1 | 0 |
| sn_to_bx | 0 | 0 | 1 | 0 |
| sn_to_by | 0 | 0 | 1 | 0 |
| bx_to_cx | 0 | 0 | 1 | 1 |
| bx_to_tr1 | 0 | 0 | 1 | 0 |
| bx_to_tr2 | 0 | 0 | 1 | 0 |
| by_to_cy | 0 | 0 | 1 | 1 |
| by_to_tr1 | 0 | 0 | 1 | 0 |
| by_to_tr2 | 0 | 0 | 1 | 0 |
| tr_to_sncx | 1 | 1 | 1 | 1 |
| tr_to_sncy | 1 | 1 | 1 | 1 |
| tr_to_sq | 0 | 0 | 1 | 0 |
| sq_to_bxcx1 | 1 | 1 | 1 | 1 |
| sq_to_bxcx2 | 1 | 1 | 1 | 1 |
| sq_to_bycy1 | 1 | 1 | 1 | 1 |
| sq_to_bycy2 | 1 | 1 | 1 | 1 |
| cx_to_cx | 0 | 0 | 1 | 0 |
| cy_to_cy | 0 | 0 | 1 | 0 |
| exit | 0 | 0 | 0 | 0 |
| nop | 0 | 0 | 0 | 0 |

FIG.17

| Command | FMI_next ||||||
|---|---|---|---|---|---|---|
| | D_next | x0_next | y0_next | x1_next | y1_next | z0_next |
| null_to_sn | Sn | xC | yC | x1 | y1 | zC |
| sn_to_bx | Bx | x0 | y0 | xC | yC | zC |
| sn_to_by | By | x0 | y0 | xC | yC | zC |
| bx_to_cx | Cx | x0 | ymin | x1 | ymax | zC |
| bx_to_tr1 | Tr | x0 | y0 | xC | y1 | zC |
| bx_to_tr2 | Tr | x1 | y1 | xC | y0 | zC |
| by_to_cy | Cy | xmin | y0 | xmax | y1 | zC |
| by_to_tr1 | Tr | x0 | y0 | x1 | yC | zC |
| by_to_tr2 | Tr | x1 | y1 | x0 | yC | zC |
| tr_to_sncx | Cx | x0 | ymin | xC | ymax | zC |
| tr_to_sncy | Cy | xmin | y0 | xmax | yC | zC |
| tr_to_sq | Sq | x0 | y0 | x1 | y1 | zC |
| sq_to_bxcx1 | Cx | x0 | ymin | xC | ymax | zC |
| sq_to_bxcx2 | Cx | xC | ymin | x1 | ymax | zC |
| sq_to_bycy1 | Cy | xmin | y0 | xmax | yC | zC |
| sq_to_bycy2 | Cy | xmin | yC | xmax | y1 | zC |
| cx_to_cx | Cx | x0 | ymin | x1 | ymax | zC |
| cy_to_cy | Cy | xmin | y0 | xmax | y1 | zC |
| exit | - | - | - | - | - | - |
| nop | - | - | - | - | - | - |

FIG.18

| Command | FMIa_next ||||||
|---|---|---|---|---|---|---|
| | Da_next | x0a_next | y0a_next | x1a_next | y1a_next | z0a_next |
| null_to_sn | - | - | - | - | - | - |
| sn_to_bx | - | - | - | - | - | - |
| sn_to_by | - | - | - | - | - | - |
| bx_to_cx | - | - | - | - | - | - |
| bx_to_tr1 | - | - | - | - | - | - |
| bx_to_tr2 | - | - | - | - | - | - |
| by_to_cy | - | - | - | - | - | - |
| by_to_tr1 | - | - | - | - | - | - |
| by_to_tr2 | - | - | - | - | - | - |
| tr_to_sncx | Sn | x1 | y0 | 0 | 0 | zC |
| tr_to_sncy | Sn | x0 | y1 | 0 | 0 | zC |
| tr_to_sq | - | - | - | - | - | - |
| sq_to_bxcx1 | Bx | x1 | y0 | x1 | y1 | zC |
| sq_to_bxcx2 | Bx | x0 | y0 | x0 | y1 | zC |
| sq_to_bycy1 | By | x0 | y1 | x1 | y1 | zC |
| sq_to_bycy2 | By | x0 | y0 | x1 | y0 | zC |
| cx_to_cx | - | - | - | - | - | - |
| cy_to_cy | - | - | - | - | - | - |
| exit | - | - | - | - | - | - |
| nop | - | - | - | - | - | - |

FIG.19

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly to a semiconductor device in which defective memory cells can be replaced with redundant cells and a manufacturing method thereof.

2. Description of Related Art

Semiconductor memories typified by a DRAM (Dynamic Random Access Memory) include a large number of memory cells, some of which inevitably become defective due to manufacturing conditions and other factors. In order to ship such semiconductor memories as conforming products, the redundancy repair technique of replacing defective memory cells with redundant cells is needed.

According to the redundancy repair technique, a semiconductor memory in a wafer state is initially subjected to an operation test to detect the addresses of defective memory cells (defect addresses). The detected addresses are programmed into optical fuses in the semiconductor memory. Optical fuses are fuses that can be blown by irradiation of a laser beam or the like. Since blown optical fuses cannot be restored to a conducting state again, it is possible to store information in a nonvolatile and irreversible manner. When access is requested to the addresses programmed in the optical fuses, redundant cells (alternative cells) are accessed instead of the defective memory cells, whereby the addresses are repaired.

Memory cell defects occur mainly in the wafer stage (manufacturing steps for forming a plurality of circuits on a wafer; so-called front-end processes). Most defects are therefore repaired by replacement using optical fuses. However, new defects can occur after the replacement using optical fuses, in back-end processes including assembly. For example, new defects may occur due to a thermal load during packaging. It is not possible to repair such defects by using the optical fuses.

As a solution to the problem, Japanese Patent Application Laid-Open No. 2002-25289 and Japanese Patent Application Laid-Open No. 2007-328914 propose semiconductor devices that can implement both the replacement using optical fuses and replacement using electrical fuses.

Since the tester for use in the back-end processes needs to operate at high speed, it is not realistic to mount a large-capacity analysis memory as with low-speed testers used in the wafer stage. In order to analyze defects occurring in the back-end processes by using the tester, the number of semiconductor devices to be simultaneously tested needs to be reduced. This has caused a problem of a significant drop in production efficiency.

Japanese Patent Application Laid-Open No. 2001-52497 describes a method of compressing the amount of information related to defective memory cells by determining a plurality of defective memory cells detected to be a line defect, not individual bit defects, if the defective memory cells fall on the same line.

The method described in Japanese Patent Application Laid-Open No. 2001-52497, in short, is to handle a plurality of bit defects as a line defect. Such a method can reduce the final amount of information, whereas it is hardly possible to reduce the work area needed for address analysis, i.e., the storage capacity of the analysis memory. The reason is that information on a large number of bit defects needs to be retained before the determination of a line defect, depending on the order of defective memory cells detected.

The present inventors have proposed a semiconductor device employing an analysis circuit which analyzes a defective address. According to this, since a storage capacity required for an analysis memory can be significantly reduced, the analysis memory can be integrated into the semiconductor device. However, an operating speed at the time of a test will be restricted by operating speeds of the analysis circuit and the analysis memory in this case. In addresses of a semiconductor device, an address not to become defect at the time of low-speed access, but become defect at the time of high-speed access may exist. There is a possibility that such a defect cannot be discovered only by the test of operation using the internal analysis circuit and the analysis memory. Therefore, it is desirable to discover such a defect and to replace a defective cell by a redundant cell. The present invention is made based on such technical findings.

SUMMARY

In one embodiment, there is provided a semiconductor device that includes: a memory cell array; a redundancy circuit that replaces defective memory cells included in the memory cell array; an electrical fuse circuit that stores addresses of at least part of the defective memory cells; a data determination circuit that activates a determination signal when test data read from the memory cell array is incorrect; and an analysis circuit that supplies, in a first operation mode, an address of the test data to the electrical fuse circuit when the determination signal is activated, and supplies, in a second operation mode, the address of the test data to the electrical fuse circuit when a select signal supplied from outside is activated irrespective of the determination signal.

In another embodiment, there is provided a semiconductor device that includes: a memory cell array that includes a plurality of word lines including first to third defective word lines, a plurality of bit lines including first to third defective bit lines, a plurality of redundant word lines replacing the first to third defective word lines, and a plurality of redundant bit lines replacing the first to third defective bit lines; an optical fuse circuit that stores an address of the first defective word line and an address of the first defective bit line; an electrical fuse circuit that stores an address of the second defective word line and an address of the second defective bit line; and an analysis circuit that analyzes the addresses of the second defective word line and the second defective bit line based on test data read from the memory cell array with the first defective word line replaced with one of the redundant word lines and the first defective bit line replaced with one of the redundant bit lines. The analysis circuit receives an address of the third defective word line or an address of the third defective bit line from outside and supplying the address of the third defective word line or an address of the third defective bit line to the electrical fuse circuit with the first and second defective word lines replaced with ones of the redundant word lines and the first and second defective bit lines replaced with ones of the redundant bit lines.

In one embodiment, there is provided a method of manufacturing a semiconductor device that includes: performing a first operation test on a memory device formed on a semiconductor wafer; analyzing addresses of defective memory cells detected by the first operation test to identify first defective word lines and first defective bit lines; performing primary replacement to replace the first defective word lines and the first defective bit lines with first redundant word lines and first redundant bit lines, respectively; dicing the semiconductor wafer after performing the primary replacement to obtain a memory chip on which the memory device is integrated; packaging one or more semiconductor chips including at least the memory chip to obtain a packaged semiconductor device; performing a second operation test on the packaged semiconductor device; analyzing addresses of defective memory cells detected by the second operation test to identify second defective word lines and second defective bit lines; and performing secondary replacement to replace the second defective word lines and the second defective bit lines with second redundant word lines and second redundant bit lines, respectively; performing a third operation test on the packaged semiconductor device after performing the secondary replacement; analyzing an address of a defective memory cell detected by the third operation test to identify a third defective word line or a third defective bit line; and performing tertiary replacement to replace the third defective word line or the third defective bit line with a third redundant word line or a third redundant bit line, respectively. The addresses of the defective memory cells detected by the second operation test are analyzed by an analysis circuit integrated into the packaged semiconductor device. The address of the defective memory cell detected by the third operation test is analyzed by an external tester connected to the packaged semiconductor device.

BRIEF DESCRIPTION OF THE DRAWINGS

FIG. 6 is a schematic diagram for explaining a data structure of defect analysis data to be stored in an analysis memory 144;

FIG. 7 is a chart for explaining types of error pattern information D and definitions of the pieces of corresponding error address information x0, y0, x1, y1, and z;

FIG. 8 is a chart indicative of an example of expression of the error pattern information D in three bits of data;

FIG. 15 is a chart indicative of the relationship of internal signals generated in the analysis circuit 143 and the current error pattern information D with the commands to be generated;

FIGS. 16A to 16E are diagrams indicative of various types of positional relationships between defective memory cells previously found and a defective memory cell newly found;

FIG. 17 is a chart for explaining the relationship between the command type and control flags to be generated;

FIG. 18 is a chart for explaining the relationship between the command type and content of update of defect analysis data FMI<i>;

FIG. 19 is a chart for explaining the relationship between the command type and content of update of defect analysis data FMI<iNull>, wherein the defect analysis data FMI<iNull> is updated when the division flag FMIa_modify is activated;

DETAILED DESCRIPTION OF THE EMBODIMENTS

Preferred embodiments of the present invention will be explained below in detail with reference to the accompanying drawings.

Figure 1:
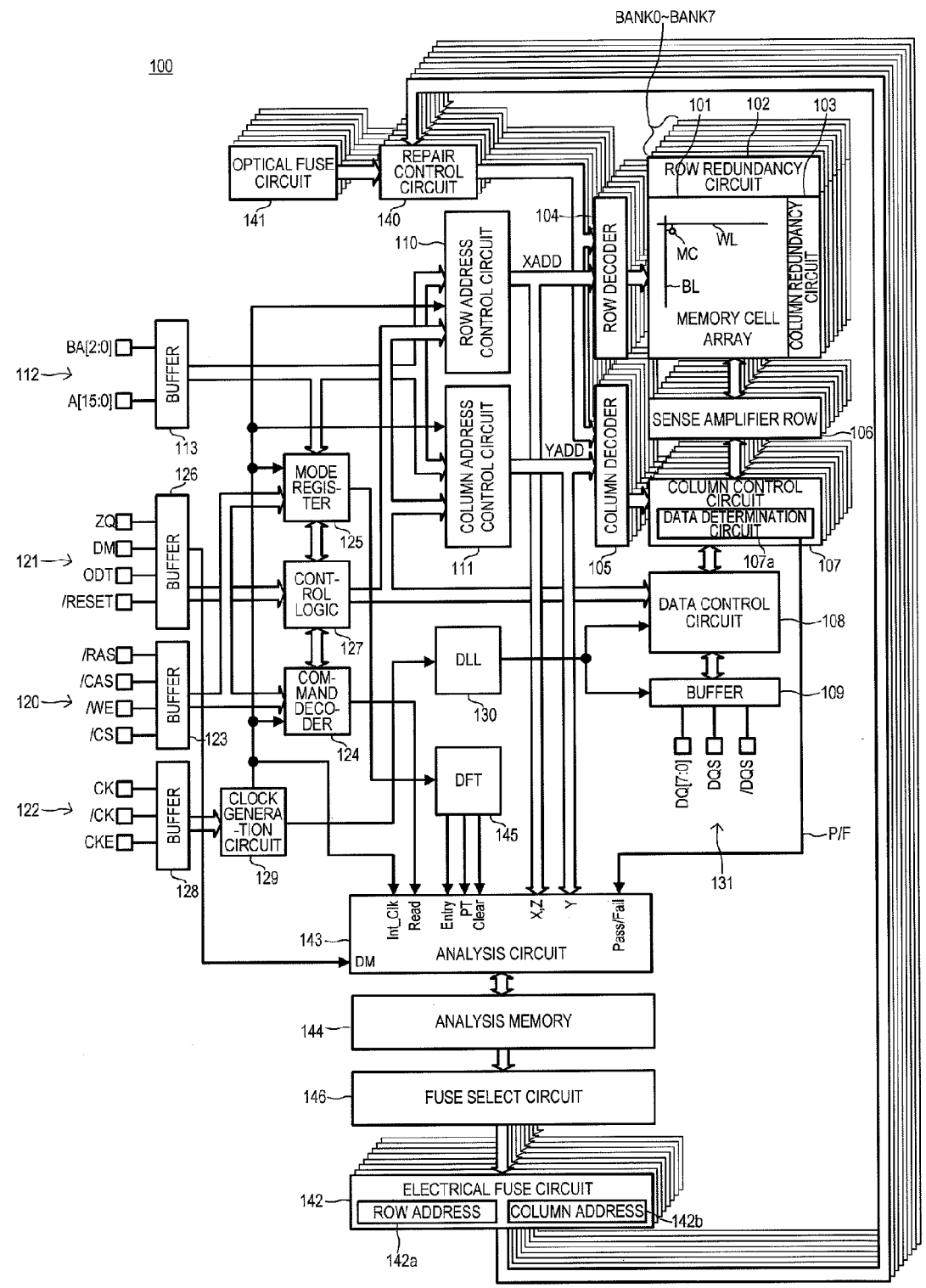
FIG. 1 is a block diagram indicative of a configuration of a semiconductor device 100 according to a preferred first embodiment of the present invention.

Referring now to FIG. 1, the semiconductor device 100 according to the present embodiment is a semiconductor memory integrated on one chip. The semiconductor device 100 includes a memory cell array 101 which is divided into eight banks BANK0 to BANK7. The memory cell array 101 includes a plurality of word lines WL and a plurality of bit lines BL, at the intersections of which memory cells MC are arranged. For the sake of simplicity, FIG. 1 shows only one word line WL, one bit line BL, and one memory cell MC arranged at the intersection.

Among the plurality of word lines included in the memory cell array 101, defective word lines are replaced with redundant word lines which are included in a row redundancy circuit 102. Among the plurality of bit lines included in the memory cell array 101, defective bit lines are replaced with redundant bit lines which are included in a column redundancy circuit 103. As employed herein, a defective word line refers not only to a word line that is itself defective, but also to one that is not itself defective and such that one or a plurality of memory cells to be selected by the word line is/are defective. Similarly, a defective bit line refers not only to a bit line that is itself defective, but also to one that is not itself defective and such that one or a plurality of memory cells connected to the bit line is/are defective.

A row access to the memory cell array 101 is performed by a row decoder 104. The row decoder 104 decodes a row address XADD supplied from a row address control circuit 110, and selects any one of the word lines included in the memory cell array 101 based on the result of decoding. If the row address XADD supplied from the row address control circuit 110 coincides with a defective address retained in a repair control circuit 140, the row decoder 104 makes an alternate access to a redundant word line in the row redundancy circuit 102 instead of the word line in the memory cell array 101.

A column access to the memory cell array 101 is performed by a column decoder 105. The column decoder 105 decodes a column address YADD supplied from a column address control circuit 111, and selects any one of column switches included in a column control circuit 107 based on the result of decoding. The column switches are switches for connecting any one of sense amplifiers included in a sense amplifier row 106 to the column control circuit 107. If one of the switches becomes conducting, a predetermined bit line is connected to the column control circuit 107 through a corresponding sense amplifier. If the column address YADD supplied from the column address control circuit 111 coincides with a defective address retained in the repair control circuit 140, the column decoder 105 makes an alternate access to a redundant bit line in the column redundancy circuit 103 instead of the bit line in the memory cell array 101.

An address A0 to A15 and a bank address BA0 to BA2 are supplied to the row address control circuit 110 and the column address control circuit 111 through address terminals 112 and an address buffer 113. The address A0 to A15 is used as a row address XADD or a column address YADD. The bank address BA0 to BA2 is used to select the banks BANK0 to BANK7.

Aside from the address terminals 112, the semiconductor device 100 has command terminals 120, control terminals 121, and clock terminals 122.

The command terminals 120 are a group of terminals to which a row address strobe signal /RAS, a column address strobe signal /CAS, a write enable signal /WE, and a chip select signal /CS are supplied. Such command signals input to the command terminals 120 are supplied to a command decoder 124 and a mode register 125 through a command buffer 123. The command decoder 124 is a circuit that decodes the command signals to generate internal commands and supplies the internal commands to control logic 127 and the like. The mode register 125 is a register whose setting value can be rewritten with the address A0 to A15. The setting value is supplied to the control logic 127 and the like.

The control terminals 121 are a group of terminals that includes ones to which a data mask signal DM, an on-die termination signal ODT, and a reset signal /RESET are input, and a calibration terminal ZQ. Such control signals input to the control terminals 121 are supplied to the control logic 127 through a control buffer 126. The control logic 127 is a circuit that generates various types of control signals based on the supplied control signals, the internal commands, and the setting value of the mode register 125. The control signals generated are supplied to the row address control circuit 110, the column address control circuit 111, and a data control circuit 108, and control the operations of such circuit blocks. The data mask signal DM is also supplied to an analysis circuit 143 to be described later.

The clock terminals 122 are a group of terminals to which a clock signal CK, an inverted clock signal /CK, and a clock enable signal CKE are supplied. Such clock signals input to the clock terminals 122 are supplied to a clock generation circuit 129 through a clock buffer 128. The clock generation circuit 129 is a circuit that generates an internal clock signal based on the clock signal. The internal clock signal generated is supplied to various circuit blocks. Part of the internal clock signal is supplied to a DLL circuit 130. The DLL circuit 130 is a circuit that generates a phase-controlled clock for output based on the internal clock signal. The generated clock for output is supplied to the data control circuit 108 and an input/output buffer 109.

The data control circuit 108 is a circuit that latches read data output in parallel through the column control circuit 107, converts the data to serial, and supplies the resultant to the input/output buffer 109. The data control circuit 108 also latches write data serially input through the input/output buffer 109, converts the data to parallel, and supplies the resultant to the column control circuit 107. The input/output buffer 109 is connected to data system terminals 131. The data system terminals 131 include data input/output terminals DQ0 to DQ7 and data strobe terminals DQS and /DQS. The data input/output terminals DQ0 to DQ7 are terminals for outputting read data and inputting write data. The data strobe terminals DQS and /DQS are terminals for inputting and outputting complementary data strobe signals.

With such a configuration, when a read command is input through the command terminals 120, a read operation is performed on memory cells that are specified by the address A0 to A15 and the bank address BA0 to BA2. The resulting read data is output through the data input/output terminals DQ0 to DQ7. When a write command is input through the command terminals 120, a write operation is performed on memory cells that are specified by the address A0 to A15 and the bank address BA0 to BA2, whereby write data that is input through the data input/output terminals DQ0 to DQ7 is written. In such a read and write operations, if a memory cell to be accessed is a defective memory cell, an alternate access is made to the row redundancy circuit 102 or the column redundancy circuit 103. As described above, the addresses of defective memory cells are retained in the repair control circuit 140.

Defective addresses which are retained in the repair control circuits 140 are transferred from an optical fuse circuit 141 and an electrical fuse circuit 142. The optical fuse circuit 141 is a circuit that stores information by blowing fuse elements by laser beam irradiation. The electrical fuse circuit 142 is a circuit that stores information by application of a high voltage to fuse elements.

The fuse elements to constitute the electrical fuse circuit 142 are not limited in particular, whereas it is preferred to use anti-fuse elements. Anti-fuse elements are elements that store information by the application of a high voltage to an insulating film for breakdown.

Figure 2A:
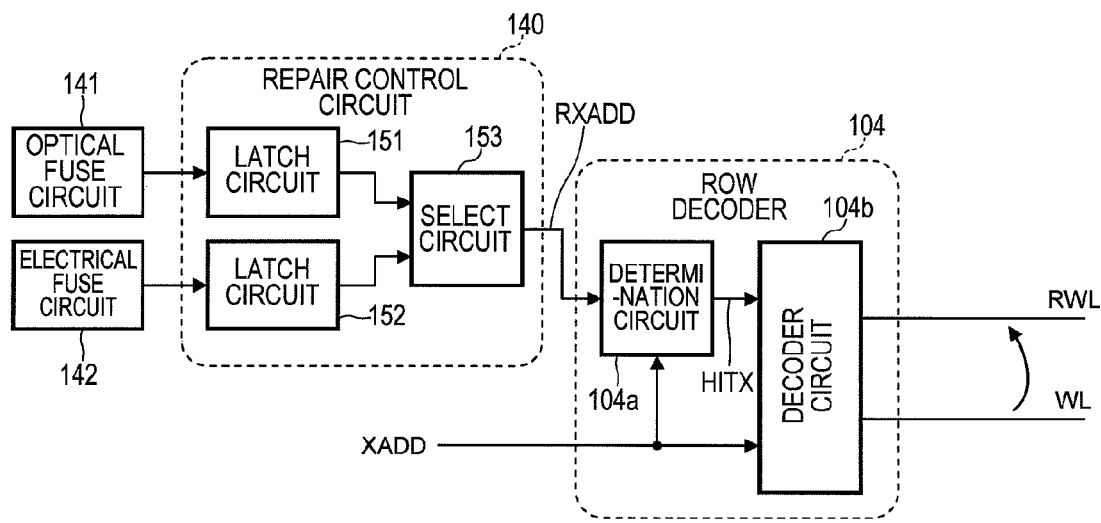
FIGS. 2A and 2B are schematic diagrams for explaining a function of a repair control circuit 140, FIG. 2A showing a part related to replacement of word lines, FIG. 2B showing a part related to replacement of bit lines.

Turning to FIG. 2A, the repair control circuit 140 includes a pair of latch circuits 151 and 152. A select circuit 153 selects defective addresses retained in either one of the latch circuits 151 and 152. The latch circuit 151 is a circuit that latches defective addresses read from the optical fuse circuit 141. The latch circuit 152 is a circuit that latches defective addresses read from the electrical fuse circuit 142. The defective addresses selected by the select circuit 153 are supplied to a determination circuit 104a which is included in the row decoder 104. The determination circuit 104a is a circuit that compares the defective addresses RXADD supplied from the repair control circuit 140 with an access-requested row address XADD. If the addresses match, the determination circuit 104a activates a hit signal HITX. The row address XADD is also supplied to a decoder circuit 104b. If the hit signal HITX is not activated, a predetermined word line WL is selected based on the result of decoding of the decoder circuit 104b. If the hit signal HITX is activated, a redundant word line RWL is selected regardless of the result of decoding of the decoder circuit 104b. As a result, the defective word line WL is replaced with the redundant word line RWL.

Figure 2B:
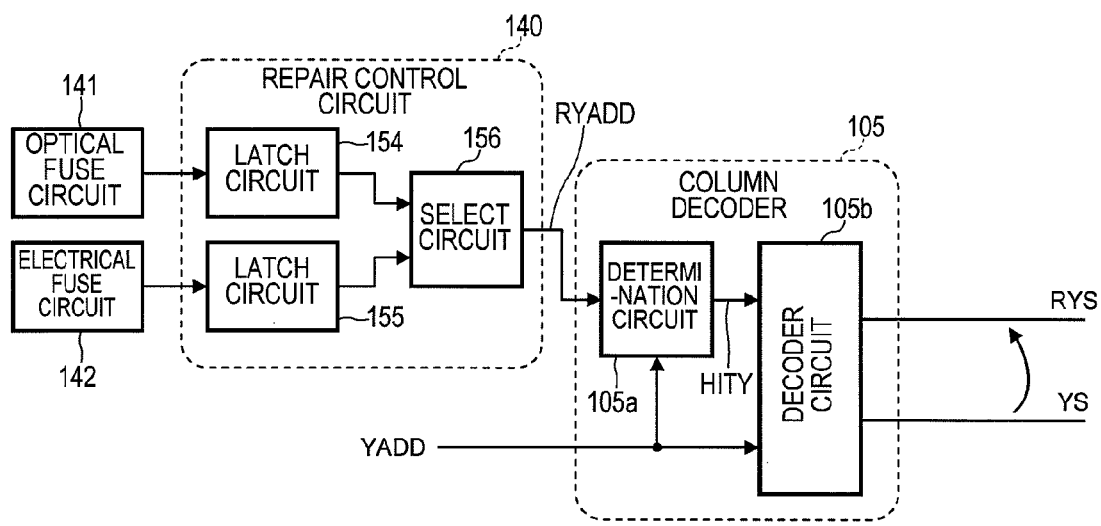

The replacement of bit lines is similarly performed. As shown in FIG. 2B, a select circuit 156 selects either one of the outputs of latch circuits 154 and 155. The selected output is supplied to a determination circuit 105a which is included in the column decoder 105. The determination circuit 105a is a circuit that compares defective addresses RYADD supplied from the repair control circuit 140 with an access-requested column address YADD. If the addresses match, the determination circuit 105a activates a hit signal HITY. If the hit signal HITY is not activated, a predetermined column select line YS is selected based on the result of decoding of a decoder circuit 105b. If the hit signal HITY is activated, a redundant column select line RYS is selected regardless of the result of decoding of the decoder circuit 105b. As a result, defective bit lines corresponding to the column select line YS are replaced with redundant bit lines corresponding to the redundant column select line RYS.

As described above, in the semiconductor device 100 according to the present embodiment, one redundant word line can be used by both the optical fuse circuit 141 and the electrical fuse circuit 142. Similarly, one redundant bit line can be used by both the optical fuse circuit 141 and the electrical fuse circuit 142. It will be understood that one redundant word line or one redundant bit line is not simultaneously usable by the optical fuse circuit 141 and the electrical fuse circuit 142. Redundant word lines and redundant bit lines are used for primary repair by the optical fuse circuit 141. Redundant word lines and redundant bit lines remaining unused in the primary repair are used for secondary or tertiary repair by the electrical fuse circuit 142.

Detection of defective memory cells in the secondary repair, that is, true-false decision of test data are detected is performed by a data determination circuit 107a which is included in the column control circuit 107. The resulting determination signal P/F is supplied to an analysis circuit 143. The determination signal P/F indicates a "pass" if read data contains no error, and a "fail" if read data contains an error.

If the determination signal P/F indicates a "fail", the analysis circuit 143 refers to the accessed address to identify the address of the defective memory cell, and analyzes the relationship with the addresses of defective memory cells that have previously been detected. The operation of the analysis circuit 143 will be described later. The analysis circuit 143 uses an analysis memory 144 for the analysis operation. Although not limited in particular, the analysis memory 144 is made of an SRAM. A storage capacity of the SRAM is only several kilobits or so. The reason is that the analysis circuit 143 employs a characteristic method of analysis which uses an extremely small work area as will be described later. Aside from the determination signal P/F and addresses, the analysis circuit 143 is supplied with an internal clock signal, an internal command, and control signals from a DFT circuit 145.

The control signals supplied from the DFT circuit 145 to the analysis circuit 143 include a mode select signal PT. The mode select signal PT is a signal that becomes low level when performing secondary repair, and becomes high level when performing tertiary repair.

Figure 3:
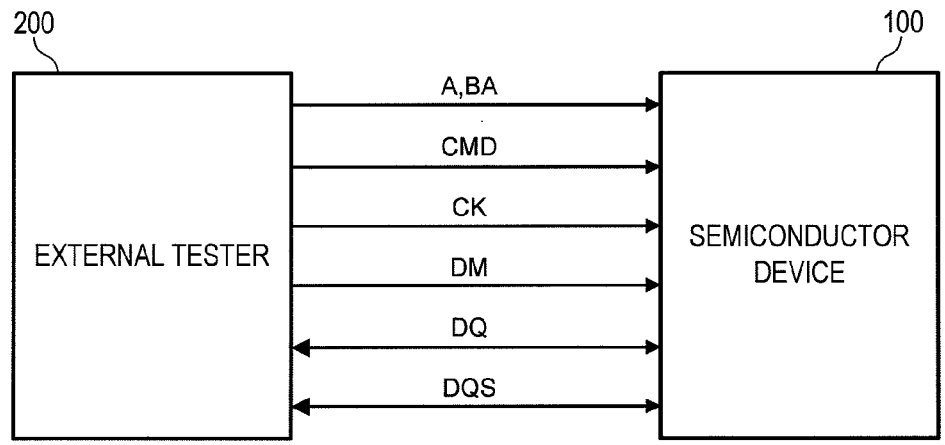
FIG. 3 is a schematic diagram indicative of a relation of connection between the semiconductor device 100 and an external tester 200.

In tertiary repair, defective memory cells are detected by an external tester 200 which is connected to the semiconductor device 100 as shown in FIG. 3. The resulting addresses that are determined to be defective are supplied from the external tester 200 to the semiconductor device 100 through the address addresses are supplied by using the data mask signal DM. The purpose is so that a single external tester 200 can be used to perform tertiary repair on a plurality of semiconductor devices 100 in parallel. Specifically, addresses that are supplied from the external tester 200 in a period when the data mask signal DM is at a high level are defective addresses. The defective addresses thus supplied from the external tester 200 are supplied to the analysis memory 144 through the analysis circuit 143.

Figure 4:
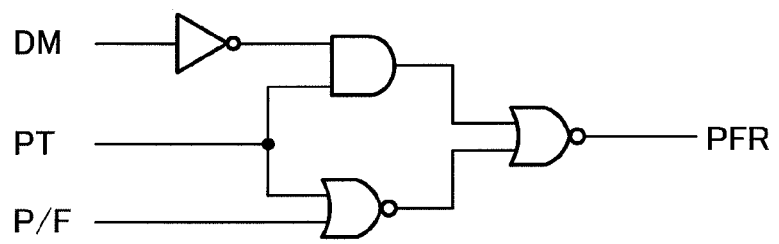
FIG. 4 is a circuit diagram of a mode select circuit 143a which is included in an analysis circuit 143.

Turning to FIG. 4, the mode select circuit 143a included in the analysis circuit 143 includes a logic circuit that receives the data mask signal DM, the mode select signal PT, and the determination signal P/F to generate a determination signal PFR. With the circuit configuration shown in FIG. 4, the determination signal PFR has the same value as that of the determination signal P/F when the mode select signal PF is at a low level. This operation mode is intended for secondary repair. The logic level of the data mask signal DM is irrelevant here. On the other hand, when the mode select signal PF is at a high level, the determination signal PFR has the same value as that of the data mask signal DM. This operation mode is intended for tertiary repair. The logic level of the determination signal P/F is irrelevant here.

The determination signal PFR is a control signal for identifying an address signal that is supplied to the analysis circuit 143 as a defective address. When performing secondary repair (the mode select signal PT=low), defective addresses are fetched in response to the determination signal P/F. When performing tertiary repair (the mode select signal PT=high), defective addresses are fetched in response to the data mask signal DM.

Figure 5:
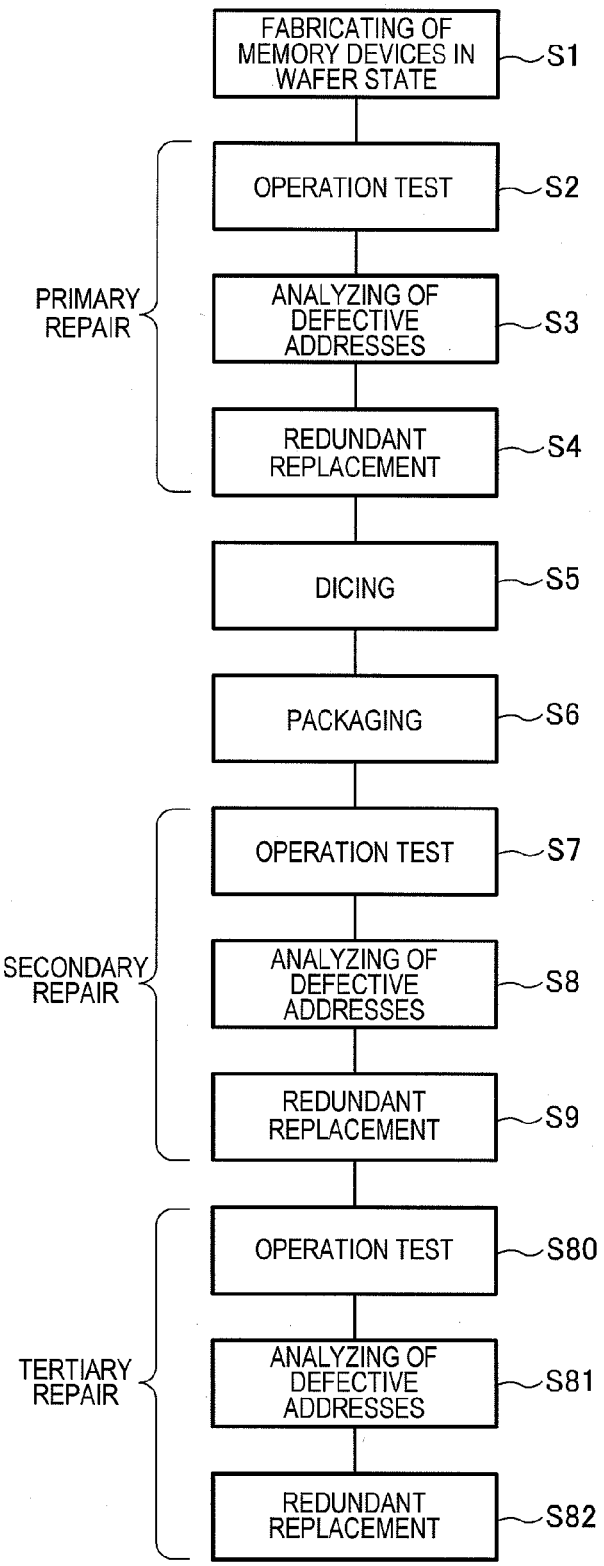
FIG. 5 is a flowchart for providing an overview of the steps for manufacturing the semiconductor device 100.

Turning to FIG. 5, initially, in a front-end process (diffusion process), memory devices in a wafer state are fabricated (step S1). The memory devices in the wafer state are subjected to an operation test (step S2). The operation test in step S2 is intended to detect the addresses of defective memory cells in the wafer state. The operation test is performed on a plurality of memory devices in parallel by using a low-speed tester on which a large-capacity analysis memory is mounted. The addresses of the defective memory cells detected are analyzed in the tester, whereby defective word lines and defective bit lines are identified (step S3). The addresses of the defective word lines and the defective bit lines are then written into the optical fuse circuit 141 by using a laser trimmer. As a result, the defective word lines and the defective bit lines are replaced with redundant word lines and redundant bit lines (step S4). This completes the primary-repaired memory devices in the wafer state.

Next, the wafer is diced into individual memory chips (step S5). The memory chips are packaged into a semiconductor device 100 (step S6). Steps S5 and S6 belong to so-called back-end processes, which can produce new defective memory cells due to a thermal load during packaging etc. After the packaging, it is no longer possible to repair such defects by using the optical fuse circuit 141. Post-packaging defects are repaired by using the electrical fuse circuit 142 as described below.

Initially, the semiconductor device 100 packaged is subjected to an operation test to detect the addresses of defective memory cells (step S7). The test is performed by writing and reading test data with the mode register 125 set to a test mode for secondary repair, and outputting the resulting determination signal P/F to the analysis circuit 143. Specifically, if the determination signal P/F indicates a fail, the analysis circuit 143 refers to the accessed address to identify the defective word line and defective bit line (step S8). Here, the analysis circuit 143 updates error pattern information and error address information each time a defective memory cell is detected. The error pattern information and the error address information are stored in the analysis memory 144.

The analysis circuit 143 then identifies the addresses of defective word lines and defective bit lines from the final outcome of the error pattern information and the error address information, and writes the addresses into the electrical fuse circuit 142. As a result, the defective word lines and the defective bit lines are replaced with redundant word lines and redundant bit lines (step S9). This completes the secondary-repaired semiconductor device 100.

It should be noted that it is difficult to perform the operation test for secondary repair at a designed maximum access speed, and the test speed is limited by the operating speed of the data determination circuit 107a, the analysis circuit 143, and the analysis memory 144. The access speed during secondary repair is sufficiently high as compared to the access speed during primary repair, but is lower than the designed maximum access speed. In some rare instances, an address that is not found to be defective in an operation test during secondary repair can be defective under fast access. It is not possible to relieve such an address by secondary repair. In view of this, the present embodiment performs tertiary repair after secondary repair.

In tertiary repair, an operation test is performed on the secondary-repaired semiconductor device 100 to detect the address of any defective memory cell (step S80). The test is performed by writing and reading test data in the state where a test mode for tertiary repair is set to the mode register 125. The external tester 200 shown in FIG. 3 evaluates the resulting read data DQ to analyze defective addresses (step S81). The access condition in tertiary repair is the same as in a normal operation. This allows access at the maximum design speed. Completing the analysis of defective addresses, the external tester 200 inputs the defective addresses into the semiconductor device 100 by using address signals and the data mask signal DM. As a result, defective word lines or defective bit lines are replaced with redundant word lines or redundant bit lines (step S82). This completes a tertiary-repaired memory device 100.

In fact, very few defective addresses are found by tertiary repair. The number of addresses found is mostly zero or only one if any. Besides, most of defective addresses founded by tertiary repair belong to discrete bit defects, hardly a word line defect or bit line defect. The reason is that word line or bit line defects have already been found and replaced by primary repair and secondary repair. A bit defect found by tertiary repair, if any, can thus be relieved by replacing a word line or bit line corresponding to that memory cell.

Since the number of defective addresses to be detected by tertiary repair is extremely small, the external tester 200 in use needs no high-capacity high-speed memory and has only to be capable of storing several defective addresses at maximum.

As described above, according to the present embodiment, the primary repair is performed in the wafer state, and the secondary repair and the tertiary repair are performed after the packaging. The redundant word lines and redundant bit lines formed in the semiconductor device 100 can be used for any of the primary repair, the secondary repair and the tertiary repair. It is therefore not needed to provide redundancy circuits dedicated to the secondary repair and redundancy circuits dedicated to the tertiary repair. Moreover, in the secondary repair, the addresses of defective memory cells are analyzed by using the analysis circuit 143 and the analysis memory 144 which are included in the semiconductor device 100. This eliminates the need to provide such functions for the external tester and the like. In tertiary repair, the addresses of defective memory cells are analyzed by using the external tester 200 that is connected to the semiconductor device 100. This makes it possible to replace defective cells that occur only under fast access.

In the secondary repair, the error pattern information and the error address information are updated each time a defective memory cell is detected. The analysis memory 144 therefore needs a significantly small storage capacity as compared to the case with a method of simply recording the addresses of defective memory cells each time. Now, the operation of the analysis circuit 143 to update the error pattern information and the error address information will be described in detail.

Turning to FIG. 6, a plurality of pieces of defect analysis data FMI<0> to FMI<N> are stored in the analysis memory 144. The pieces of defect analysis data FMI<0> to FMI<N> each include error pattern information D and error address information x0, y0, x1, y1, and z. The error pattern information D is stored in the register 144a included in the analysis memory 144. The error address information x0, y0, x1, y1, and z is stored in additional register 144b included in the analysis memory 144. In the following description, the con tents of the jth piece of defect analysis data FMI<j> will sometimes be expressed as:

FMI<j>={D, x0, y0, x1, y1, z}

The error pattern information D is information that indicates the relative arrangement relationship of one or a plurality of defective memory cells. The error address information x0, y0, x1, y1, and z includes pieces of information that indicate the addresses of at least part of the defective memory cell(s) that is/are associated with the error pattern information D. The error pattern information D and the error address information x0, y0, x1, y1, and z will be described in detail below.

Turning to FIG. 7, error pattern information D is set to any one of the eight patterns. The first pattern is called a "Null" pattern, which is set when there is no defective memory cell assigned. In other words, the Null pattern indicates that the piece of defect analysis data FMI is unused.

The second pattern is called an "Sn" pattern. The Sn pattern is set when there is assigned one defective memory cell. In such a case, the row address of the defective memory cell is set into the address x0 of the error address information. The column address of the defective memory cell is set into the address y0. The address x1 and the address y1 are unused. The address of a memory mat to which the defective memory cell belongs is set into the address z.

The third pattern is called a "Bx" pattern. The Bx pattern is set when there are assigned two defective memory cells that belong to the same row address. In such a case, the row address and column address of one defective memory cell 1 are set into the addresses x0 and y0 of the error address information, respectively. The row address and column address of the other defective memory cell 2 are set into the addresses x1 and y1, respectively. The address of the memory mat to which the defective memory cells belong is set into the address z. The fourth pattern is called a "By" pattern. The By pattern is set when there are assigned two defective memory cells that belong to the same column address. The definitions of the error address information are the same as with the Bx pattern.

The fifth pattern is called a "Tr" pattern. The Tr pattern is set when three defective memory cells are arranged in an L shape. Specifically, as shown in FIG. 7, the defective memory cell 1 and the defective memory cell 3 have the same row address. The defective memory cell 1 and the defective memory cell have the same column address. In such a case, the row address and column address of the defective memory cell 1 are set into the addresses x0 and y0 of the error address information, respectively. The row address of the defective memory cell 2 is set into the address x1. The column address of the defective memory cell 3 is set into the address y1. The address of the memory mat to which the defective memory cells belong is set into the address z.

The sixth pattern is called as "Sq" pattern. The Sq pattern is set when four defective memory cells are arranged in a rectangular shape. Specifically, as shown in FIG. 7, the defective memory cell 4 is added to the Tr pattern. The defective memory cell 2 and the defective memory cell 4 have the same row address. The defective memory cell 3 and the defective memory cell 4 have the same column address. In such a case, the row address and column address of the defective memory cell 1 are set into the addresses x0 and y0 of the error address information, respectively. The row address and column address of the defective memory cell 4 are set into the addresses x1 and y1, respectively. In other words, the addresses of the defective memory cells 1 and 4 at the diagonal positions are set. The address of the memory mat to which the defective memory cells belong is set into the address z.

The seventh pattern is called a "Cx" pattern. The Cx pattern is set when three or more defective memory cells belonging to the same row address are assigned in a line. In such a case, the row address and column address of the defective memory cell 1 that has a smallest column address value are set into the addresses x0 and y0 of the error address information, respectively. The row address and column address of the defective memory cell 3 that has a largest column address value are set into the addresses x1 and y1, respectively. In other words, the addresses of the defective memory cell 2 that comes between such defective memory cells 1 and 3 are omitted. The address of the memory mat to which the defective memory cells belong is set into the address z.

The eighth pattern is called a "Cy" pattern. The Cy pattern is set when three or more defective memory cells belonging to the same column address are assigned in a line. In such a case, the row address and column address of the defective memory cell 1 that has a smallest row address value are set into the addresses x0 and y0 of the error address information, respectively. The row address and column address of the defective memory cell 3 that has a largest row address value are set into the addresses x1 and y1, respectively. In other words, the addresses of the defective memory cell 2 that comes between such defective memory cells 1 and 3 are omitted. The address of the memory mat to which the defective memory cells belong is set into the address z.

Since any one of the eight patterns is set as the error pattern information D, the error pattern information D has only to have three bits. Turning to FIG. 8, as for error address information, bits as many as needed to specify a row address are allocated to the addresses x0 and x1. Bits as many as needed to specify a column address are allocated to the addresses y0 and y1. Bits as many as needed to specify a memory mat are allocated to the address z. Now, the necessity of the use of the address z will be described.

Figure 9:
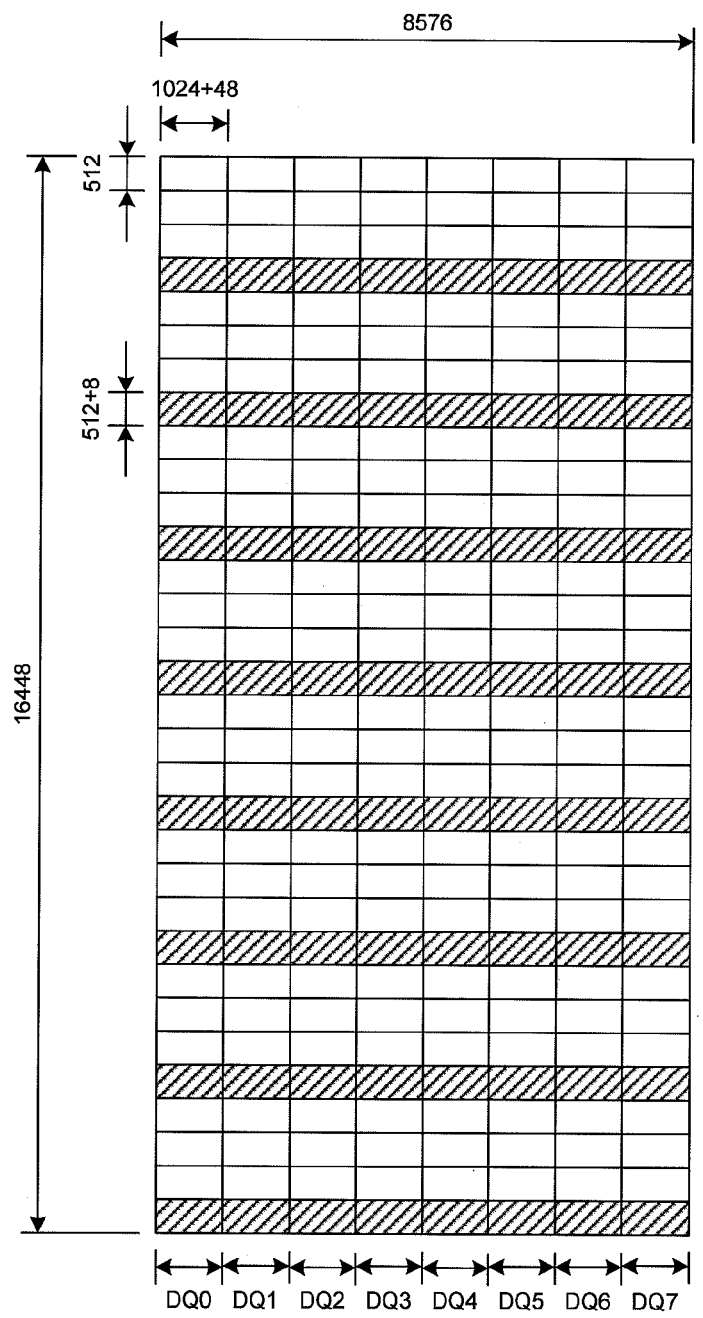
FIG. 9 is a diagram indicative of a configuration of a repair unit array which is composed of a plurality of memory mats.

Turning to FIG. 9, each single block represents a memory mat. Memory mats are areas that are defined by the range of word lines or the range of row addresses allocated for a single bit line, and the range of bit lines or the range of column addresses allocated for a single word line. In the example shown in FIG. 9, 512 word lines and 1024 bit lines are allocated to a single memory mat. That is, each memory mat has a storage capacity of 512 Kbits. Among the memory mats shown in FIG. 9, hatched ones represent memory mats to which eight redundant word lines are added. Forty-eight redundant bit lines are also added to each memory mat. Such memory mats are arranged in a matrix, 32 in a row direction and 8 in a column direction. A total of 256 mats constitute a single repair unit array. The number of bits of the repair unit array including redundant memory cells is thus 16448×8576, which allows use as a 128-Mbit array. A 128-Mbit repair unit array is equivalent to a bank of a 1-Gbit memory chip, and one half bank of a 2-Gbit memory chip.

Figure 10:
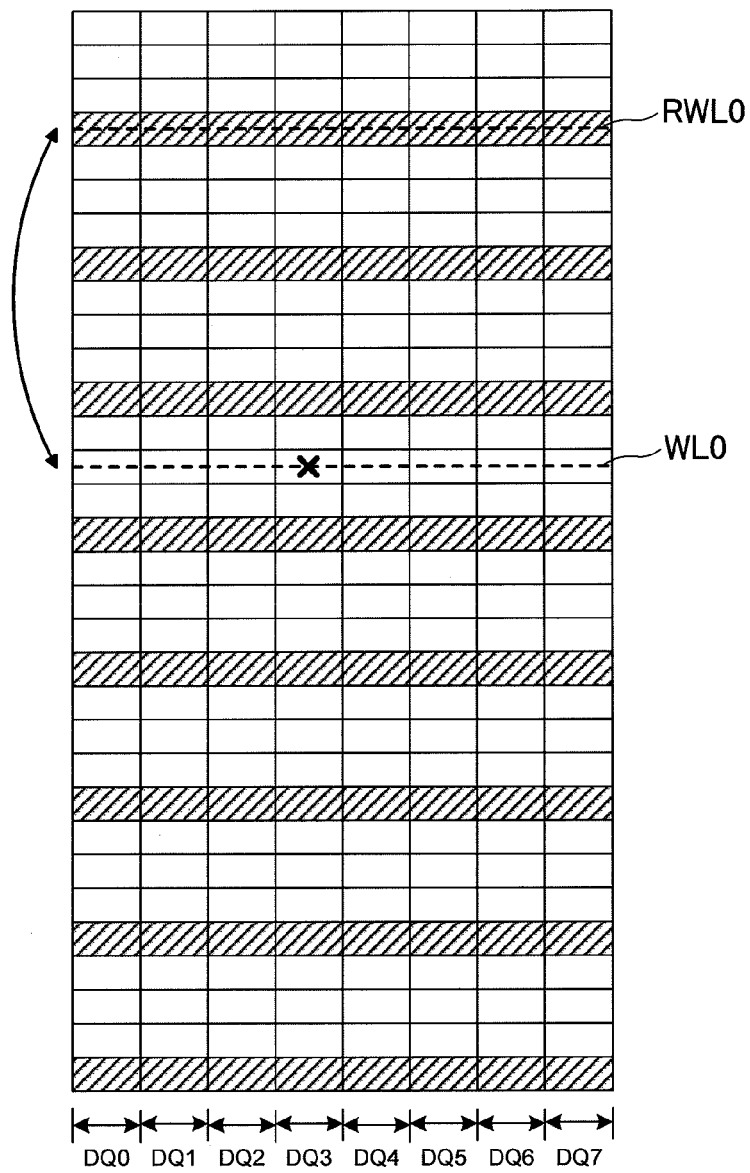
FIG. 10 is a diagram indicative of an example of replacing a defective word line with a redundant word line.

In the repair unit array, defective word lines can be flexibly replaced across memory mats. Specifically, suppose, as shown in FIG. 10, that a word line WL0 is defective and memory mats to which the word line WL0 belongs have no redundant word line. Even in such a case, the defective word line WL0 can be replaced with a redundant word line RWL0 that belongs to other memory mats.

Figure 11:
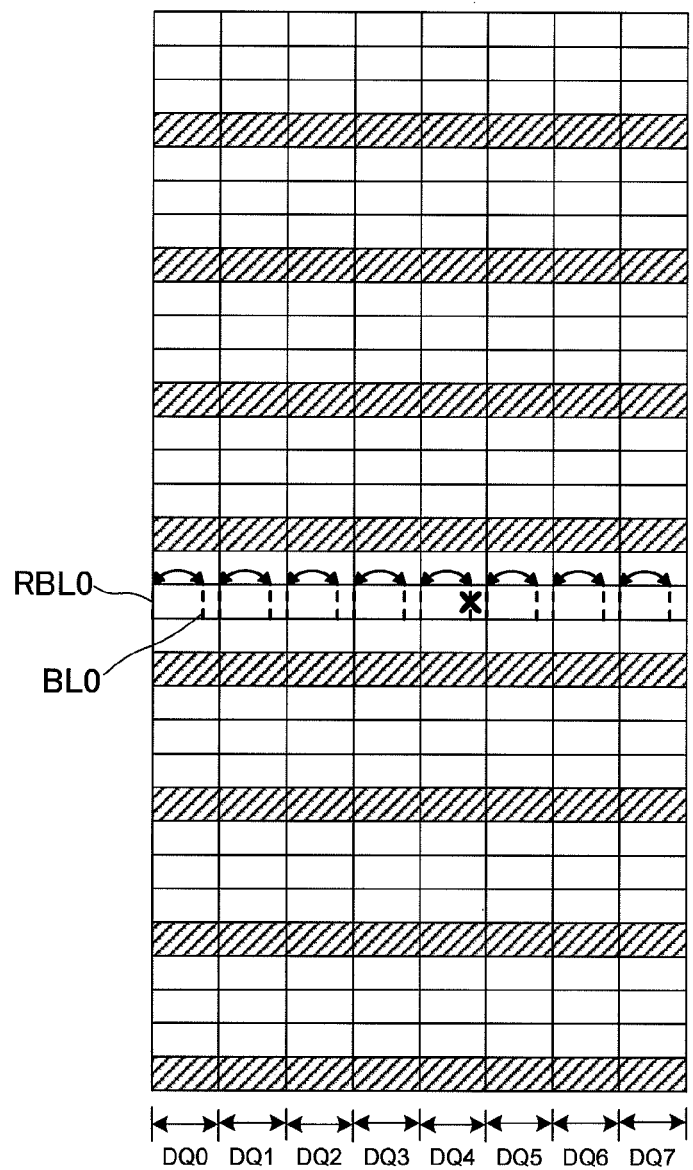
FIG. 11 is a diagram indicative of an example of replacing a defective bit line with a redundant word line.

In contrast, each memory mat includes redundant bit lines. As shown in FIG. 11, a defective bit line BL0 is thus replaced with a redundant bit line RBL0 in the same memory mat. DDR3 (Double Data Rate 3) SDRAMs use a so-called 8-bit prefetch system, in which data as much as eight addresses is input or output to/from memory cells by a single access. For the sake of simple circuit configuration, the repair control circuit 140 mostly employs the configuration of replacing entire data as much as eight addresses if any one of the addresses is defective. While a memory mat includes 48 redundant bit lines, the number of addresses actually repairable is thus six (=48/8). In the example shown in FIG. 11, the number of bits of data to be simultaneously input or output from/to outside is eight (DQ0 to DQ7). For simple circuit configuration, the repair control circuit 140 mostly employs the configuration of replacing all such eight bits if any one of the bits is defective.

The foregoing is the configuration of the repair unit array. Since the memory mats include 512 word lines and 1024 bit lines each, the row address needed to specify a word line in a memory mat is in nine bits (X0 to X8). The column address needed to specify a bit line in a memory mat is in ten bits (Y0 to Y9). In fact, in the system of prefetching data as much as eight addresses by a single access as with DDR3 SDRAMs, the lower three bits (Y0 to Y2) of the column addresses needed to specify the eight addresses will not be used in accessing within a memory mat. The column address actually needed to specify a bit line in a memory mat is thus in seven bits (Y3 to Y9). The lower three bits (Y0 to Y2) of the column address is used in the data control circuit 108.

In the present embodiment, a plurality of defective memory cells that are associated with a piece of error pattern information D need to be in the same memory mat. The information for specifying the memory mat is the address z which is included in the error address information. The address z consists of the upper five bits of the row address (X9 to X13). The address z indicates a single partition of defect analysis data FMI. A defective address is thus analyzed within the partition, not across partitions.

As described above, error address information includes the following addresses: 9-bit addresses x0 and x1 which consist of a row address X0 to X8 each; 7-bit addresses y0 and y1 which consist of a column address Y3 to Y9 each; and a 5-bit address z which consist of a row address X9 to X13. The number of bits of error address information is thus 37. Since the number of bits of error pattern information D is three as mentioned above, a single piece of defect analysis data FMI has only to have 40 bits. For example, if eight pieces of defect analysis data FMI are provided for each bank, the storage capacity of the analysis memory 144 is 320 bits per bank.

As described above, according to the present embodiment, the relative arrangement relationship between defective memory cells in a memory mat is expressed by error pattern information D, and error addresses for each error pattern are expressed in a minimum number of bits. Consequently, the analysis memory 144 has only to have an extremely small number of bits.

Figures 12A, 12B:
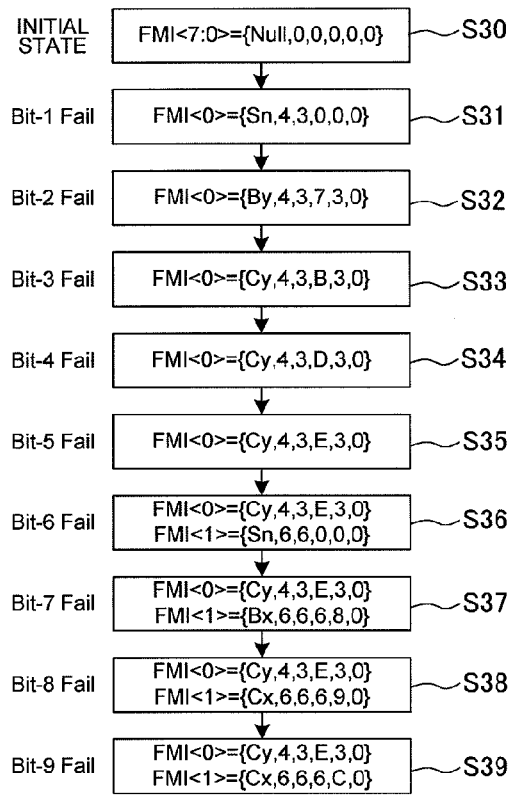
FIGS. 12A and 12B are diagrams indicative of a first concrete example of address analysis of defective memory cells, FIG. 12A showing the arrangement and the order of detection of defective memory cells, FIG. 12B showing the process of updating defect analysis data each time a defective memory cell is detected.

For example, if defective memory cells included in a memory mat (z=0) have the pattern of FIG. 12A, only two pieces of defect analysis data FMI<0> and FMI<1> need to be used. As shown in the final step of FIG. 12B (step S39), the defect analysis data FMI<0> and FMI<1> results in the following values:
  FMI<0>={Cy, 4, 3, E, 3, 0}, and
  FMI<1>={Cx, 6, 6, 6, C, 0}.
The process of obtaining the values will be described later.

Figures 13A, 13B:
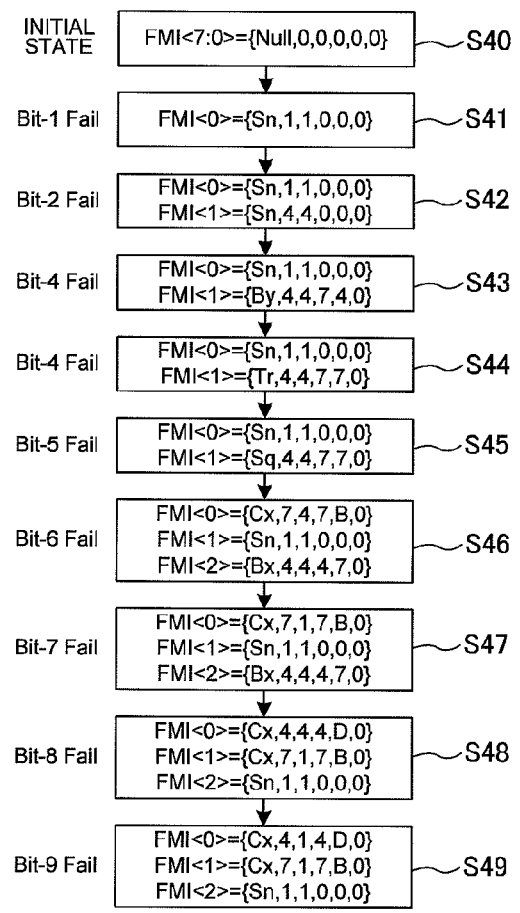
FIGS. 13A and 13B are diagrams indicative of a second concrete example of address analysis of defective memory cells, FIG. 13A showing the arrangement and the order of detection of defective memory cells, FIG. 13B showing the process of updating defect analysis data each time a defective memory cell is detected.

In another example, if defective memory cells included in a memory mat (z=0) have the pattern of FIG. 13A, only three pieces of defect analysis data FMI<0>, FMI<1>, and FMI<2> need to be used. As shown in the final step of FIG. 13B (step S49), the defect analysis data FMI<0>, FMI<1>, and FMI<2> results in the following values:
  FMI<0>={Cx, 4, 1, 4, D, 0},
  FMI<1>={Cx, 7, 1, 7, B, 0}, and
  FMI<2>={Sn, 1, 1, 0, 0, 0}.
The process of obtaining the values will also be described later.

Figure 14:
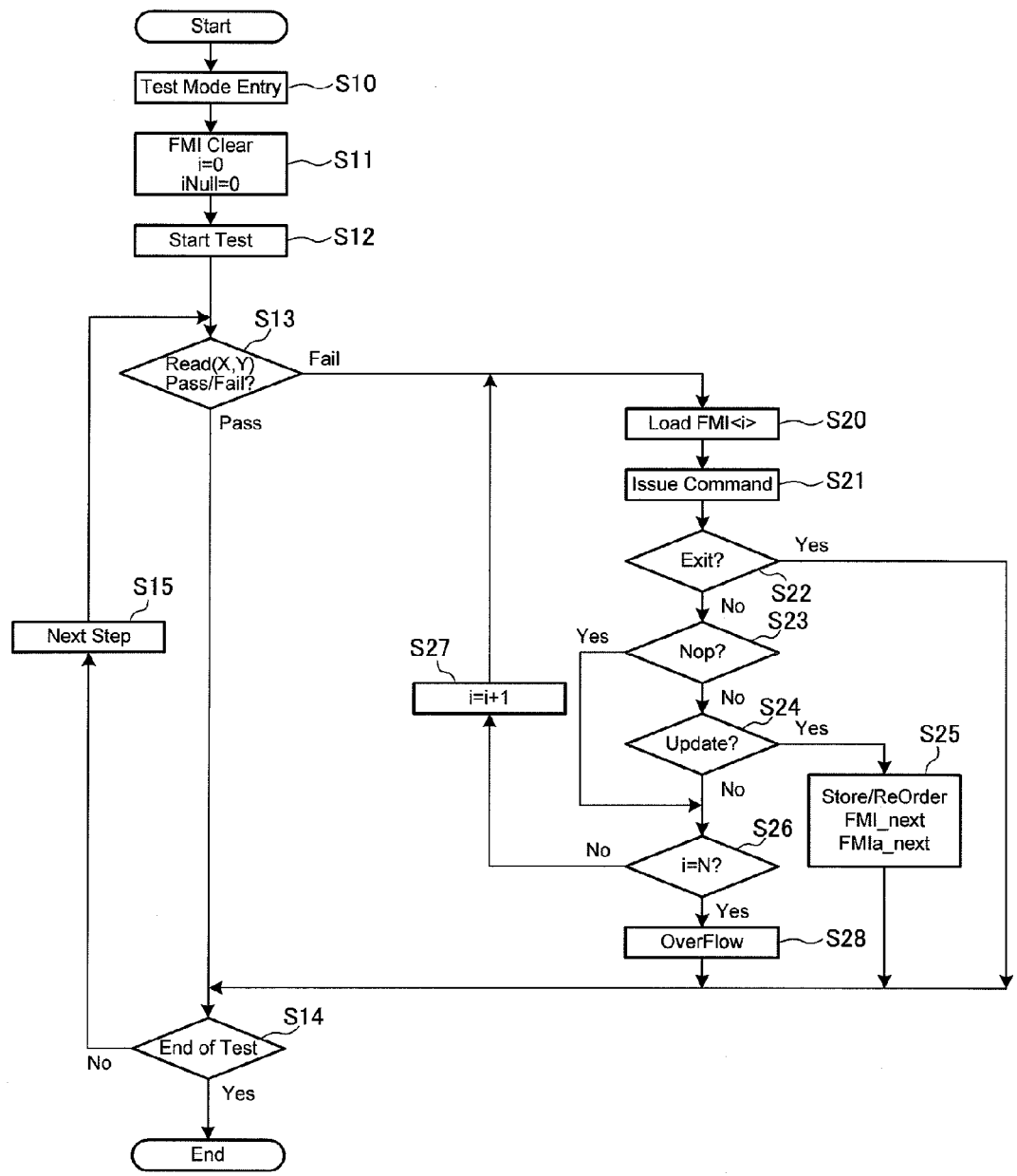
FIG. 14 is a flowchart for explaining an operation of an analysis circuit 143 and corresponds to steps S7 and S8 of the flowchart shown in FIG. 5.

Turning to FIG. 14, initially, the analysis circuit 143 enters the test mode (step S10). This activates the data determination circuit 107*a* in the column control circuit 107, whereby the data determination circuit 107*a* is switched into a mode of outputting the determination signal P/F. The contents of the analysis memory 144, an index i of the defect analysis data FMI, and an index iNull of unused defect analysis data FMI are initialized (step S11). Next, the analysis circuit 143 reads and writes a test pattern to perform an operation test (step S12). The analysis circuit 143 performs the operation test in succession while changing addresses as long as the determination signal P/F indicates a pass (steps S13 to S15).

If the determination signal P/F indicates a fail (step S13: Fail), the analysis circuit 143 loads the currently-selected defect analysis data FMI<i> (step S20) and issues a command (step S21). In an initial state, the defect analysis data FMI<0> is selected. The command will be described in detail later. If the issued command is an exit command (step S22: Yes), the analysis circuit 143 returns to step S14 because the failed address is already included in the defect analysis data FMI<i>. On the other hand, if the issued command is neither the exit command (step S22: No) nor a nop command (step S23: No), the analysis circuit 143 determines whether or not to issue an update command (step S24). There are a plurality of update commands, which will also be described later.

If the analysis circuit 143 determines to issue an update command (step S24: Yes), the analysis circuit 143 updates the contents of the current defect analysis data FMI<i> according to the type of the command (step S25). The defect analysis data FMI<i> may be updated by using another piece of defect analysis data FMI<iNull> if needed. In such a case, the error pattern that has been expressed by a single piece of error pattern information D is expressed by two pieces of error pattern information D. One of the two error patterns is recorded by updating the defect analysis data FMI<i>. The other is newly recorded by using the unused defect analysis data FMI<iNull>. The analysis circuit 143 may sort the pieces of defect analysis data FMI<0> to FMI<n> if needed. The analysis circuit 143 then returns to step S14.

If the issued command is the nop command (step S23: Yes), the analysis circuit 143 proceeds to the comparison of the next piece of defect analysis data FMI<i+1> because the currently-selected defect analysis data FMI<i> need not be updated. Here, the analysis circuit 143 selects the defect analysis data FMI<i+1> (step S27), and returns to step S20. If i=N (step S26: Yes), it is determined that relief is impossible (step S28) because there is no defect analysis data FMI unused. The overflow processing, which will be described in detail later, is to determine whether or not the error pattern information D can be reordered to secure an unused piece of defect analysis data FMI available.

The analysis circuit 143 performs the foregoing operation each time the determination signal P/F indicates a fail. If all the addresses are tested (step S14: Yes), the series of test operations are ended. The test pattern may be an arbitrary pattern. A plurality of test patterns may be used for the operation test. In fact, it is preferred to pick up a test pattern that provides a high defective rate in a screening process, and perform the steps shown in FIG. 14 and the replacement operation (step S9) before the test.

Next, various types of commands to be generated in the analysis circuit 143 will be described.

Turning to FIG. 15, the field "D" shows the current error pattern information. "xeq0," "yeq0," "xeq1," "yeq1," and "zeq" represent internal signals that are activated to a high level (1 in logical value) if the addresses of a newly-found defective memory cell, that is, the addresses when the determination signal P/F indicates a fail coincide or are considered to coincide with the addresses x0, y0, x1, y1, and z that constitute the error address information, respectively. "Ovf" represents an overflow signal. The exit command is forcibly issued when the overflow signal Ovf is at a high level. The nop command is forcibly issued when the internal command zeq is at a low level, since the defective memory cell detected belongs to a memory mat different from the memory mat in question.

Initially, if the error pattern information D is "Null" when a defective memory cell is found, a null_to_sn command is issued. The null_to_sn command is a command to change the error pattern information D from the Null pattern to the Sn pattern.

If the error pattern information D is "Sn" when a defective memory cell is found in the same memory mat (zeq=1), different commands are issued depending on the addresses. Specifically, suppose, as shown in FIG. 16A, that the current error pattern information D (=Sn) indicates that there is a defective memory cell MC0. When a defective memory cell MC1 having the same row address as the associated address x0 is detected, the internal signal xeq0 is activated to the high level and an sn_to_bx command is issued. The sn_to_bx command is a command to change the error pattern information D from the Sn pattern to the Bx pattern. When a defective memory cell MC2 having the same column address as the address y0 is detected, the internal signal yeq0 is activated to the high level and an sn_to_by command is issued. The sn_to_by command is a command to change the error pattern information D from the Sn pattern to the By pattern.

On the other hand, if the error pattern information D is "Sn" when neither of the internal signals xeq0 and yeq0 is activated, it means that as shown in FIG. 16A, the found defective memory cell MC3 lies in a diagonal position with respect to the defective memory cell MC0. In such a case, the nop command is issued since it is not possible to integrate the information on the defective memory cells into the same piece of defect analysis data FMI. If both the internal signals xeq0 and yeq0 are activated, the exit command is issued since it means that the same defective memory cell MC0 is detected again. Whenever the same defective memory cell is detected again, the exit command is issued. Redundant description will thus be omitted.

If the error pattern information D is "Bx" when a defective memory cell is found in the same memory mat (zeq=1), different commands are issued depending on the addresses. Specifically, suppose, as shown in FIG. 16B, that the current error pattern information D (=Bx) indicates that there are defective memory cells MC0 and MC1. When a defective memory cell MC2 having the same row address as the associated address x0 is detected, the internal signal xeq1 is activated to the high level and a bx_to_cx command is issued. The bx_to_cx command is a command to change the error pattern information D from the Bx pattern to the Cx pattern. When a defective memory cell MC3 having the same column address as the address y0 is detected, the internal signal yeq0 is activated to the high level and a bx_to_tr1 command is issued. The bx_to_tr1 command is a kind of command to change the error pattern information D from the Bx pattern to the Tr pattern. When a defective memory cell MC4 having the same column address as the address y1 is detected, the internal signal yeq1 is activated to the high level and a bx_to_tr2 command is issued. The bx_to_tr2 command is a kind of command to change the error pattern information D from the Bx pattern to the Tr pattern.

On the other hand, if none of the internal signals xeq0, yeq0, and yeq1 is activated when the error pattern information D is "Bx", it means that as shown in FIG. 16B, the found defective memory cell MC5 is not related to any of the error address information x0, y0, and y1. In such a case, the nop command is issued since it is not possible to integrate the information on the defective memory cells into the same piece of defect analysis data FMI. The exit command is issued in the cases previously discussed.

If the error pattern information D is "By" when a defective memory cell is found in the same memory mat, similar operations will be performed as with the case when the error pattern information D is "Bx".

If the error pattern information D is "Tr" when a defective memory cell is found in the same memory mat (zeq=1), different commands are issued depending on the addresses. Specifically, suppose, as shown in FIG. 16C, that the current error pattern information D (=Tr) indicates that there are defective memory cells MC0 to MC2. When a defective memory cell MC3 specified by the associated addresses x1 and y1 is detected, the internal signals xeq1 and yeq1 are activated to the high level and a tr_to_sq command is issued. The tr_to_sq command is a command to change the error pattern information D from the Tr pattern to the Sq pattern. When a defective memory cell MC4 having the same row address as the address x0 is detected, the internal signal xeq0 is activated to the high level and a tr_to_sncx command is issued. The tr_to_sncx command is a command to change the error pattern information D from the Tr pattern to the Cx pattern as well as to use a new piece of defect analysis data FMI and set its error pattern information D to the Sn pattern. When a defective memory cell MC5 having the same column address as the address y0 is detected, the internal signal yeq0 is activated to the high level and a tr_to_sncy command is issued. The tr_to_sncy command is a command to change the error pattern information D from the Tr pattern to the Cy pattern as well as to use a new piece of defect analysis data FMI and set its error pattern information D to the Sn pattern.

On the other hand, suppose that the error pattern information D is "Tr", neither of the internal signals xeq0 and yeq0 is activated, and at least either one of the internal signals xeq1 and yeq1 is not activated. This means that as shown in FIG. 16C, the found defective memory cell MC6 is neither related to any of the error address information x0 and y0 nor lies in the position of the memory cell MC3. In such a case, the nop command is issued since it is not possible to integrate the information on the defective memory cells into the same piece of defect analysis data FMI. The exit command is issued in the cases previously discussed.

If the error pattern information D is "Sq" when a defective memory cell is found in the same memory mat (zeq=1), different commands are issued depending on the addresses. Specifically, suppose, as shown in FIG. 16D, that the current error pattern information D (=Sq) indicates that there are defective memory cells MC0 to MC3. When a defective memory cell MC4 or MC5 having the same row address as the associated address x0 or x1 is detected, the internal signal xeq0 or xeq1 is activated to the high level and an sq_to_bxcx1 command or sq_to_bxcx2 command is issued. The sq_to_bxcx1 command and the sq_to_bxcx2 command are commands to change the error pattern information D from the Sq pattern to the Cx pattern as well as to use a new piece of defect analysis data FMI and set its error pattern information D to the Bx pattern. When a defective memory cell MC6 or MC7 having the same column address as the address y0 or y1 is detected, the internal signal yeq0 or yeq1 is activated to the high level and an sq_to_bycy1 command or sq_to_bycy2 command is issued. The sq_to_bycy1 command and the sq_to_bycy2 command are commands to change the error pattern information D from the Sq pattern to the Cy pattern as well as to use a new piece of defect analysis data FMI and set its error pattern information D to the By pattern.

On the other hand, if the error pattern information D is "Sq" and none of the internal signals xeq0, yeq0, xeq1, and yeq1 is activated, it means that as shown in FIG. 16D, the found defective memory cell MC8 is not related to any of the error address information x0, y0, x1, and y1. In such a case, the nop command is issued since it is not possible to integrate the information on the defective memory cells into the same piece of defect analysis data FMI. The exit command is issued in the cases previously discussed.

If the error pattern information D is "Cx" when a defective memory cell is found in the same memory mat (zeq=1), different commands are issued depending on the addresses. Specifically, suppose, as shown in FIG. 16E, that the defect analysis data FMI indicates that there are defective memory cells MC0 to MC2. When a defective memory cell MC3 or MC4 having the same row address as the address x0 is detected, the internal signal xeq0 is activated to the high level and a cx_to_cx command is issued. The cx_to_cx command is a command to maintain the error pattern information D as Cx. The memory cell MC3 shown in FIG. 16E applies to a case where its column address falls between the column address ymin of the memory cell MC0 and the column address ymax of the memory cell MC2. In contrast, the memory cell MC4 shown in FIG. 16E applies to a case where its column address does not come between the column address ymin of the memory cell MC0 and the column address ymax of the memory cell MC2. If a defective memory cell lying outside the range of column addresses ymin and ymax is detected like the memory cell MC4, the error address information is rewritten as will be described later.

On the other hand, if the error pattern information D is "Cx" and the internal signal xeq0 is not activated, it means that as shown in FIG. 16E, the found defective memory cell MC5 is not related to the error address information x0. In such a case, the nop command is issued since it is not possible to integrate the information on the defective memory cells into the same piece of defect analysis data FMI. The exit command is issued in the cases previously discussed.

If a defective memory cell is found when the error pattern information D is "Cy", similar operations will be performed as with the case when the error pattern information D is "Cx."

Turning to FIG. 17, there are four types of control flags. A first control flag is an increment flag iNull_inc. The activation of the increment flag iNull_inc increments the index iNull, which indicates an unused piece of defect analysis data FMI, to iNull+1. A second control flag is a division flag FMIa_modify. The activation of the division flag FMIa_modify updates the unused defect analysis data FMI<iNull>. The increment flag iNull_inc and the division flag FMIa_modify are activated upon issuance of the tr_to_sncx command, tr_to_sncy command, sq_to_bxcx1 command, sq_to_bxcx2 command, sq_to_bycy1 command, and sq_to_bycy2 command. The increment flag iNull_inc is also activated upon issuance of the null_to_sn command.

A third control flag is an update flag FMI_modify. The activation of the update flag FMI_modify updates the current defect analysis data FMI<i>. The update flag FMI_modify is activated in response to all the commands except the exit command and the nop command.

A fourth control flag is a reorder flag ReOrder. When the reorder flag ReOrder is activated, the defect analysis data is sorted to shift the current defect analysis data FMI<i> to a lower order. The reorder flag ReOrder is activated when the division flag FMIa_modify is activated, as well as when the bx_to_cx command or by_to_cy command is issued.

Turning to FIG. 18, the defect analysis data FMI<i> is updated when the update flag FMI_modify is activated. As mentioned above, the update flag FMI_modify is activated in response to all the commands except the exit command and the nop command.

In FIG. 18, the field "D_next" shows the updated error pattern information D. The fields "x0_next", "y0_next", "x1_next", "y1_next", and "z next" show the updated addresses x0, y0, x1, y1, and z, respectively. The notations "xC", "yC" and "zC" represent the row address, column address, and memory mat address of the found defective memory cell, respectively. The notations "xmin" and "xmax" represent addresses that have the smallest value and the largest value, respectively, among the row addresses included in the defect analysis data. Similarly, the notations "ymin" and "ymax" represent addresses having the smallest value and the largest value, respectively, among the column addresses included in the defect analysis data.

Initially, when the null_to_sn command is issued, the error pattern information D is updated to "Sn". The row address xC and column address yC of the defective memory cell are written into the addresses x0 and y0. The addresses x1 and y1 are kept at the previous values and not updated. In FIG. 18, the notations "x1" and "y1" mean that the previous values of "x1" and "y1" are given. The same holds for "x0" and "y0".

When the sn_to_bx command is issued, the error pattern information D is updated to "Bx". The row address xC and column address yC of the defective memory cell are written into the addresses x1 and y1. The addresses x0 and y0 are kept at the previous values and not updated. Similarly, when the sn_to_by command is issued, the error pattern information D is updated to "By." The row address xC and column address yC of the defective memory cell are written into the addresses x1 and y1. The addresses x0 and y0 are kept at the previous values and not updated.

When the bx_to_cx command is issued, the error pattern information D is updated to "Cx". The minimum value ymin and the maximum value ymax of the column addresses are written into the addresses y0 and y1, respectively. The addresses x0 and x1 are kept at the previous values and not updated. Similarly, when the by_to_cy command is issued, the error pattern information D is updated to "Cy". The minimum value xmin and the maximum value xmax of the row addresses are written into the addresses x0 and x1, respectively. The addresses y0 and y1 are kept at the previous values and not updated.

When the bx_to_tr1 command is issued, the error pattern information D is updated to "Tr". The row address xC of the defective memory cell is written into the address x1. The addresses x0, y0, and y1 are kept at the previous values and not updated. Similarly, when the by_to_tr1 command is issued, the error pattern information D is updated to "Tr". The column address yC of the defective memory cell is written into the address y1. The addresses x0, x1, and y0 are kept at the previous values and not updated.

When the bx_to_tr2 command is issued, the error pattern information D is updated to "Tr". The row address xC of the defective memory cell is written into the address x1. The addresses x0, y0, and y1 are overwritten with the previous values of the addresses x1, y1, and y0, respectively. Similarly, when the by_to_tr2 command is issued, the error pattern information D is updated to "Tr". The column address yC of the defective memory cell is written into the address y1. The addresses x0, x1, and y0 are overwritten with the previous values of the addresses x1, x0, and y1, respectively.

When the tr_to_sncx command or sq_to_bxcx1 command is issued, the error pattern information D is updated to "Cx". The row address xC of the defective memory cell is written into the address x1. The minimum value ymin and the maximum value ymax of the column addresses are written into the addresses y0 and y1, respectively. The address x0 is kept at the previous value and not updated. Similarly, when the tr_to_sncy command or sq_to_bxcy1 command is issued, the error pattern information D is updated to "Cy". The column address yC of the defective memory cell is written into the address y1. The minimum value xmin and the maximum value xmax of the row addresses are written into the addresses x0 and x1, respectively. The address y0 is kept at the previous value and not updated.

When the tr_to_sq command is issued, the error pattern information D is updated to "Sq". The addresses x0, y0, x1, and y1 are kept at the previous values and not updated.

When the sq_to_bxcx2 command is issued, the error pattern information D is updated to "Cx". The row address xC of the defective memory cell is written into the address x0. The minimum value ymin and the maximum value ymax of the column addresses are written into the addresses y0 and y1, respectively. The address x1 is kept at the previous value and not updated. Similarly, when the sq_to_bycy2 command is issued, the error pattern information D is updated to "Cy". The column address yC of the defective memory cell is written into the address y0. The minimum value xmin and the maximum value xmax of the row addresses are written into the addresses x0 and x1, respectively. The address y1 is kept at the previous value and not updated.

When the cx_to_cx command is issued, the error pattern information D is maintained as "Cx". The minimum value ymin and the maximum value ymax of the column addresses are written into the addresses y0 and y1, respectively. The addresses x0 and x1 are kept at the previous values and not updated. Similarly, when the cy_to_cy command is issued, the error pattern information D is maintained as "Cy". The minimum value xmin and the maximum value xmax of the row addresses are written into the addresses x0 and x1, respectively. The addresses y0 and y1 are kept at the previous values and not updated.

Turning to FIG. 19, the field "Da_next" shows error pattern information D to be written into the defect analysis data FMI<iNull>. The fields "x0a_next", "y0a_next", "x1a_next", "y1a_next", and "za_next" show addresses x0, y0, x1, y1, and z to be written into the defect analysis data FMI<iNull>, respectively. The notations "x0", "x1", and "y1" represent the addresses x0, y0, x1, and y1 of the current defect analysis data FMI<i>, respectively.

Initially, when the tr_to_sncx command is issued, the error pattern information D is set to "Sn". The addresses x1 and y0 of the current defect analysis data FMI<i> are written into the addresses x0 and y0, respectively. Similarly, when the tr_to_sncy command is issued, the error pattern information D is set to "Sn". The addresses x0 and y1 of the current defect analysis data FMI<i> are written into the addresses x0 and y0, respectively.

When the sq_to_bxcx1 command is issued, the error pattern information D is set to "Bx". The addresses x1, y0, x1, and y1 of the current defect analysis data FMI<i> are written into the addresses x0, y0, x1, and y1, respectively. Similarly, when the sq_to_bxcx2 command is issued, the error pattern information D is set to "Bx". The addresses x0, y0, x0, and y1 of the current defect analysis data FMI<i> are written into the addresses x0, y0, x1, and y1, respectively.

When the sq_to_bycy1 command is issued, the error pattern information D is set to "By". The addresses x0, y1, x1, and y1 of the current defect analysis data FMI<i> are written into the addresses x0, y0, x1, and y1, respectively. Similarly, when the sq_to_bycy2 command is issued, the error pattern information D is set to "By". The addresses x0, y0, x1, and y0 of the current defect analysis data FMI<i> are written into the addresses x0, y0, x1, and y1, respectively.

The foregoing is the operation of the analysis circuit 143 in the secondary repair. It is preferred, though not limited in particular, that the foregoing operation of the analysis circuit 143 is implemented by hardware, using logic circuits.

Next, how defect analysis data is updated each time a defective memory cell is detected will be described in conjunction with concrete examples.

In the present example, the analysis memory 144 is provided with eight pieces of defect analysis data FMI<0> to FMI<7>.

Turning to FIG. 12B, all the pieces of defect analysis data FMI<0> to FMI<7> are reset in the initial state (step S30). When the first defective memory cell (XADD=4, YADD=3) is detected, the defect analysis data FMI<0> is set to the following values:

FMI<0>={Sn, 4, 3, 0, 0, 0}. (Step S31)

That is, the defective memory cell is handled as what is called a single-bit defect (Sn defect) at this point in time.

Next, when the second defective memory cell (XADD=7, YADD=3) is detected, the defect analysis data FMI<0> is set to the following values:

FMI<0>={By, 4, 3, 7, 3, 0}. (Step S32)

That is, the single-bit defect (Sn defect) is updated to a two-bit defect with the same column addresses (By defect).

When the third defective memory cell (XADD=B, YADD=3) is detected, the defect analysis data FMI<0> is set to the following values:

FMI<0>={Cy, 4, 3, B, 3, 0}. (Step S33)

That is, the two-bit defect (By defect) is updated to a line defect in the column direction (Cy defect).

When the fourth defective memory cell (XADD=D, YADD=3) is detected, the defect analysis data FMI<0> is set to the following values:

FMI<0>={Cy, 4, 3, D, 3, 0}. (Step S34)

When the fifth defective memory cell (XADD=E, YADD=3) is detected, the defect analysis data FMI<0> is set to the following values:

FMI<0>={Cy, 4, 3, E, 3, 0}. (Step S35)

In such a case, the defect remains a line defect in the column direction (Cy defect) but with updated address information.

When the sixth defective memory cell (XADD=6, YADD=6) is detected, a new piece of defect analysis data FMI<1> is used. The defect analysis data FMI<1> is set to the following values:

FMI<1>={Sn, 6, 6, 0, 0, 0}. (Step S36)

That is, a single-bit defect (Sn defect) is added to the line defect in the column direction (Cy defect).

When the seventh defective memory cell (XADD=6, YADD=8) is detected, the defect analysis data FMI<1> is set to the following values:

FMI<1>={Bx, 6, 6, 6, 8, 0}. (Step S37)

That is, the single-bit defect (Sn defect) is updated to a two-bit defect with the same row addresses (Bx defect).

When the eighth defective memory cell (XADD=6, YADD=9) is detected, the defect analysis data FMI<1> is set to the following values:

FMI<1>={Cx, 6, 6, 6, 9, 0}. (Step S38)

That is, the two-bit defect (Bx defect) is updated to a line defect in the row direction (Cx defect).

When the ninth defective memory cell (XADD=6, YADD=C) is detected, the defect analysis data FMI<1> is set to the following values:

FMI<1>={Cx, 6, 6, 6, C, 0}. (Step S39)

In such a case, the defect remains a line defect in the row direction (Cx defect) but with updated address information.

As a result of the foregoing process, the following two pieces of defect analysis data are stored in the analysis memory 144:

FMI<0>={Cy, 4, 3, E, 3, 0}, and
FMI<1>={Cx, 6, 6, 6, C, 0}.

In such a case, a word line of XADD=6 and a bit line of YADD=3 are considered to be a defective word line and a defective bit line, which are replaced with a redundant word line and a redundant bit line, respectively. In other words, in step S9 shown in FIG. 5, the information on XADD=6 and YADD=3 is written into the electrical fuse circuit 142.

Turing to FIGS. 13A and 13B, also in the second concrete example, the analysis memory 144 is provided with eight pieces of defect analysis data FMI<0> to FMI<7>.

As shown in FIG. 13B, all the pieces of defect analysis data FMI<0> to FMI<7> are reset in the initial state (step S40). When the first defective memory cell (XADD=1, YADD=1) is detected, the defect analysis data FMI<0> is set to the following values:

FMI<0>={Sn, 1, 1, 0, 0, 0}. (Step S41)

That is, the defective memory cell is handled as what is called a single-bit defect (Sn defect) at this point in time.

Next, when the second defective memory cell (XADD=4, YADD=4) is detected, a new piece of defect analysis data FMI<1> is used. The defect analysis data FMI<1> is set to the following values:

FMI<1>={Sn, 4, 4, 0, 0, 0}. (Step S42)

That is, another single-bit defect (Sn defect) is added to the single-bit defect (Sn defect).

When the third defective memory cell (XADD=7, YADD=4) is detected, the defect analysis data FMI<1> is set to the following values:

FMI<1>={By, 4, 4, 7, 4, 0}. (Step S43)

That is, one of the single-bit defects (Sn defects) is updated to a two-bit defect with the same column addresses (By defect).

When the fourth defective memory cell (XADD=4, YADD=7) is detected, the defect analysis data FMI<1> is set to the following values:

FMI<1>={Tr, 4, 4, 7, 7, 0}. (Step S44)

That is, the two-bit defect (Bx defect) is updated to an L-shaped three-bit defect (Tr defect).

When the fifth defective memory cell (XADD=7, YADD=7) is detected, the defect analysis data FMI<1> is set to the following values:

FMI<1>={Sq, 4, 4, 7, 7, 0}. (Step S45)

That is, the L-shaped three-bit defect (Tr defect) is updated to a rectangular four-bit defect (Sq defect).

When the sixth defective memory cell (XADD=7, YADD=B) is detected, a new piece of defect analysis data FMI<2> is used. The reorder flag ReOrder is set to sort the pieces of defect analysis data, which are set as follows:

FMI<0>={Cx, 7, 4, 7, B, 0},
FMI<1>={Sn, 1, 1, 0, 0, 0}, and
FMI<2>={Bx, 4, 4, 4, 7, 0}. (Step S46)

That is, the rectangular four-bit defect (Sq defect) is divided into a two-bit defect (Bx defect) and a line defect in the row direction (Cx defect).

When the seventh defective memory cell (XADD=7, YADD=1) is detected, the defect analysis data FMI<0> is set to the following values:

FMI<0>={Cx, 7, 1, 7, B, 0}. (Step S47)

In such a case, the defect remains a line defect in the row direction (Cx defect) but with updated address information.

When the eighth defective memory cell (XADD=4, YADD=D) is detected, the reorder flag ReOrder is set to sort the pieces of defect analysis data, which are set as follows:

FMI<0>={Cx, 4, 4, 4, D, 0},
FMI<1>={Cx, 7, 1, 7, B, 0}, and
FMI<2>={Sn, 1, 1, 0, 0, 0}. (Step S48)

That is, the two-bit defect (Bx defect) is updated to a line defect in the row direction (Cx defect).

When the ninth defective memory cell (XADD=4, YADD=1) is detected, the defect analysis data FMI<0> is set to the following values:

FMI<0>={Cx, 4, 1, 4, D, 0}. (Step S49)

In such a case, the defect remains a line defect in the row direction (Cx defect) but with updated address information.

As a result of the foregoing process, the following three pieces of defect analysis data are stored in the analysis memory 144:

FMI<0>={Cx, 4, 1, 4, D, 0},
FMI<1>={Cx, 7, 1, 7, B, 0}, and
FMI<2>={Sn, 1, 1, 0, 0, 0}.

In such a case, word lines of XADD=4 and 7 are considered as defective word lines, and either a word line of XADD=1 or a bit line of YADD=1 as a defective word line or defective bit line. Such defective lines are replaced with respective redundant word lines or the like. In other words, in step S9 shown in FIG. 5, the information on XADD=1, 4, and 7 is written into the electrical fuse circuit 142.

As has been described above, according to the present embodiment, error pattern information and error address information are updated each time a defective memory cell is detected in secondary repair after packaging. This significantly reduces the capacity of the work memory needed for analysis. Since the analysis memory 144 can be implemented inside the semiconductor device 100, the external tester for use in secondary repair need not include an analysis memory.

In particular, when defective memory cells are found in various addresses at random as in the second concrete example shown in FIG. 13, the method described in Japanese Patent Application Laid-Open No. 2001-52497 needs a work area or analysis memory of high capacity. In contrast, according to the method of the present embodiment, only a relatively small work area is used even when defective memory cells are found in various addresses at random. This makes it possible to design the analysis memory 144 with a small storage capacity.

Figure 20:
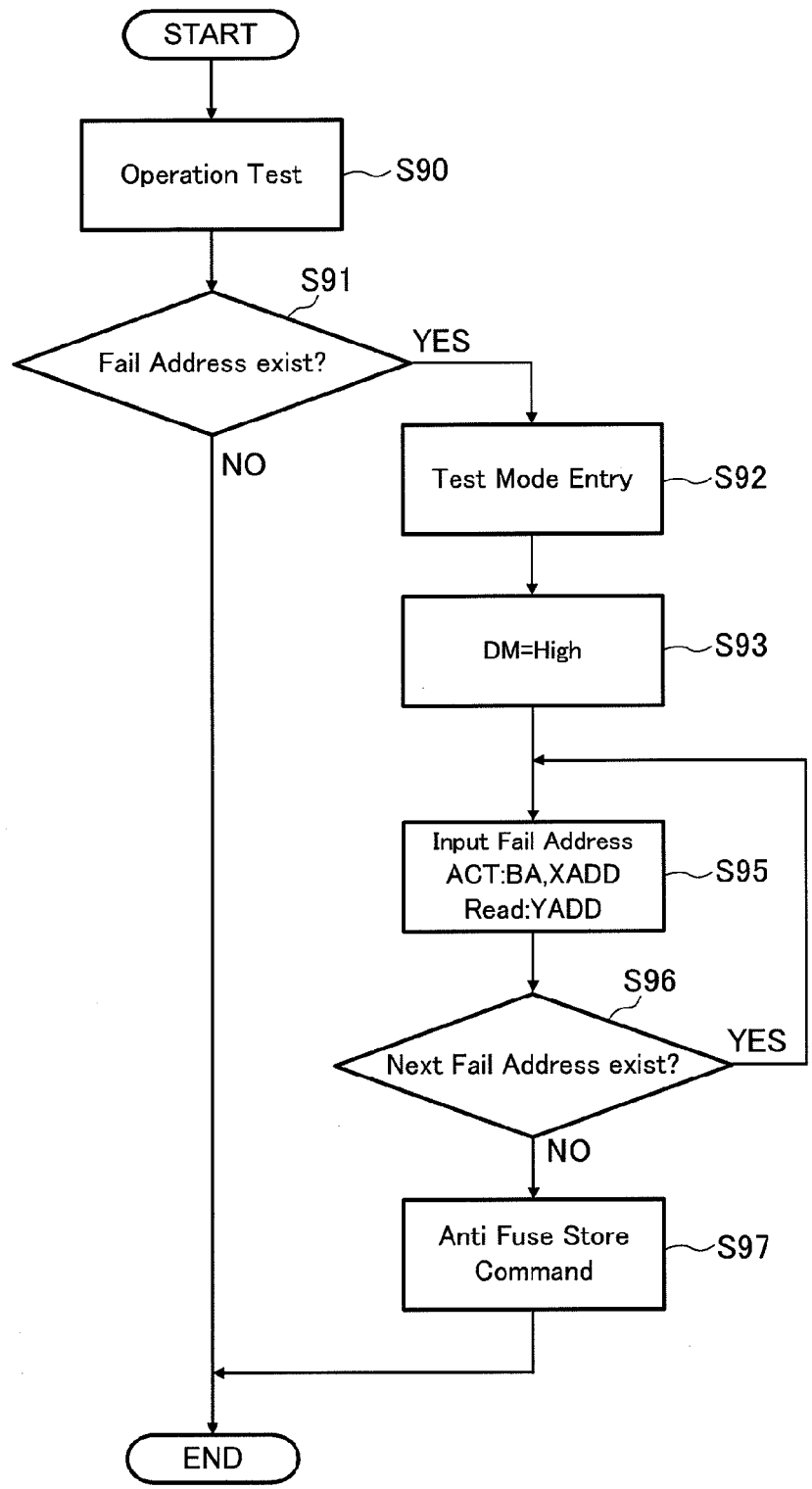
FIG. 20 is a flowchart for explaining the operation of the external tester 200 and the analysis circuit 143 during tertiary repair and corresponds to steps S80 to S82 of the flowchart shown in FIG. 5.

Turning to FIG. 20, initially, an operation test is performed by using the external tester 200 (step S90). The operation test is performed by accessing the semiconductor device 100 at the same speed as the operating speed in actual use. That is, a write operation is performed at the maximum design speed, followed by a read operation at the maximum speed. The external tester 200 compares the read data DQ resulting from the operation test with expected values (i.e., write data) to evaluate whether there is any defective address (step S91).

If there is no defective address (step S91: NO), the processing ends. On the other hand, if there is any defective address (step S91: YES), the external tester 200 issues a test command so that the semiconductor device 100 enters a test mode for tertiary repair (step S92). This changes the mode select signal PT supplied to the analysis circuit 143 to a high level, and the analysis circuit 143 enters an operation mode in which it can accept defective addresses based on the data mask signal DM.

Next, the external tester 200 changes the data mask signal DM to a high level (step S93), and inputs the detected defective addresses into the semiconductor device 100 (step S95). The addresses are input by the same method as in a read access. A bank address BA and a row address XADD are input in synchronization with an active command (ACT). A column address YADD is input in synchronization with a read command (READ). Such processing is performed on all the defective addresses found (step S96: NO) and then a write command for electrical fuses is issued to the semiconductor device 100 (step S97). Consequently, the defective addresses that are stored into the analysis memory 144 through the analysis circuit 143 are written into the electrical fuse circuit 142.

This completes the tertiary repair. As described above, tertiary repair is performed by using a high-speed external tester 200 after the completion of primary repair and secondary repair. It is therefore possible to find defects that occur only under fast access, and relieve addresses where such defects exist. As mentioned previously, very few defective addresses are found by tertiary repair. The external tester 200 therefore need not include a high-capacity analysis memory.

Figure 21:
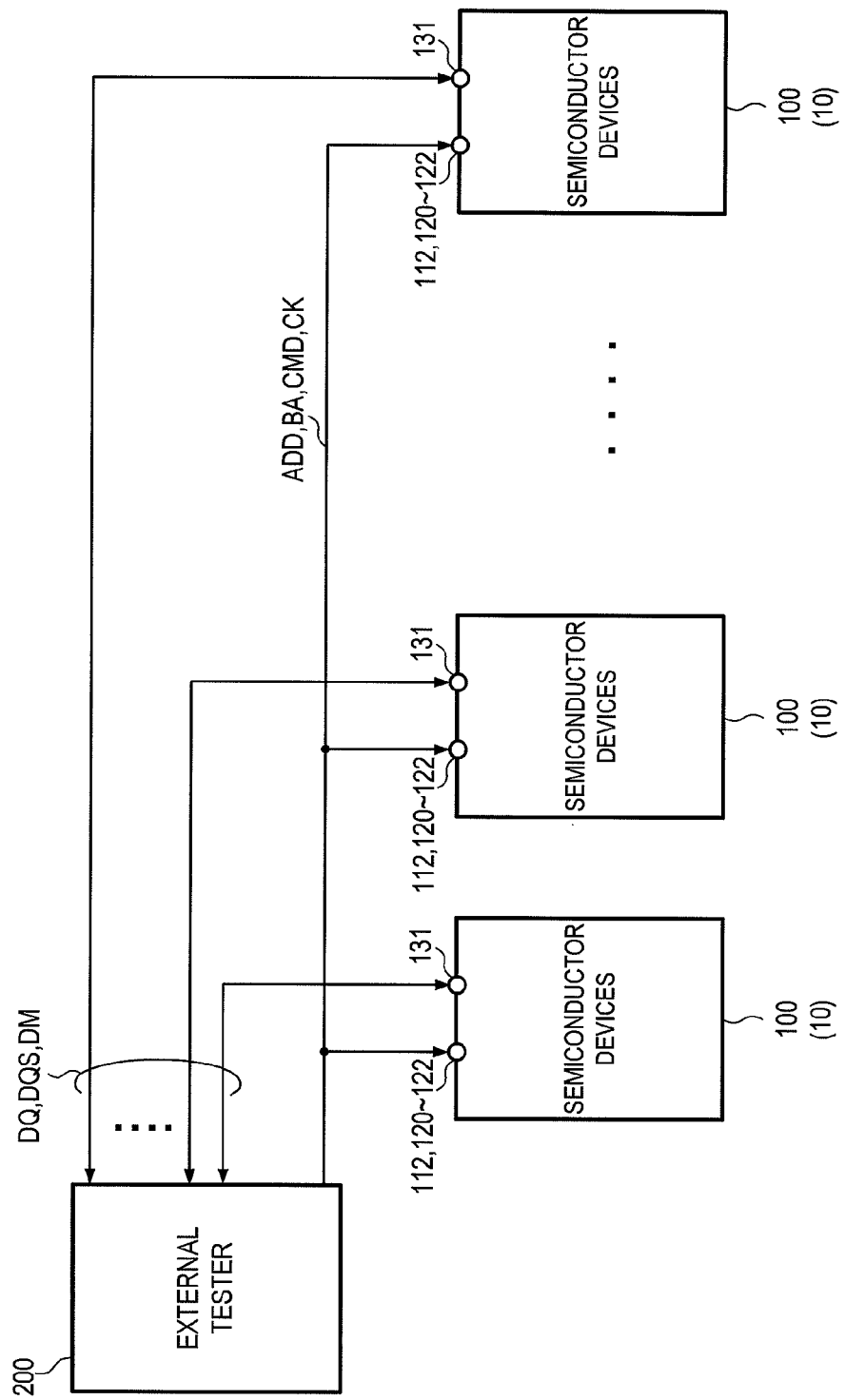
FIG. 21 is a schematic block diagram for explaining a method of performing tertiary repair on a plurality of semiconductor devices 100 in parallel.

Turning to FIG. 21, when tertiary repair is performed on a plurality of semiconductor devices 100 in parallel, the address terminals 112, command terminals 120, control terminals 121, and clock terminals 122 of the semiconductor devices 100 are connected to the external tester 200 in common. The data system terminals 131 of the semiconductor devices 100 are connected to the external tester 200 by using respective different wirings. When an operation test is performed in such a state, the semiconductor devices 100 make the same operation. Since the semiconductor devices 100 have respective different defective addresses if any, the semiconductor devices 100 output erroneous read data DQ each time a defective address is accessed. The read data DQ is supplied from the semiconductor devices 100 to the external tester 200 through the respective different wirings. The external tester 200 can thus detect defective addresses with respect to each of the semiconductor devices 100.

Figure 22:
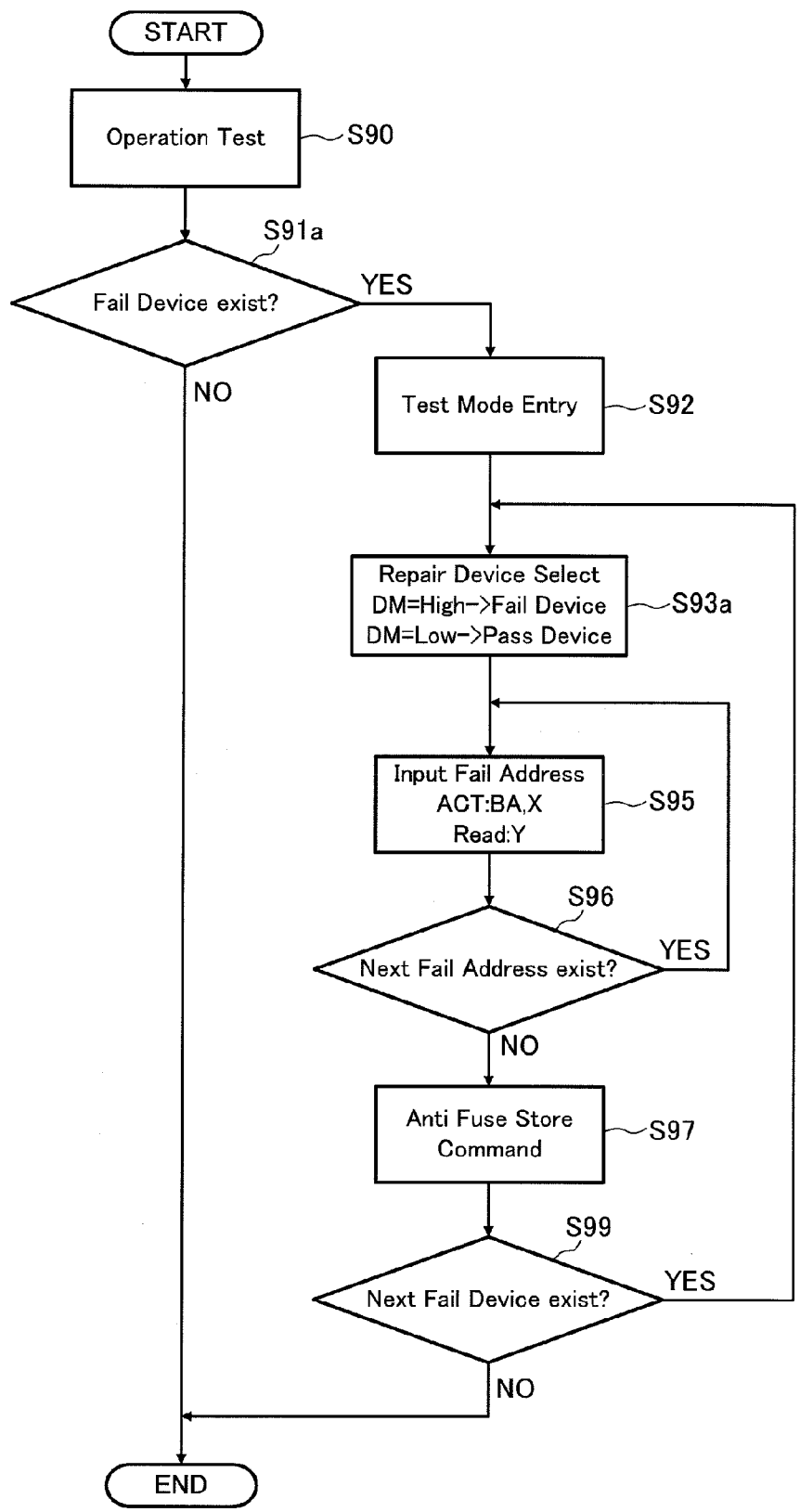
FIG. 22 is a flowchart for explaining the operation when performing tertiary repair on a plurality of semiconductor devices 100 in parallel.

Turning to FIG. 22, initially, a plurality of semiconductor devices 100 to be subjected to tertiary repair and the external tester 200 are connected as shown in FIG. 21, and an operation test is performed in parallel (step S90). The operation test is performed at the maximum design speed. The external tester 200 evaluates whether there is any defective semiconductor device 100 (step S91a).

If there is no defective semiconductor device 100 (step S91a: NO), the processing ends. On the other hand, if there is any defective semiconductor device 100 (step S91a: YES), the external tester 200 issues a test command so that all the semiconductor devices 100 enter a test mode for tertiary repair (step S92).

Next, the external tester 200 changes the data mask signal DM of one of defective semiconductor devices 100 to a high level (step S93a), and outputs a detected defective address (step S95). The defective address is input to all the semiconductor devices 100, but is valid only to the semiconductor device 100 in which the data mask signal DM is at a high level. The defective address is ignored by the other semiconductor devices 100 where the data mask signal DM is at a low level. Such processing is performed on all defective addresses found in the semiconductor device 100 (step S96: NO) and then a write command for electrical fuses is issued (step S97). Consequently, the defective addresses that are stored into the analysis memory 144 through the analysis circuit 143 are written into the electrical fuse circuit 142.

The foregoing processing is performed on each of all the semiconductor devices 100 that are found to be defective. When the processing on all the semiconductor devices 100 is completed (step S99: NO), the series of tertiary repair is completed. As described above, according to the present embodiment, the data mask signal DM is used for device selection. This makes it possible to perform tertiary repair on a plurality of semiconductor devices 100 in parallel.

Next, a preferred second embodiment of the present invention will be described. The present embodiment deals with an example where the present invention is applied to a stacked semiconductor device in which a plurality of semiconductor chips are stacked and packaged in a single package.

Figure 23:
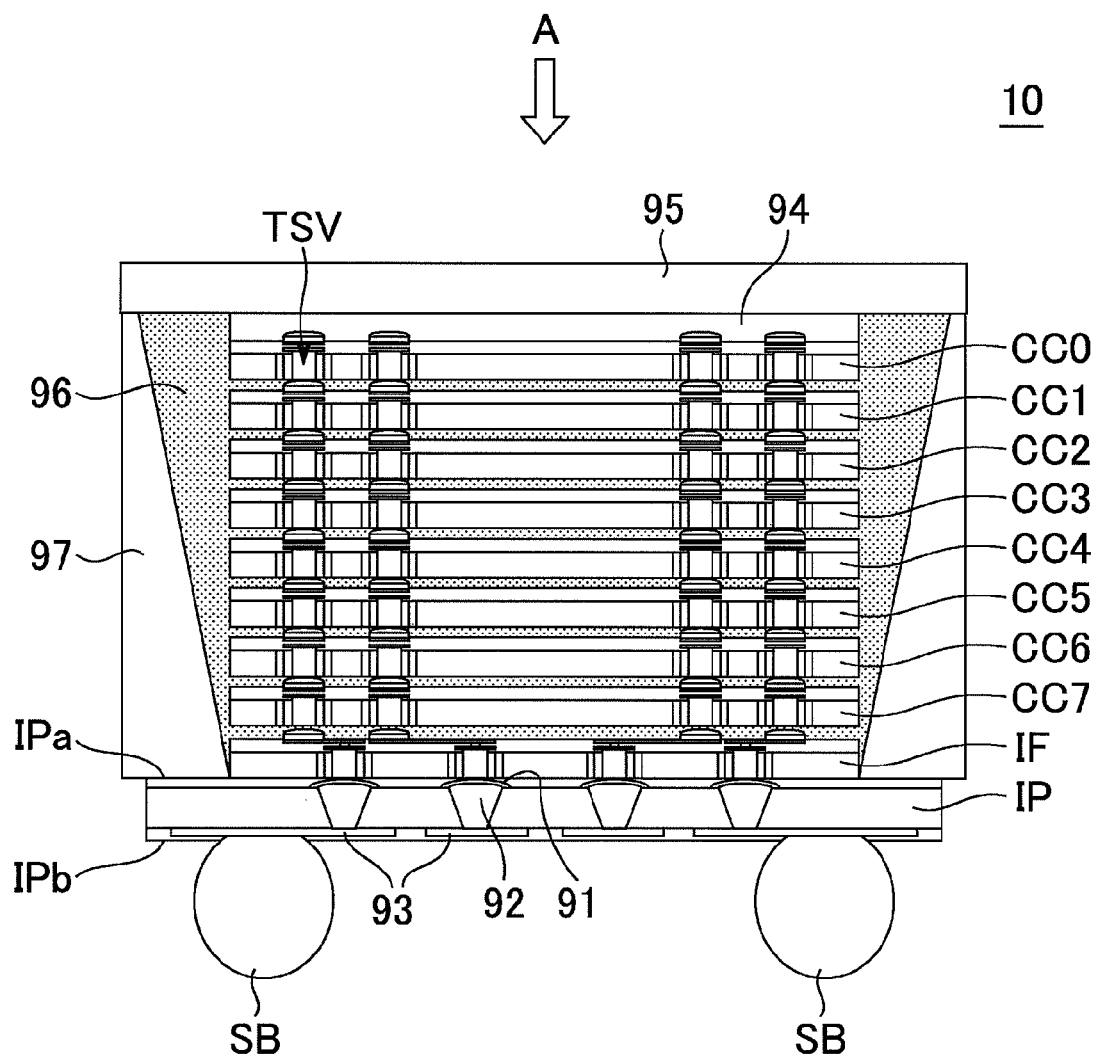
FIG. 23 is a schematic cross-sectional view provided to explain the structure of a semiconductor device 10 according to the preferred second embodiment of the present invention.

Turning to FIG. 23, the semiconductor device 10 according to this embodiment has the structure where 8 core chips CC0 to CC7 and an interface chip IF are stacked on an interposer IP. The core chips CC0 to CC7 have the same function and structure as one another. It is worth noting that the uppermost core chip CC0 may have a different structure from the other core chips CC1 to CC7. For example, the uppermost core chip CC0 may be thicker than the remaining core chips CC1 to CC7. The core chips CC0 to CC7 are manufactured using the same manufacture mask whereas the interface chip IF is manufactured using a manufacture mask different from that of the core chips CC0 to CC7. The core chips CC0 to CC7 and the interface chip IF are semiconductor chips using a silicon substrate and are electrically connected to adjacent chips in a vertical direction through plural through silicon vias TSV penetrating the silicon substrate. The through silicon vias may be referred to as penetration electrodes. The uppermost core chip CC0 may not have the through silicon via TSV. Meanwhile, the interposer IP is a circuit board that is made of a resin, and plural external terminals (solder balls) SB are formed in a back surface IPb of the interposer IP.

The core chips CC0 to CC7 each are a semiconductor chip that includes circuit blocks of an ordinary stand-alone SDRAM (Synchronous Dynamic Random Access Memory), excluding an external interface so-called front end section. In other words, the core chips CC0 to CC7 are memory chips in which only the circuit blocks belonging to back end sections are integrated. Examples of circuit blocks included in a front end section include a parallel-serial conversion circuit that performs parallel-serial conversion of input/output data between a memory cell array and data input/output terminals, and a DLL (Delay-Locked Loop) circuit that controls data input/output timing. Details will be given later.

On the other hand, the interface chip IF is a semiconductor chip in which only the front end unit in circuit blocks of an ordinary stand-alone SDRAM is integrated. The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 23, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 23, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figure 24A:
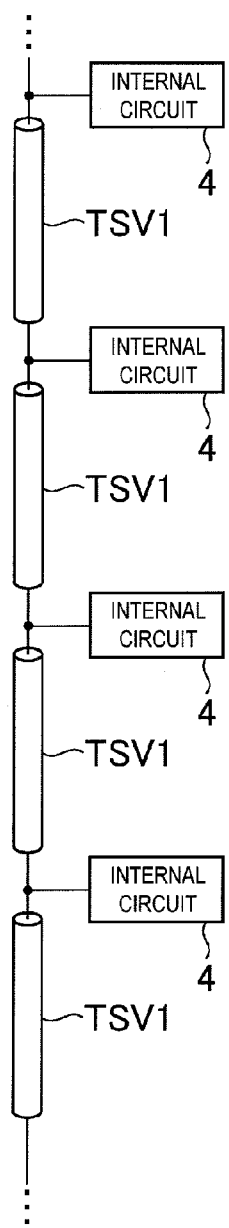
FIGS. 24A to 24C are diagrams indicative of the various types of through silicon vias TSV provided in a core chip.

When most of the through silicon vias TSV provided in the core chips CC0 to CC7 are two-dimensionally viewed from a lamination direction, that is, viewed from an arrow A shown in FIG. 23, the through silicon vias TSV are short-circuited from the through silicon vias TSV of other layers provided at the same position. That is, as shown in FIG. 24A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 24A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Figure 24B:
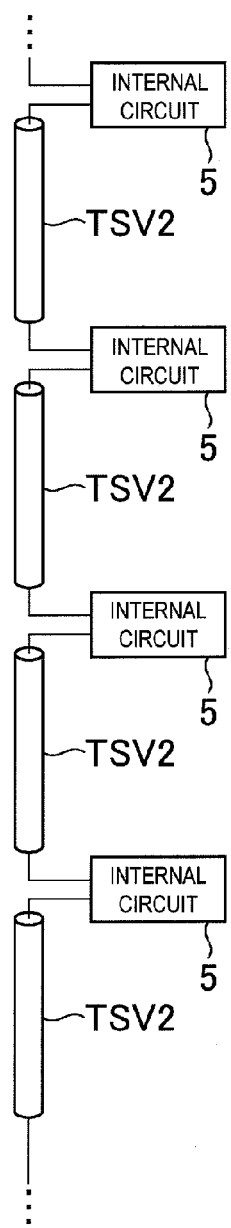

Meanwhile, as shown in FIG. 24B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Figure 24C:
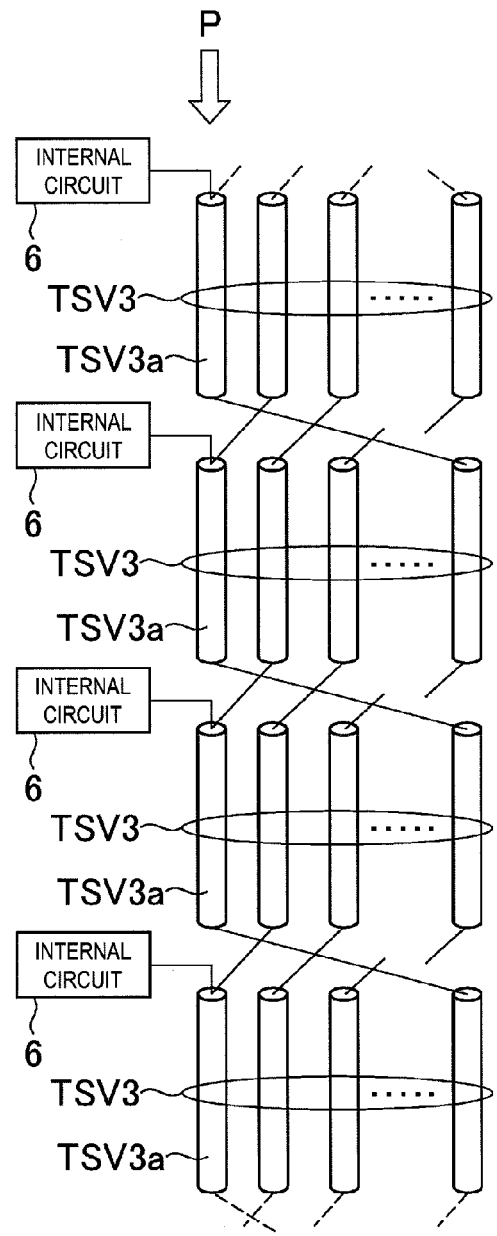

Another through silicon via TSV group is short-circuited from the through silicon vias TSV of other layer provided at the different position in plain view, as shown in FIG. 24C. With respect to this kind of through silicon via TSV group 3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the Through silicon vias TSV provided in the core chips CC0 to CC7, three types (through silicon via TSV1 to through silicon via TSV3) shown in FIGS. 24A to 24C exist. As described above, most of the Through silicon vias TSV are of a type shown in FIG. 24A, and an address signal, a command signal, and a clock signal are supplied from the interface chip IF to the core chips CC0 to CC7, through the through silicon via TSV1 of the type shown in FIG. 24A. Read data and write data are input to and output from the interface chip IF through the through silicon via TSV1 of the type shown in FIG. 24A. Meanwhile, the through silicon via TSV2 and through silicon via TSV3 of the types shown in FIGS. 24B and 24C are used to provide individual information to the core chips CC0 to CC7 having the same structure.

Figure 25:
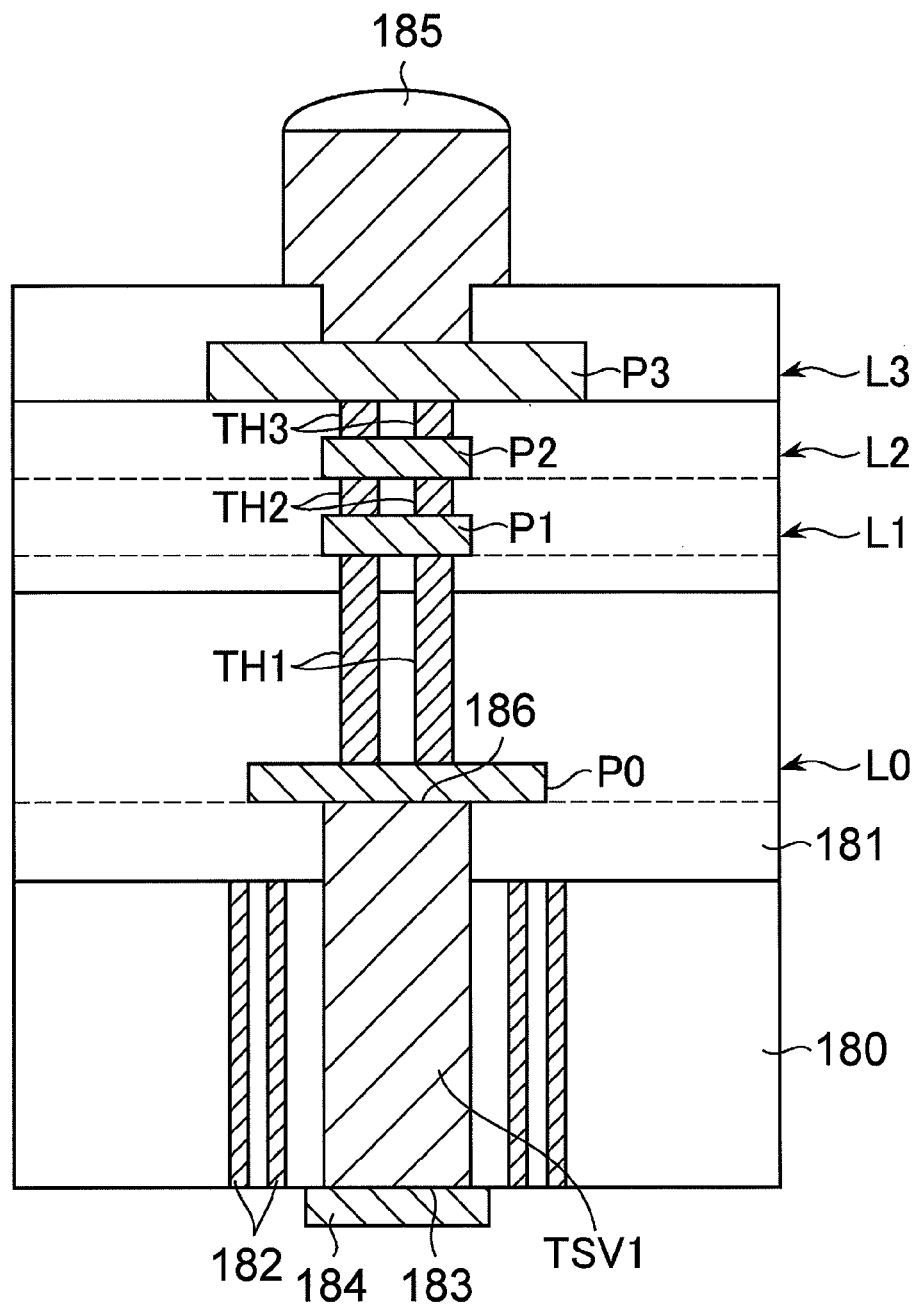
FIG. 25 is a cross-sectional view indicative of the structure of the through silicon via TSV1 of the type shown in FIG. 24A.

Turning to FIG. 25, the through silicon via TSV1 is provided to penetrate a silicon substrate 180 and an interlayer insulating film 181 provided on a surface of the silicon substrate 180. Around the through silicon via TSV1, an insulating ring 182 is provided. Thereby, the through silicon via TSV1 and a transistor region are insulated from each other. In an example shown in FIG. 25, the insulating ring 182 is provided double. Thereby, capacitance between the through silicon via TSV1 and the silicon substrate 180 is reduced.

An end 183 of the through silicon via TSV1 at the back surface of the silicon substrate 180 is covered by a back surface bump 184. The back surface bump 184 is an electrode that contacts a surface bump 185 provided in a core chip of a lower layer. The surface bump 185 is connected to an end 186 of the through silicon via TSV1, through plural pads P0 to P3 provided in wiring layers L0 to L3 and plural through-hole electrodes TH1 to TH3 connecting the pads to each other. Thereby, the surface bump 185 and the back surface bump 184 that are provided at the same position in plain view are short-circuited.

Connection with internal circuits (not shown in the drawings) is performed through internal wiring lines (not shown in the drawings) drawn from the pads P0 to P3 provided in the wiring layers L0 to L3.

Figure 26:
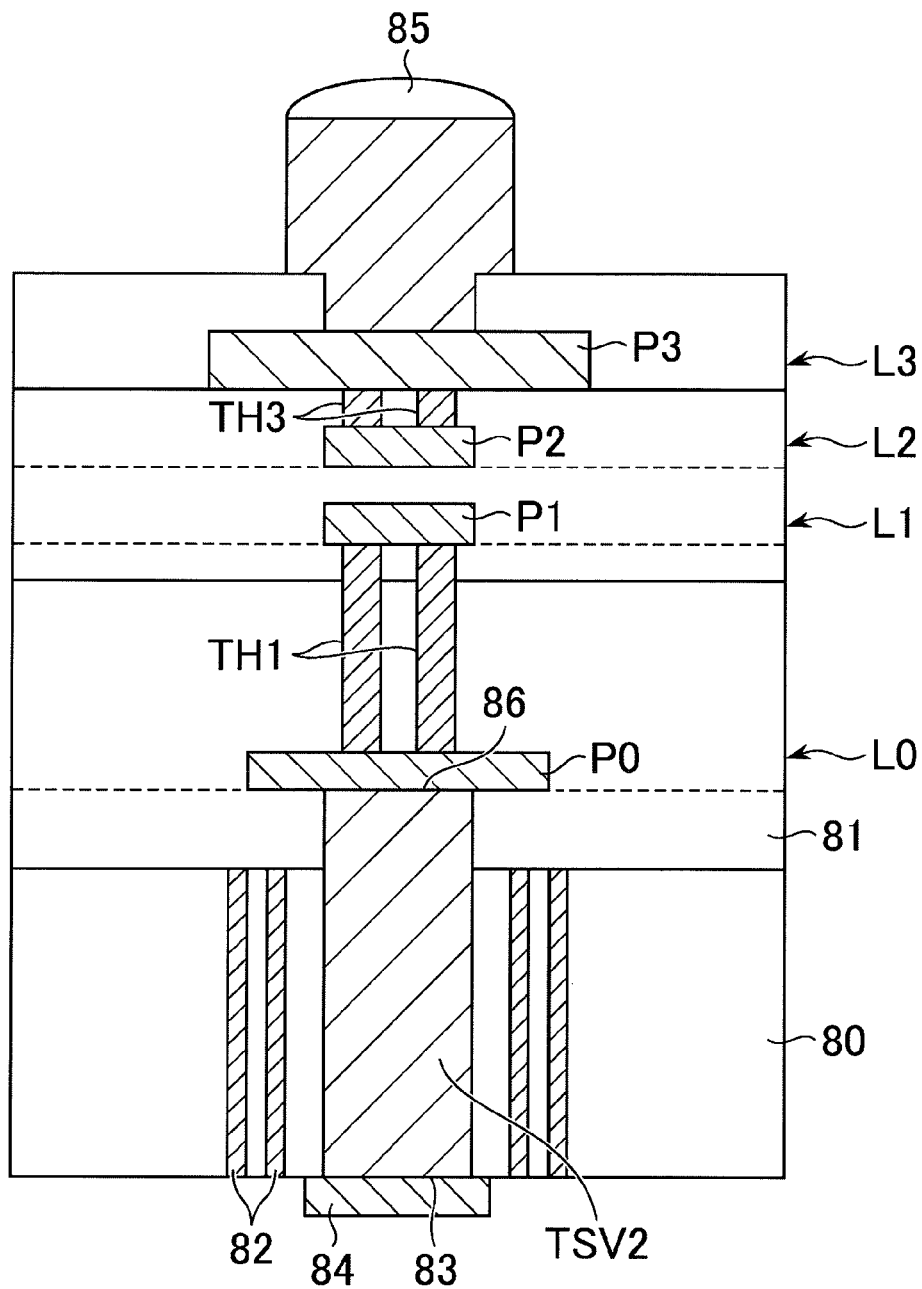
FIG. 26 is a cross-sectional view indicative of the structure of the through silicon via TSV2 of the type shown in FIG. 24B.

Turning to FIG. 26, the through silicon via TSV2 differs from the through silicon via TSV1 shown in FIG. 25 in the omission of the through-hole electrodes TH2 which directly connect the pad P1 and the pad P2 lying in the same planar position. The pad P1 is connected to, for example, the output node of an internal circuit 5 shown in FIG. 24B. The pad P2 is connected to, for example, the input node of the internal circuit 5 shown in FIG. 28B. The internal circuits 5 arranged in the core chips CC0 to CC7 are thus cascaded through the intervention of through silicon vias TSV2.

Figure 27:
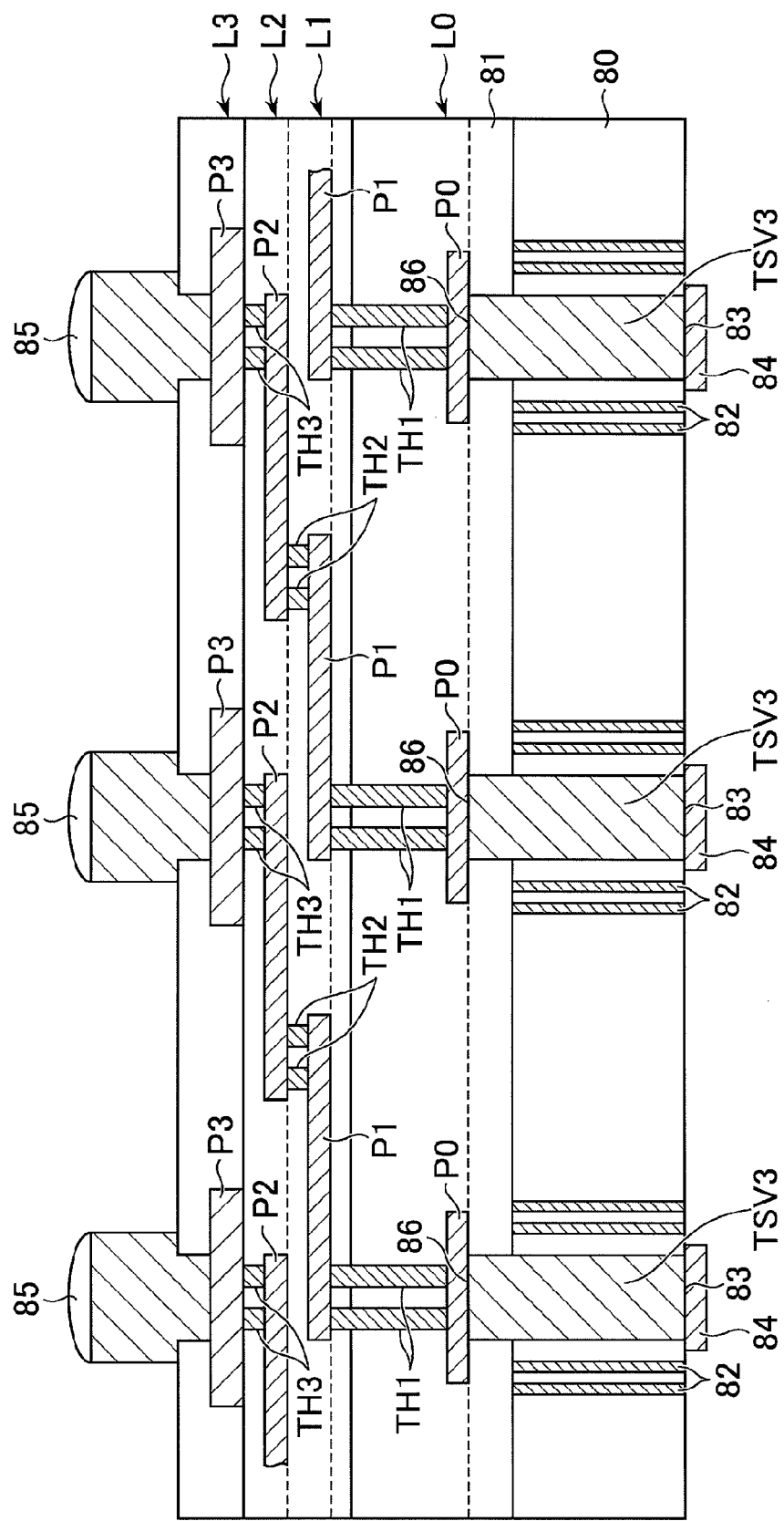
FIG. 27 is a cross-sectional view indicative of the structure of the through silicon vias TSV3 of the type shown in FIG. 24C.
Figure 28:
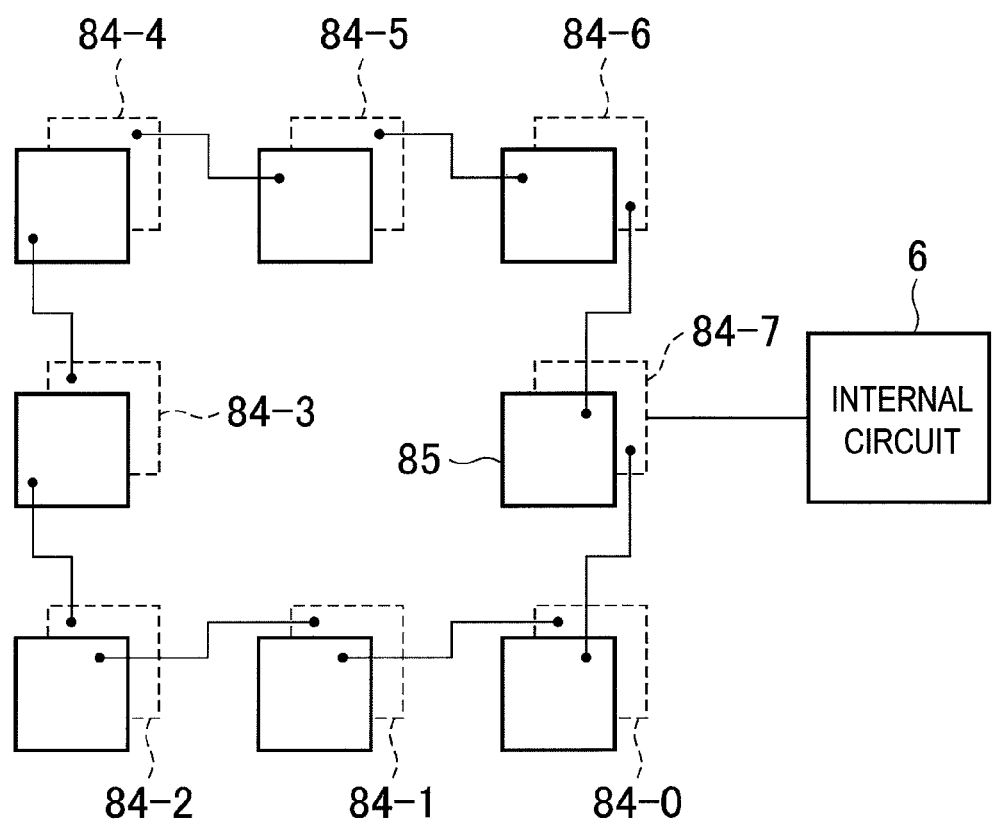
FIG. 28 is a schematic diagram explaining the cyclic connection of the through silicon vias TSV3.

Turning to FIG. 27, the through silicon vias TSV3 are configured not so that the pads P1 and P2 formed in the same planar positions are connected by through-hole electrodes TH2, but so that pads P1 and P2 formed in different planar positions are connected by through-hole electrodes TH2. While FIG. 27 shows only three through silicon vias TSV3, there are provided through silicon vias TSV3 as many as the number of core chips CC0 to CC7 (eight) per signal. The eight through silicon vias TSV3 are cyclically connected as shown in FIG. 28. FIG. 28 shows surface bumps 185 in solid lines and rear bumps 184 in broken lines. As shown in FIG. 28, the cyclic connection of the through silicon vias TSV3 makes it possible to supply individual data from the interface chip IF to the respective core chips CC0 to CC7 with the core chips CC0 to CC7 identical in circuit configuration. For example, if internal circuit 6 are connected to the positions of the rear bumps 184-7, signals supplied from the interface chip IF to the rear bumps 184-0 to 184-7 of the lowermost core chip CC7 are selectively supplied to the internal circuits 6 of the core chips CC0 to CC7, respectively.

Figure 29:
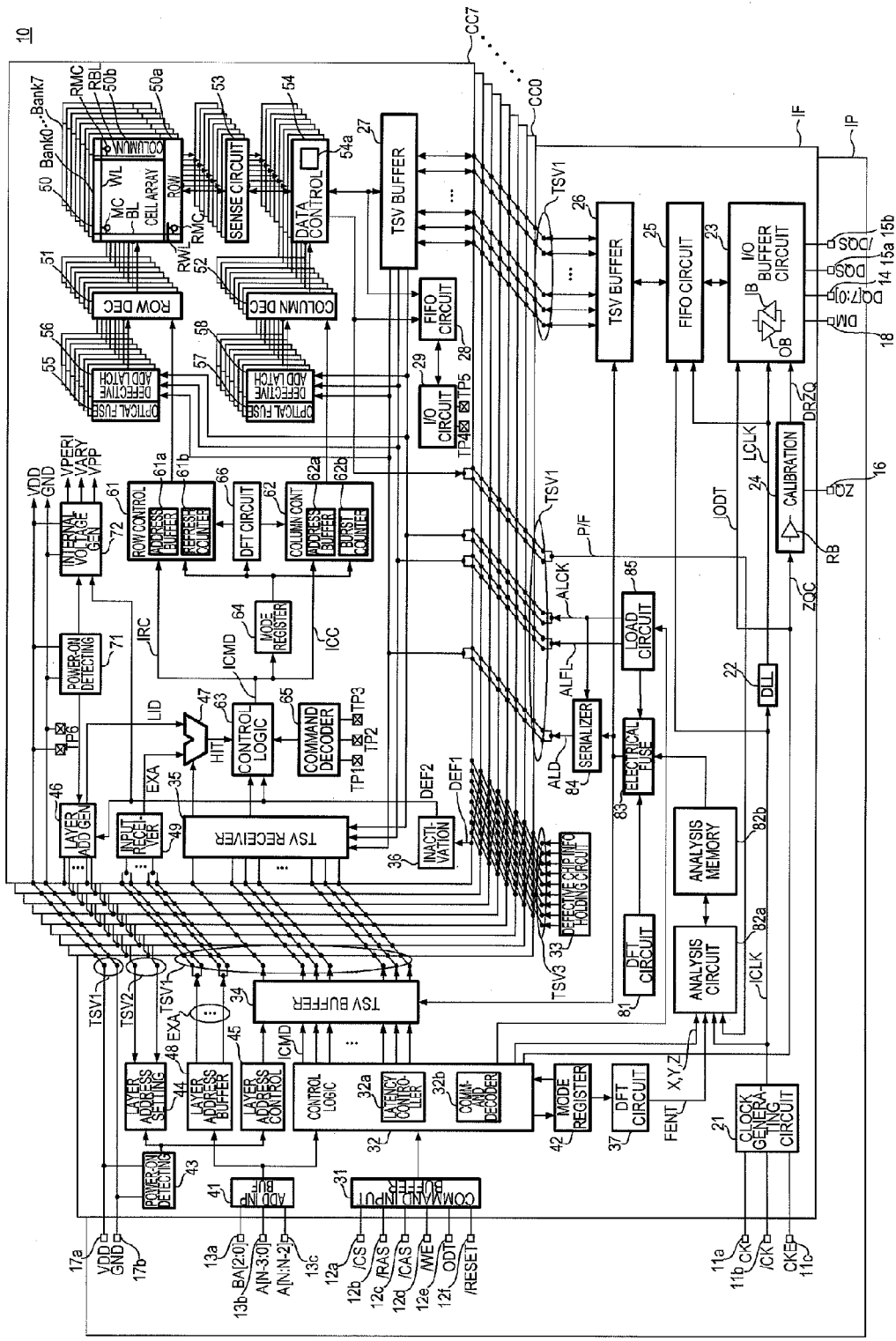
FIG. 29 is a block diagram indicative of the circuit configuration of the semiconductor device 10.

Turning to FIG. 29, the external terminals that are provided in the interposer IP include clock terminals 11a and 11b, an clock enable terminal 11c, command terminals 12a to 12f, an address terminal 13a to 13c, a data input/output terminal 14, data strobe terminals 15a and 15b, a calibration terminal 16, power supply terminals 17a and 17b, and a data mask terminal 18. All of the external terminals other than the power supply terminals 17a and 17b are connected to the interface chip IF and are not directly connected to the core chips CC0 to CC7.

First, a connection relationship between the external terminals and the interface chip IF and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor device 10 communicates with the external device. Accordingly, DLL function is not needed for the core chips CC0 to CC7 as the back end.

The command terminals 12a to 12f are supplied with a chip select signal /CS, a row-address strobe signal /RAS, a column address strobe signal /CAS, a write enable signal /WE, an on-die termination signal ODT, and a reset signal /RESET. These command signals are supplied to a command input buffer 31 that is provided in the interface chip IF. The command signals supplied to the command input buffer 31 are further supplied to a control logic 32. The control logic 32 includes a latency controller 32a and a command decoder 32b. The control logic 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through a TSV buffer 34 and the through silicon vias TSV1.

The address terminal 13a is a terminal to which a bank address BA0 to BA2 is supplied. The address terminal 13b is a terminal to which an address signal A0 to A(N−3) is supplied. The address terminal 13C is a terminal to which an address signal AN to A(N−2) is supplied. The supplied address signals A0 to AN (A15) and BA0 to BA2 are supplied to an address input buffer which is arranged in the interface chip IF. The output of the address input buffer 41 is supplied to the control logic 32 and a layer address buffer 48. The layer address buffer 48 functions to supply a layer address (layer information) EXA to the core chips CC0 to CC7 in common through the through silicon vias TSV1. When in mode register setting, the address signal A0 to AN (A15) supplied to the control logic 32 is supplied to a mode register 42 which is arranged in the interface chip IF. The bank address BA0 to BA2 is decoded by the control logic 32, and the resulting bank select signal is supplied to a FIFO circuit 25. The reason is that bank selection on write data is performed inside the interface chip IF.

The data input/output terminal 14 is used to input/output read data or write data DQ0 to DQ7. The data strobe terminals 15a and 15b are terminals that are used to input/output strobe signals DQS and /DQS. The data mask terminal 18 is a terminal to which a data mask signal DM is supplied. The data input/output terminal 14, the data strobe terminals 15a and 15b, and the data mask terminal 18 are connected to the input/output buffer circuit 23 provided in the interface chip IF. The data mask signal DM supplied through the data mask terminal 18 is also supplied to an analysis circuit 82a. The input/output buffer circuit 23 includes an input buffer IB and an output buffer OB, and inputs/outputs the read data or the write data DQ0 to DQ7 and the strobe signals DQS and /DQS in synchronization with the input/output clock signal LCLK supplied from the DLL circuit 22. If an internal on-die termination signal IODT is supplied from the control logic 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated.

The calibration circuit 24 includes a replica buffer RB that has the same circuit configuration as the output buffer OB. If the calibration signal ZQC is supplied from the control logic 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a FIFO circuit 25. The FIFO circuit 25 includes a FIFO circuit unit (not shown in the drawings) that realizes a FIFO function which operates by latency control realizing the well-known DDR function and a multiplexer (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the FIFO circuit 25 and the core chips CC0 to CC7 are connected in parallel. Parallel write data output from the FIFO circuit 25 is supplied to the core chips CC0 to CC7 through a TSV buffer 26. Parallel read data output from the core chips CC0 to CC7 is supplied to the FIFO circuit 25 through the TSV buffer 26. In this embodiment, each of the core chips CC0 to CC7 is the back end unit of the DDR3-type SDRAM and a prefetch number is 8 bits. The FIFO circuit 25 and each banks of the core chips CC0 to CC7 are connected respectively, and the number of banks that are included in each of the core chips CC0 to CC7 is 8. Accordingly, connection of the FIFO circuit 25 and the core chips CC0 to CC7 becomes 64 bits (8 bits×8 banks) for each DQ.

Parallel data, not converted into serial data, is basically transferred between the FIFO circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the FIFO circuit 25, a function for enabling a test in an interface chip unit is added. The interface chip does not have the back end unit. For this reason, the interface chip cannot be operated as a single chip in principle. However, if the interface chip IF never operates as the single chip, an operation test of the interface chip IF in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the FIFO circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV1. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor device 10 includes 8 data input/output terminals 14. Thereby, a maximum I/O number can be set to 8 bits (DQ0 to DQ7). However, the I/O number is not fixed to 8 bits and, for example, may be set to 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the Through silicon vias TSV1.

The interface chip IF is also provided with a layer address setting circuit 44. The layer address setting circuit 44 is connected to the core chips CC0 to CC7 through the through silicon vias TSV2. The layer address setting circuit 44 is cascade-connected to the layer address generating circuit 46 of the core chips CC0 to CC7 using the through silicon via TSV2 of the type shown in FIG. 24B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV3. The defective chip information holding circuit 33 is connected to the core chips CC0 to CC7 while being shifted, using the through silicon via TSV3 of the type shown in FIG. 24C.

The interface chip IF further includes an electrical fuse circuit 83. The electrical fuse circuit 83 is a circuit that stores information that is needed to replace defects found after assembly with redundancy circuits. The information to be stored in the electrical fuse circuit 83 includes at least information on defects of the through silicon vias TSV and information on defects of the memory cells in the core chips CC0 to CC7. The TSV buffers 26 and 34 can replace the defective through silicon vias TSV with other through silicon vias TSV for repair. Since such repair is not directly related to the gist of the present invention, detailed description thereof will thus be omitted. The defective through silicon vias TSV are detected by using a DFT circuit 81, and programmed into the electrical fuse circuit 83.

The electrical fuse circuit 83 stores row addresses that represent word lines to be replaced or column addresses that represent bit lines to be replaced. Redundant word lines or redundant bit lines included in the corresponding core chips CC0 to CC7 are used as replacing redundant word lines or redundant bit lines.

The information stored in the electrical fuse circuit 83 includes information on defective addresses of memory cells, which is serially converted into serial data ALD by a serializer 84 before transferred to the core chips CC0 to CC7 via through silicon vias TSV. As shown in FIG. 29, defective addresses are transferred by using a plurality of through silicon vias TSV in parallel so as to avoid transfer defect due to defects of the through silicon vias TSV themselves. Other signals that use irreplaceable through silicon vias TSV, such as the layer address EXA and a determination signal P/F to be described later, also use a plurality of through silicon vias TSV in parallel.

The electrical fuse circuit 83 is programmed by the analysis circuit 82a and an analysis memory 82b. The analysis circuit 82a, the analysis memory 82b and the fuse select circuit 82C correspond to the analysis circuit 143, the analysis memory 144 and the fuse select circuit 146 shown in FIG. 1, respectively. The analysis circuit 82a is activated by a signal FENT which is the output of a DFT circuit 37. The analysis circuit 82a analyzes the pattern of occurrence of defective memory cells based on addresses supplied from the control logic 32 and the determination signal P/F supplied from the core chips CC0 to CC7 in secondary repair (the mode select signal PT=low). The analysis is intended to identify a pattern that allows most efficient replacement when replacing defective memory cells in units of word lines or bit lines. This means that the addresses stored in the electrical fuse circuit 83 are not in units of memory cells but in units of word lines or bit lines. The replacement in units of word lines or bit lines is performed during manufacturing when the core chips CC0 to CC7 are in a wafer state. The electrical fuse circuit 83 uses redundant word lines or bit lines that remain unused by the replacement in the wafer state. The analysis circuit 82a is thus a fail memory repair analyzer. In tertiary repair (the mode select signal PT=high), the analysis circuit 82a outputs to the analysis memory 82b the address that is supplied from the control logic 32 in the period when the data mask signal DM is at a high level. The mode select signal PT is output from the DFT circuit 37.

The information programmed in the electrical fuse circuit 83 is read by using a load circuit 85. The load circuit 85 reads the information programmed in the electrical fuse circuit 83 and generates timing signals ALFL and ALCK, thereby functioning to synchronize the serializer 84 with the core chips CC0 to CC7.

The above description is the outline of the connection relationship between the external terminals and the interface chip IF and the circuit configuration of the interface chip IF. Next, the circuit configuration of the core chips CC0 to CC7 will be described.

As shown in FIG. 29, memory cell arrays 50 that are included in the core chips CC0 to CC7 having the back end function are divided into eight banks. A bank is a unit that can individually receive a command. That is, the individual banks can be independently and nonexclusively controlled. From the outside of the semiconductor device 10 (an outside controller which controls the semiconductor device 10), each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 29, only one word line WL, one bit line BL, and one memory cell MC are shown).

The memory cell array 50 includes a row redundancy array 50a and a column redundancy array 50b. The row redundancy array 50a includes redundant cells RMC that are connected to a plurality of redundant word lines RWL. The column redundancy array 50b includes redundant cells RMC that are connected to a plurality of redundant bit lines RBL. The row redundancy array 50a is accessed as an alternative if an access-requested memory cell belongs to a defective word line. The column redundancy array 50b is accessed as an alternative if an access-requested memory cell belongs to a defective bit line. Such alternative accesses are made when an access is requested to the addresses that are stored in the foregoing electrical fuse circuit 83 or optical fuse circuits 55 and 57 to be described later.

The word lines WL are selected by a row decoder 51. The bit lines BL are connected to corresponding sense amplifiers SA in a sense circuit 53. The sense amplifiers SA are selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit through the input buffer B1 through a TSV receiver 35 and a control logic circuit 63. The row control circuit 61 also includes a refresh counter 61b. When an internal refresh command is issued by the control logic circuit 63, a row address that is indicated by the refresh counter 61b is supplied to the row decoder 51.

The row decoder 51 includes a not-shown address comparison circuit, which compares the row address supplied from the row control circuit 61 with addresses retained in a defective address latch circuit 56. The defective address latch circuit 56 is a circuit that latches defective row addresses read from the optical fuse circuit 55. The defective address latch circuit 56 includes a circuit that latches the defective row addresses read from the optical fuse circuit 55, as well as a circuit that latches defective row addresses read from the electrical fuse circuit 83. If the comparison by the row decoder 51 shows a match of the addresses, a redundant word line included in the row redundancy array 50a is accessed instead of the word line that is designated by the row address. If the addresses do not match, the word line designated by the row address is simply accessed.

The optical fuse circuit 55 includes a plurality of fuse sets. The fuse sets correspond to the respective plurality of redundant word lines in the row redundancy array 50a. That is, if a fuse set is programmed with a row address and an access to that row address is requested, then the redundant word line associated with that fuse set is accessed. Some of the fuse sets included in the optical fuse circuit 55 correspond to those included in the electrical fuse circuit 83 on a one-to-one basis. Consequently, redundant word lines that are specified as replacing word lines by some of the fuse sets included in the optical fuse circuit 55 can also be specified as replacing word lines by fuse sets included in the electrical fuse circuit 83. However, the optical fuse circuit 55 and the electrical fuse circuit 83 will not conflict with each other. A redundant word line is used as a replacing word line by either one of a fuse set included in the optical fuse circuit 55 and a fuse set included in the electrical fuse circuit 83.

The column decoder 52 is controlled by a column address supplied from a column control circuit 62. The column control circuit 62 includes an address buffer 62a that receives a column address supplied from the interface chip IF through the through silicon vias TSV. The column address buffered in the address buffer 62a is supplied to the column decoder 52. The column control circuit 62 also includes a burst counter 62b that counts the burst length.

The column decoder 52 includes a not-shown address comparison circuit, which compares the column address supplied from the column control circuit 62 with addresses retained in a defective address latch circuit 58. The defective address latch circuit 58 is a circuit that latches defective column addresses read from the optical fuse circuit 57. The defective address latch circuit 58 includes a circuit that latches the defective column addresses read from the optical fuse circuit 57, as well as a circuit that latches defective column addresses read from the electrical fuse circuit 83. If the comparison by a column decoder 52 shows a match of the addresses, a redundant bit line included in the column redundancy array 50b is accessed instead of the bit line that is designated by the column address. If the addresses do not match, the bit line designated by the column address is simply accessed. The bit lines are accessed by selecting the corresponding sense amplifiers SA in the sense circuit 53.

The optical fuse circuit 57 includes a plurality of fuse sets. The fuse sets correspond to the respective plurality of redundant bit lines in the column redundancy array 50b. That is, if a fuse set is programmed with a column address and an access to that column address is requested, then the redundant bit line associated with that fuse set is accessed. Some of the fuse sets included in the optical fuse circuit 57 correspond to those included in the electrical fuse circuit 83 on a one-to-one basis. Consequently, redundant bit lines that are specified as replacing bit lines by some of the fuse sets included in the optical fuse circuit 57 can also be specified as replacing bit lines by fuse sets included in the electrical fuse circuit 83. Note that the optical fuse circuit 57 and the electrical fuse circuit 83 will not conflict with each other. A redundant bit line is used as a replacing bit line by either one of a fuse set included in the optical fuse circuit 57 and a fuse set included in the electrical fuse circuit 83.

The sense amplifier SA selected by the column decoder 52 is connected to the data control circuit 54 through some amplifiers (sub-amplifiers or data amplifiers or the like)

which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through a TSV buffer 27 and the through silicon via TSV. The data control circuit 54 includes a test circuit 54a. The test circuit 54a makes a pass-fail determination in a test operation, and outputs the result of the pass-fail determination as a determination signal P/F.

The control logic circuit 63 receives an internal command ICMD supplied from the interface chip IF through the through silicon via TSV1 and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing the layer address EXA which is a part of the address signal supplied from the interface chip IF through the through silicon via TSV1 and a layer address LID (chip identification information) set to the layer address generating circuit 46. The layer address EXA supplied from the interface chip IF is input to the core chips CC0 to CC7 through respective input receivers 49.

In the layer address generating circuit 46, unique layer addresses are set to the core chips CC0 to CC7, respectively, at initialization. A method of setting the layer addresses is as follows. First, after the semiconductor device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV2 of the type shown in FIG. 24B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit of the core chip CC7 of the lowermost layer. Thereby, the unique layer addresses are set to the core chips CC0 to CC7, respectively.

The layer address generating circuit 46 is supplied with a defective chip signal DEF2 from an inactivation circuit 36. The inactivation circuit 36 is a circuit that is activated when a defective chip signal DEF1 is supplied from the defective chip information holding circuit 33 of the interface chip IF through the through silicon vias TSV3. As the defective chip signal DEF1 is supplied to the individual core chips CC0 to CC7 using the through silicon via TSV3 of the type shown in FIG. 24C, the defective chip signals DEF1 can be supplied to the core chips CC0 to CC7, individually. The defective chip signal DEF1 is activated when the corresponding core chip is a defective chip. When the defective chip signal DEF1 is activated, the layer address generating circuit 46 transmits, to the core chip of the lower layer, a non-incremented layer address, not an incremented layer address. The defective chip signal DEF2 is also supplied to the control logic circuit 63. When the defective chip signal DEF2 is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 72. The internal voltage generating circuit 72 is provided with power supply potentials VDD and VSS. The internal voltage generating circuit 72 receives these power supply potentials and generates various internal voltages. As the internal voltages that are generated by the internal voltage generating circuit 72, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 29 and a test FIFO circuit 28 are also provided in each of the core chips CC0 to CC7. At testing, a DFT circuit 66 is used which is included in each of the core chips CC0 to CC7.

This is the entire configuration of the semiconductor device 10. Because in the semiconductor device 10, the 8 core chips of 1 Gb are laminated, the semiconductor device 10 has a memory capacity of 8 Gb in total. Because the chip select signal /CS is input to one terminal (chip select terminal), the semiconductor memory device is recognized as a single DRAM having the memory capacity of 8 Gb, in view of the controller. However, a memory capacity of the core chip is not restricted in particular.

Next, a method of replacing defective cells included in the core chips CC0 to CC7 will be described.

The replacement of defective cells is performed thrice in the process of manufacturing the semiconductor device 10. The first replacement is performed in a wafer process, and the second and third are performed in an assembly process. The replacement in the wafer process is performed by using the optical fuses 55 and 57 in order to repair defects that occur in the wafer process. The replacement in the assembly process is performed by using the electrical fuse circuit 83 in order to repair defects that occur in the assembly process. In other words, the replacement in the wafer process stores defective addresses into the core chips CC0 to CC7 themselves. The replacement in the assembly process stores defective addresses into the interface chip IF.

Figure 30:
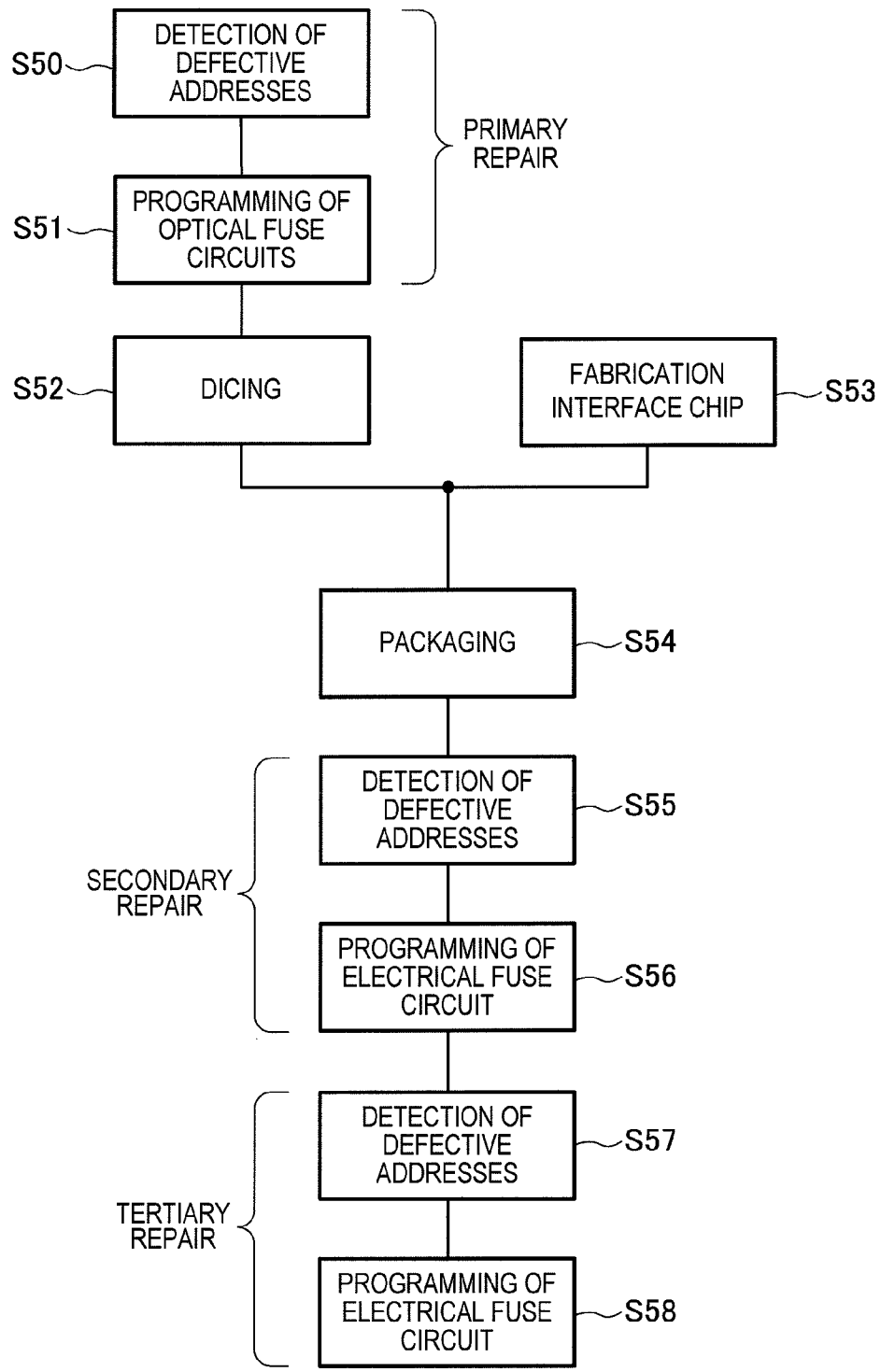
FIG. 30 is a flowchart for explaining the method of replacing defective cells included in the core chips CC0 to CC7.

Turning to FIG. 30, at first, the core chips CC0 to CC7 in a wafer state are subjected to an operation test to detect defective addresses (step S50). The defective addresses detected are analyzed in a tester outside the semiconductor device 10, whereby replacement data is determined. The replacement data refers to information that identifies the word lines or bit lines to be replaced and the word lines or bit lines to replace. The word lines or bit lines to be replaced are identified by row addresses or column addresses. The word lines or bit lines to replace are identified by the addresses of fuse sets to be used in the optical fuse circuits 55 and 57.

Next, the optical fuse circuits 55 and 57 are programmed based on the replacement data (step S51). Specifically, laser beam irradiation is performed by using a laser trimmer, whereby predetermined fuse sets included in the optical fuse circuits 55 and 57 are programmed with row addresses that represent the word lines to be replaced or column addresses that represent the bit lines to be replaced. Steps S50 and S51 correspond to primary repair. The completion of the replacement operation in the wafer process is followed by wafer dicing (step S52). Meanwhile, the electrical fuse circuit 83 in the interface chip IF is fabricated in a step separate from the setting steps of the core chips CC0 to CC7 (step S53).

Next, the separated pieces of the core chips CC0 to CC7 and the interface chip IF are stacked on each other and packaged as shown in FIG. 23 (step S54). After the packaging, the second operation test is performed to detect defective addresses (step S55). The first operation test performed in the wafer state and the replacement of defective cells based on the operation test ensure that all the addresses of the core chips CC0 to CC7 to be stacked are normally accessible. However, new defective addresses may occur due to load during packaging and the load of a burn-in test. The second operation test is performed to detect and repair such new defective addresses that occur after the end of the first operation test. The second operation test is performed by using the analysis circuit 82a and the analysis memory 82b.

Next, the electrical fuse circuit 83 is programmed based on the defective addresses detected (step S56). Specifically, an electrical fuse controller (to be described later) included in the electrical fuse circuit 83 is used to apply a high voltage, whereby the fuse sets included in the electrical fuse circuit 83 are programmed with row addresses that represent the word lines to be replaced or column addresses that represent the bit lines to be replaced. Steps S55 and S56 correspond to secondary repair.

After the completion of the secondary repair, a third operation test is performed to detect defective addresses (step S57). The secondary-repaired semiconductor devices 10 are already relieved of the defective addresses resulting from the diffusion process and the defective addresses resulting from the assembly process. Since the operation tests in the primary repair and the secondary repair are not performed at the maximum design speed, there is still a possibility of defective addresses that occur only under fast access. The third operation test is performed to detect and relieve such undiscovered defective addresses. The third operation test is performed by using an external tester 200.

Next, the electrical fuse circuit 83 is programmed based on defective addresses detected (step S58). This step is the same as in the secondary repair. The electrical fuse controller is used to apply a high voltage, whereby the fuse sets included in the electrical fuse circuit 83 are programmed with row addresses that represent the word lines to replace or column addresses that represent the bit lines to replace. Steps S57 and S58 correspond to tertiary repair. This completes the series of replacement operations, and the semiconductor device 10 is shipped as a confirming product.

Figure 31:
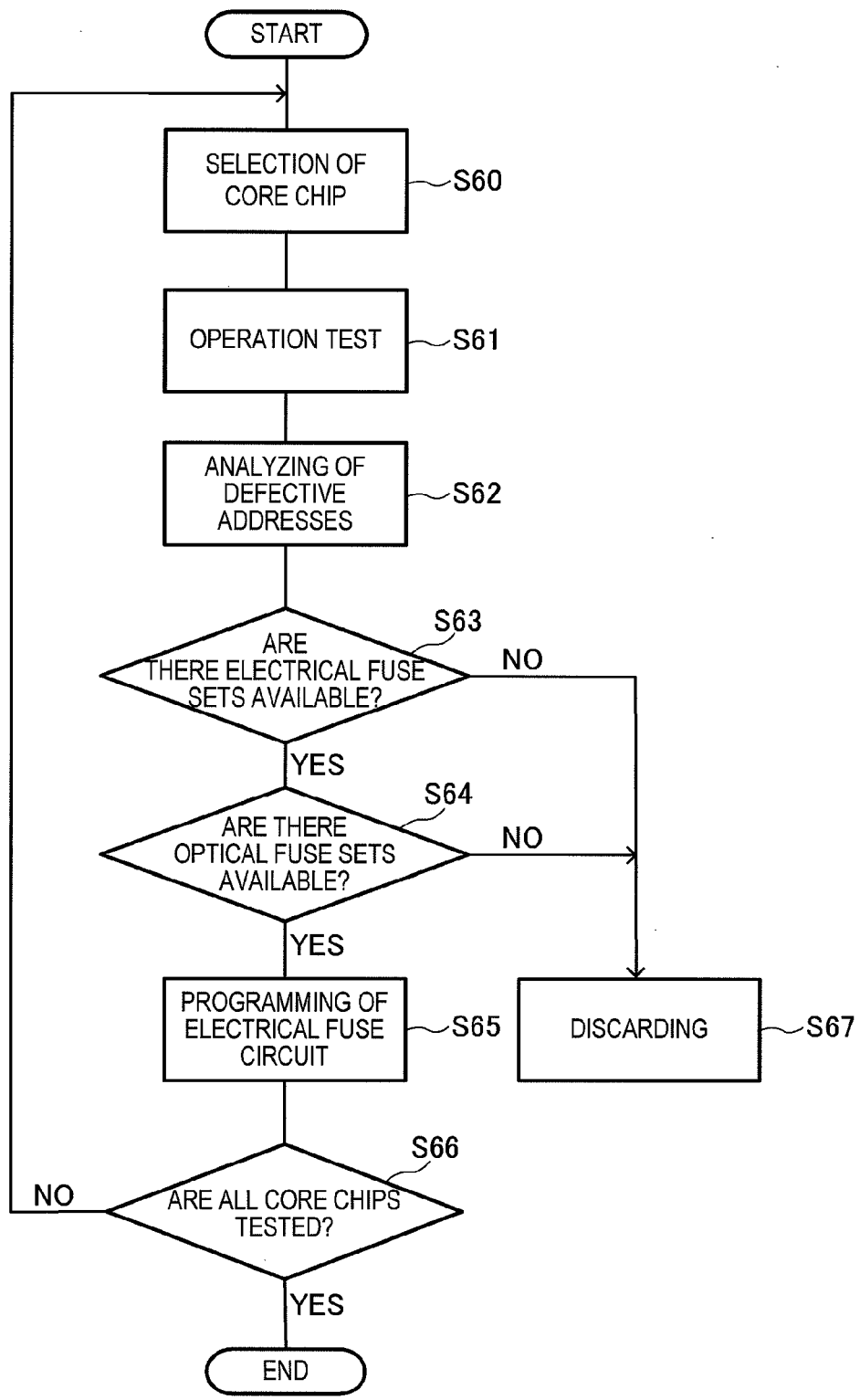
FIG. 31 is a flowchart for explaining operations of steps S55 and S56 (secondary repair) shown in FIG. 30 in more detail.

Turning to FIG. 31, at first, one of the core chips CC0 to CC7 is selected (step S60), and an operation test is performed thereon (step S61). In the operation test, the data control circuit 54 (test circuit 54a) in that core chip CC0 to CC7 makes pass-fail determinations. The resulting determination signal P/F is transferred to the analysis circuit 82a in the interface chip IF through the through silicon vias TSV1, and analyzed by the analysis circuit 82a (step S62). The analysis circuit 82a analyzes the defective addresses to generate replacement data so that all the defective cells found can be replaced with a smaller number of redundant word lines or redundant bit lines. A concrete method of analysis is as explained in detail in the first and second embodiments. The replacement data includes information on replacing word lines or bit lines, which are identified in terms of the addresses of fuse sets to be used in the electrical fuse circuit 83.

If the analysis shows that the replacement is not possible even by using all the fuse sets (step S63: NO), the semiconductor device 10 is handled as a defective product (step S67). Even if the replacement is possible by using fuse sets in the electrical fuse circuit 83, the semiconductor device 10 may also be handled as a defective product (step S67) when the fuse sets to be used in the electrical fuse circuit 83 are already assigned to the used fuse sets in the optical fuse circuits 55 and 57 (step S64: NO). If neither is the case, predetermined fuse sets in the electrical fuse circuit 83 are programmed with row addresses that represent the word lines to be replaced or column addresses that represent the bit lines to be replaced (step S65). As a result, new defective addresses occurring in the core chip are repaired.

Such an operation is performed on all the core chips CC0 to CC7 in succession. If the foregoing operation is completed on all the core chips CC0 to CC7 (step S66: YES), the secondary repair is completed.

Figure 32:
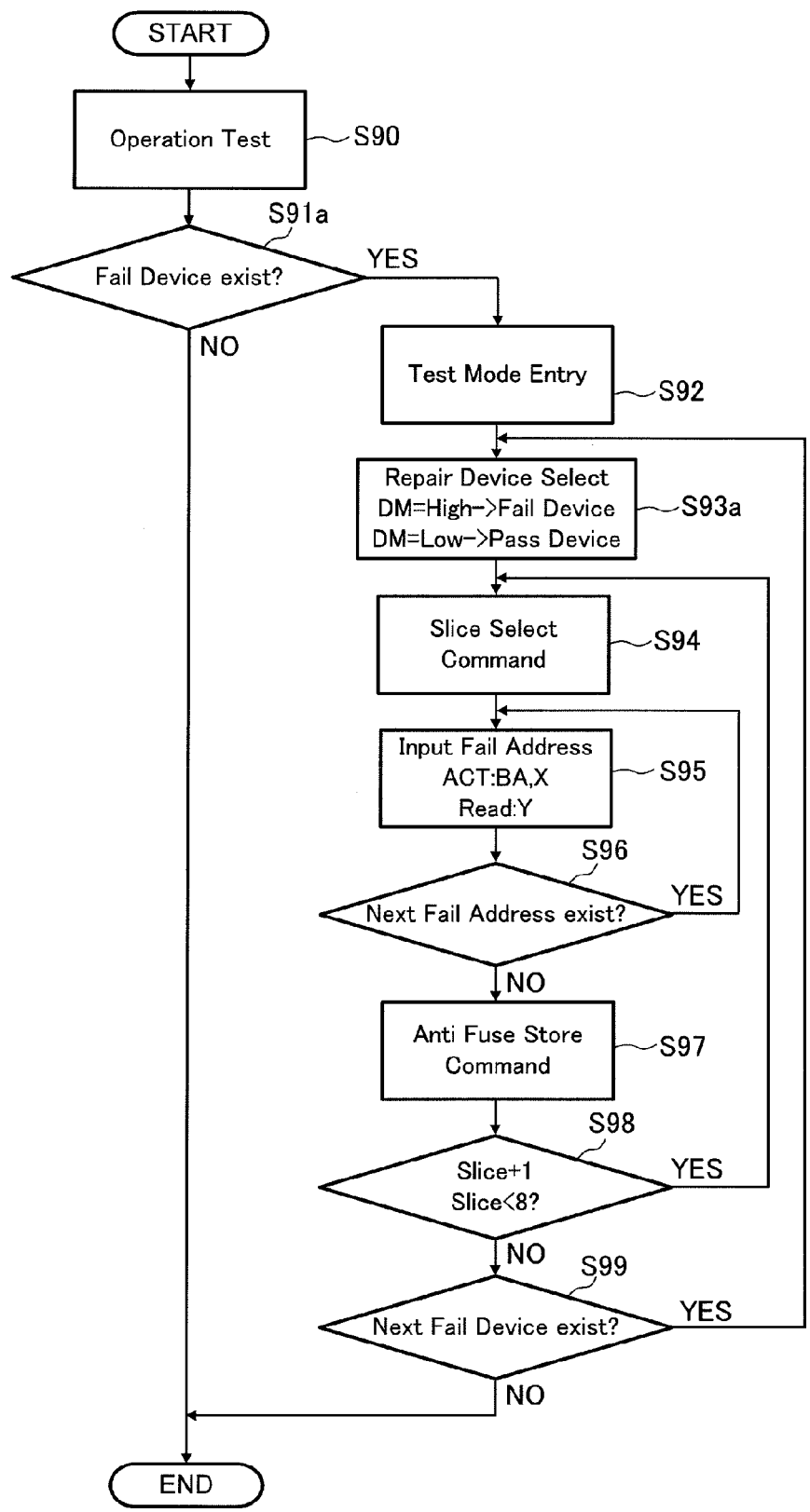
FIG. 32 is a flowchart for explaining operations of steps S57 and S58 (tertiary repair) shown in FIG. 30 in more detail.

Turning to FIG. 32, initially, a plurality of semiconductor devices 10 to be subjected to tertiary repair and the external tester 200 are connected as shown in FIG. 21, and an operation test is performed in parallel (step S90). The operation test is performed at the maximum design speed. The external tester 200 evaluates whether there is any defective semiconductor device 10 (step S91a).

If there is no defective semiconductor device 10 (step S91a: NO), the processing ends. On the other hand, if there is any defective semiconductor device (step S91a: YES), the external tester 200 issues a test command so that all the semiconductor devices 10 enter a test mode for tertiary repair (step S92).

Next, the external tester 200 changes the data mask signal DM of one of defective semiconductor devices 10 to a high level (step S93a). The external tester 200 then selects one of the core chips CC0 to CC7 with a layer address (step S94), and outputs a detected defective address (step S95). The defective address is input to all the semiconductor devices 10, but is valid only to the semiconductor device 10 in which the data mask signal DM is at a high level. The defective address is ignored by the other semiconductor devices 10 where the data mask signal DM is at a low level. The defective address is input to all the core chips CC0 to CC7 in the semiconductor device 10 where the data mask signal DM is at a high level. Again, the defective address is valid only to the one of the core chips CC0 to CC7 that is selected with the layer address, and ignored by the other core chips.

Such processing is performed on all defective addresses found in that core chip of the semiconductor device 10 (step S96: NO) and then issuance of a write command for electrical fuses (step S97). Consequently, the defective addresses that are stored into the analysis memory 82b through the analysis circuit 82a are written into the electrical fuse circuit 83.

The foregoing processing is performed on each of all the core chips that are found to be defective. When the processing on all the core chips is completed (step S98: NO), the tertiary repair on the semiconductor chip 10 is completed. The foregoing processing is performed on each of all the semiconductor devices 10 that are found to be defective. When the processing on all the semiconductor devices 10 is completed (step S99: NO), the series of tertiary repair is completed.

This completes the series of replacement operations, and the semiconductor devices 10 are shipped as confirming products.

Figure 33:
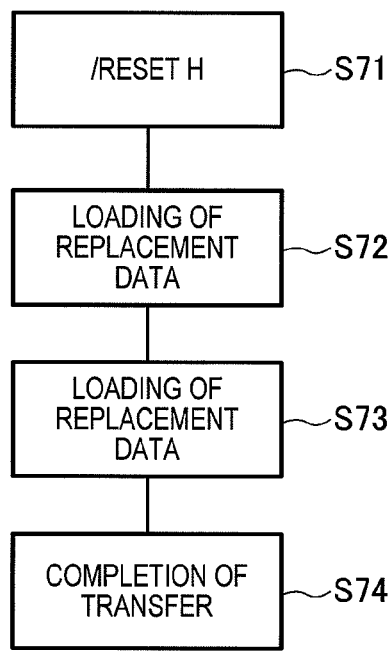
FIG. 33 is a flowchart for explaining an operation of loading replacement data programmed in an electrical fuse circuit 83.

Turning to FIG. 33, the operation of loading the replacement data is performed in response to when the reset signal /RESET supplied to the command terminal 12f changes to a high level (step S71). When the reset signal /RESET changes to the high level, the load circuit 85 included in the interface chip IF is activated to read the replacement data programmed in the electrical fuse circuit 83 (step S72). The replacement data read from the electrical fuse circuit is serial-converted by the serializer 84, and transferred to each of the core chips CC0 to CC7 through the through silicon vias TSV1 (step S73). When the serializer 84 transfers the replacement data, the layer address buffer 48 simultaneously transfers a layer address EXA. The replacement data, which is supplied in common to the core chips CC0 to CC7, is thereby enabled only for the core chip that is designated by the layer address EXA. The replacement data is latched into the defective address latch circuits 56 and 58 included in that core chip. When all the pieces of replacement data are transferred to the respective corresponding core chips CC0 to CC7, the series of transfer operations are completed (step S74).

Figure 34:
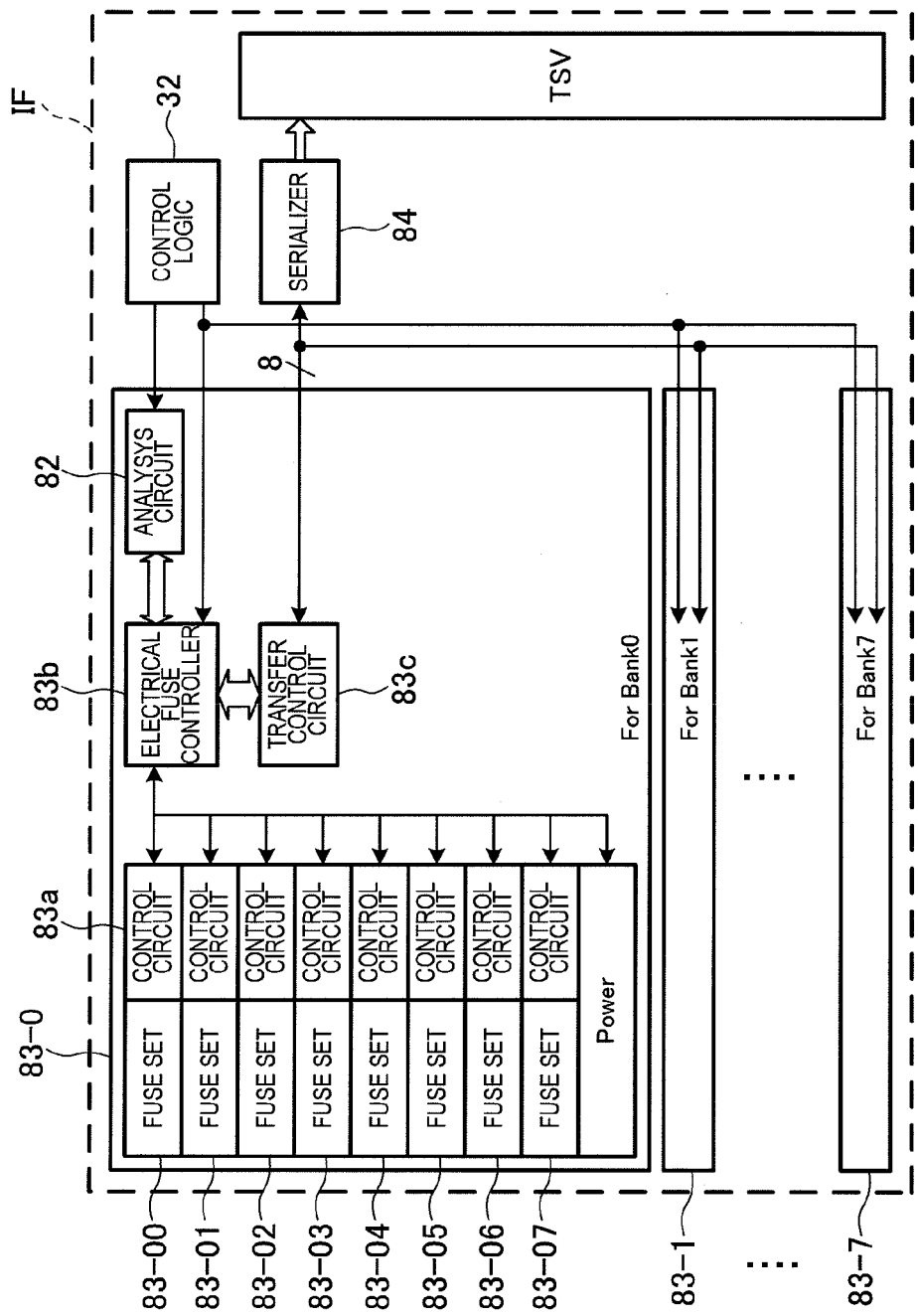
FIG. 34 is a block diagram indicative of a configuration of the electrical fuse circuit 83 in more detail.

Turning to FIG. 34, the electrical fuse circuit is provided for each bank. Since the present embodiment has an 8-bank configuration, the electrical fuse circuit 83 is divided into eight electrical fuse circuits 83-0 to 83-7, which correspond to bank 0 to bank 7, respectively. The electrical fuse circuits 83-0 to 83-7 have the same circuit configuration. FIG. 34 representatively shows only the circuit configuration of the electrical fuse circuit 83-0.

The electrical fuse circuit 83-0 includes a plurality of fuse sets 83-00 to 83-07 which are allocated to the core chips CC0 to CC7, respectively. The fuse sets 83-00 to 83-07 each include a plurality of fuse sets intended for row addresses and column addresses. The fuse sets are provided with respective corresponding control circuits 83a, which read and write the fuse sets under the control of an electrical fuse controller 83b. Data to be written to the fuse sets and data read from the fuse sets are transmitted and received through a transfer control circuit 83c.

Each fuse set includes a plurality of electrical fuses. Electrical fuses are electrically-writable memory elements, preferably a nonvolatile and irreversible one-time ROM. For a one-time ROM, it is preferred to use antifuse elements in which data is stored in terms of the presence or absence of a dielectric breakdown (breakdown of an insulating film) due to application of a high voltage.

The data read through the transfer control circuit 83c is serial-converted by the serializer 84 before transferred to the core chips CC0 to CC7 through the through silicon vias TSV. The data to be written to the electrical fuse circuit 83 is supplied from the control logic 32 and the analysis memory 82b, and programmed into predetermined fuse sets under the control of the electrical fuse controller 83b. The electrical fuse controller 83b thus functions as a programming circuit that programs the electrical fuse sets.

Figure 35:
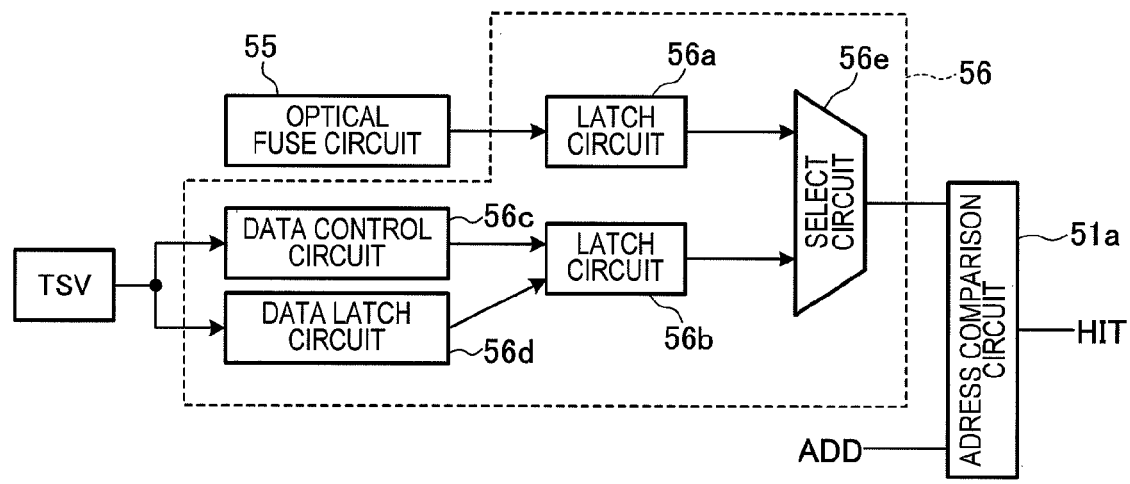
FIG. 35 is a block diagram indicative of a configuration of a defective address latch circuit 56 in more detail.

Turning to FIG. 35, the defective address latch circuit 56 includes a latch circuit 56a that latches replacement data read from an optical fuse circuit 55, and a latch circuit 56b that latches replacement data read from the electrical fuse circuit 83. A data control circuit 56c and a data latch circuit 56d are arranged in the stage prior to the latch circuit 56b. Under the control of the circuits 56c and 56d, the replacement data transferred from the interface chip IF through the through silicon vias TSV is latched into the latch circuit 56b.

The output of the latch circuit 56a and the output of the latch circuit 56b are supplied to a select circuit 56e. The select circuit 56e is a circuit that selects either one of the outputs of the latch circuit 56a and the latch circuit 56b. The replacement data selected is supplied to a row decoder 51. The select circuit 56e makes the selection based on flag information to be described later. The row decoder 51 includes an address comparison circuit 51a, which compares the replacement data selected by the select circuit 56e with an access-requested row address. If the two match, a redundant word line included in a row redundancy array 50a is accessed instead of the word line that is designated by the row address. If the addresses do not match, the word line designated by the row address is simply accessed.

The defective address latch circuit 58 on the column side has the same circuit configuration as that of the defective address latch circuit 56 described above. Redundant description will thus be omitted.

Figure 36:
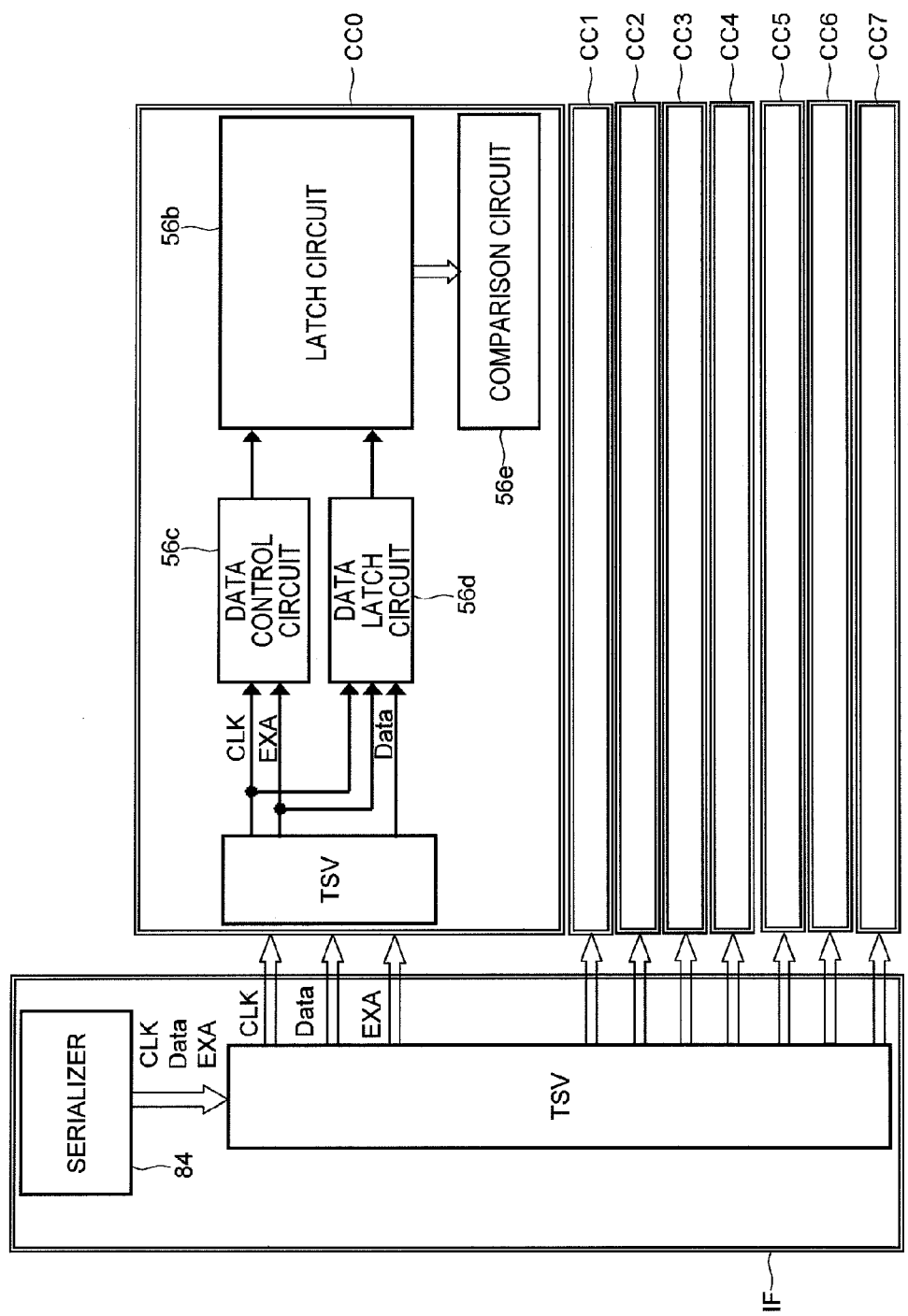
FIG. 36 is another block diagram indicative of the configuration of the defective address latch circuit 56 in more detail.

As mentioned above, the replacement data transferred from the interface chip IF is supplied in common to the core chips CC0 to CC7. The core chips CC0 to CC7 therefore need the layer address EXA in order to determine whether or not to accept the transferred replacement data. For that purpose, as shown in FIG. 36, the replacement data and the layer address EXA are simultaneously transferred to the core chips CC0 to CC7. The replacement data supplied in common to the core chips CC0 to CC7 is thereby enabled only for the core chip that is designated by the layer address EXA. More specifically, the data control circuit 56c and the data latch circuit 56d are activated to perform the processing of writing the transferred replacement data into the latch circuit 56b only when the layer address EXA matches the layer address LID unique to each core chip CC0 to CC7. The series of transfer operations are performed in synchronization with the internal clock signal ICLK which is generated in the interface chip IF.

Figure 37:
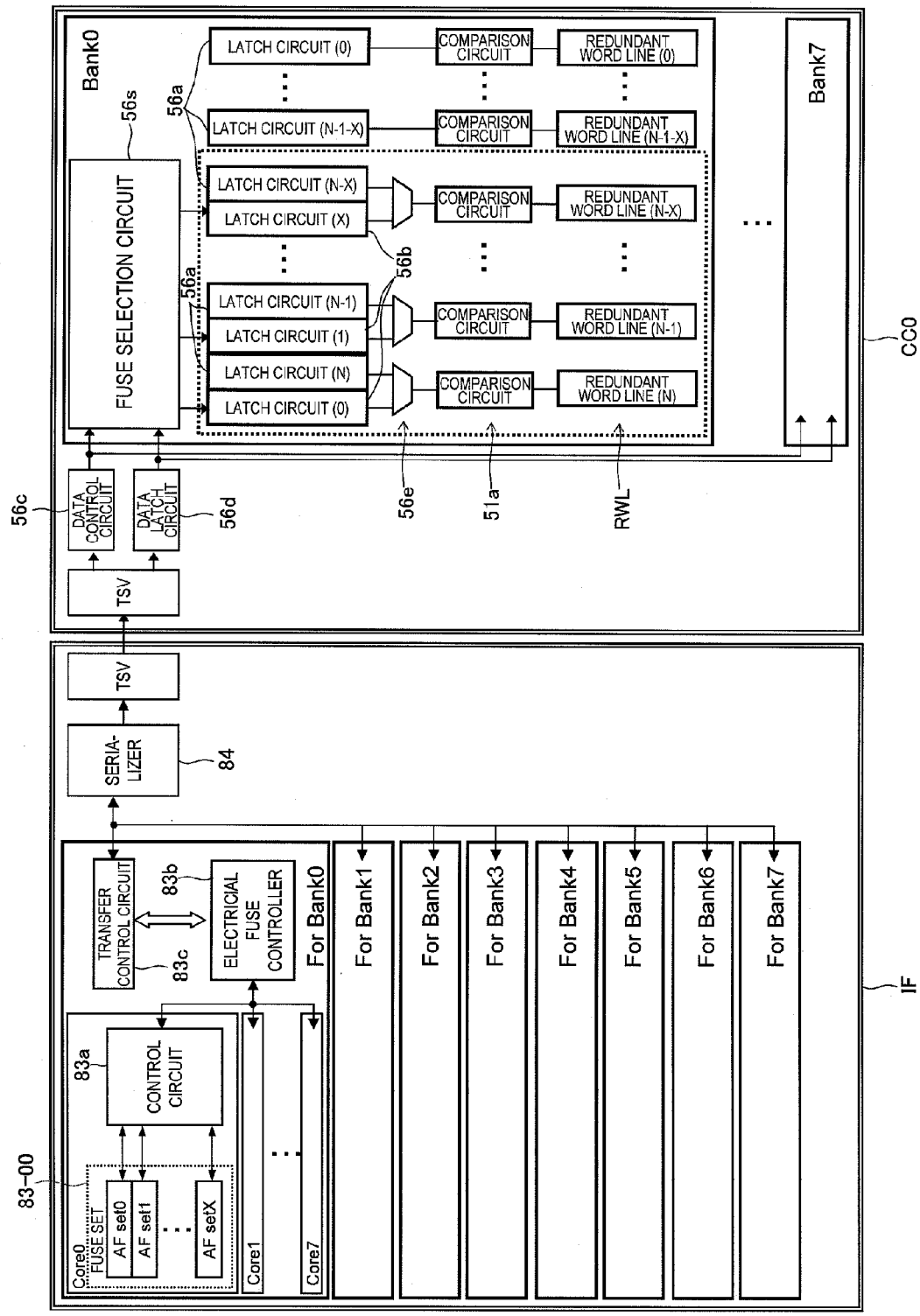
FIG. 37 is a block diagram indicative of the configuration of the electrical fuse circuit 83 and the defective address latch circuit 56 in more detail.

As has been described, the electrical fuse circuit 83 is divided into the electrical fuse circuits 83-0 to 83-7 by bank. The electrical fuse circuits 83-0 to 83-7 each include a plurality of fuse sets 83-00 to 83-07 which are allocated to the core chips CC0 to CC7, respectively. Turning to FIG. 37, the electrical fuse set 83-00 includes (X+1) fuse sets, whereby (X+1) row addresses (or column addresses) can be stored.

As shown in FIG. 37, each defective address latch circuit 56 includes (N+1) latch circuits 56a and (X+1) latch circuits 56b. The (N+1) latch circuits 56a correspond to zeroth to Nth optical fuse sets, respectively. Of these, the latch circuits 56a corresponding to the zeroth to (N−1−X)th optical fuse sets have no latch circuit 56b to be paired with, and thus have no corresponding select circuit 56e.

On the other hand, the latch circuits 56a corresponding to the zeroth to (N−X)th optical fuse sets have latch circuits 56b to be paired with. Specifically, the latch circuits 56b corresponding to the Xth to zeroth electrical fuse sets are allocated to the zeroth to (N−X)th optical fuse sets, respectively. Select circuits 56e are provided for such latch circuits 56a and 56b, so that the outputs of either ones of the latch circuits 56a and 56b are selected. Replacement data transferred from the interface chip IF is latched into specified latch circuits 56b under the control of a fuse select circuit 56s.

The outputs of the latch circuits 56a and 56b are supplied to the address comparison circuits 51a. If an output matches an access-request address, the corresponding redundant word line RWL is accessed.

Figure 38:
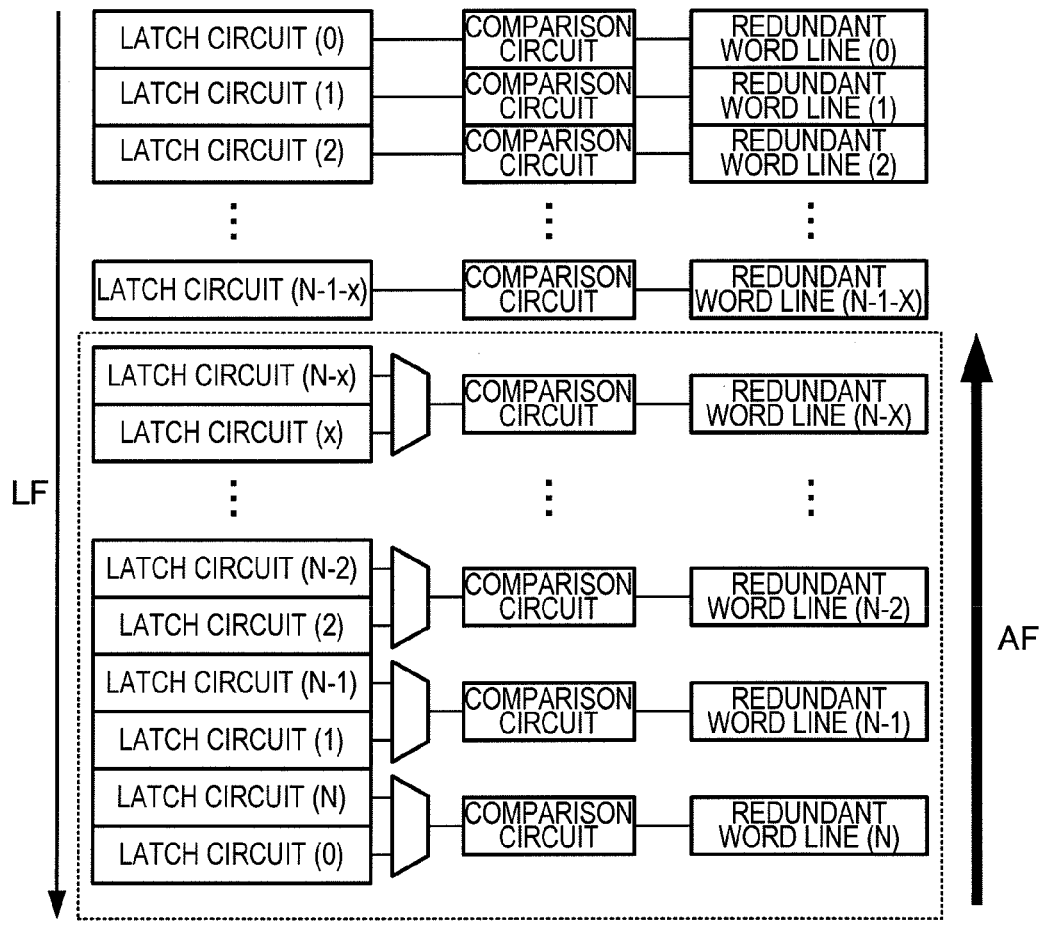
FIG. 38 is a diagram for explaining a relationship between order of selection of optical fuse circuits 55 and order of selection of the electrical fuse circuit 83.

As has been described, the optical fuse circuits are programmed in step S51 shown in FIG. 30. The electrical fuse circuit 83 is programmed in steps S56 and S58 shown in FIG. 30. That is, the optical fuse circuits 55 are programmed first, and fuse sets remaining unused in step S11 are used by the electrical fuse circuit 83 for alternative use. In such a configuration, no conflict is allowed between the redundant word lines that are selected by the optical fuse circuits 55 and the redundant word lines that are selected by the electrical fuse circuit 83. In order to avoid such a conflict and in order for the electrical fuse circuit 83 to use the remaining fuse sets for alternative use more efficiently, the present embodiment is configured so that, as shown in FIG. 38, the optical fuse circuits 55 are programmed by using the optical fuse sets from the zeroth in succession (arrow LF). On the other hand, the electrical fuse circuit 83 is programmed by using the electrical fuse sets from the zeroth, which is paired with the Nth optical fuse set, in succession (arrow AF). This makes it possible for the electrical fuse circuit 83 to efficiently use the remaining fuse sets for alternative use.

Figure 39:
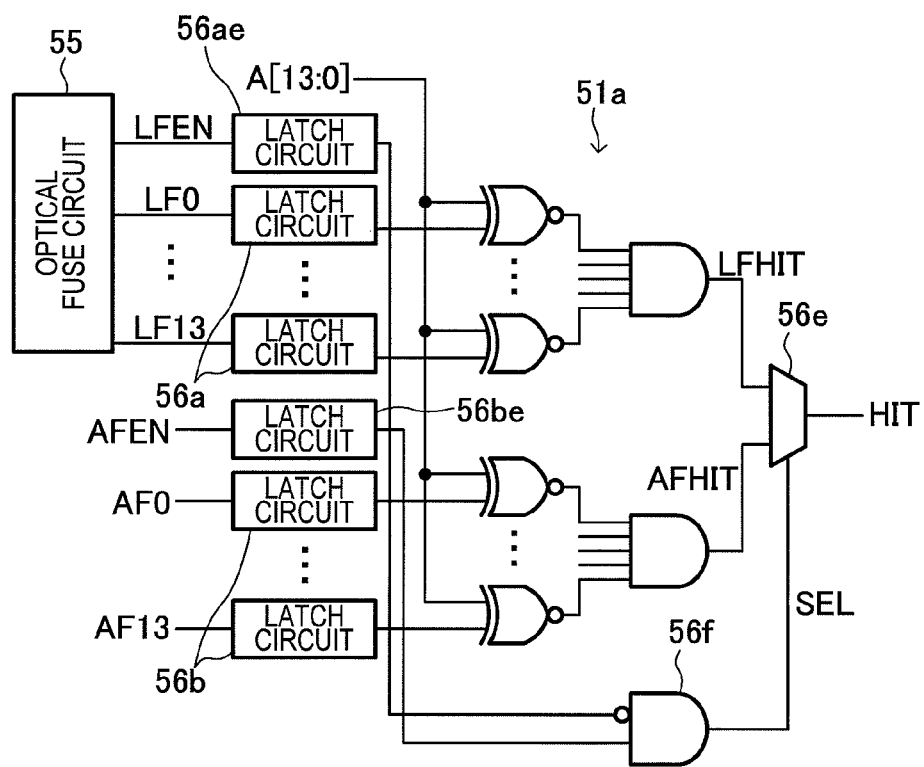
FIG. 39 is a circuit diagram indicative of an example of an address comparison circuit 51a and a select circuit 56e.

Turning to FIG. 39, the circuit example is suitably applied to the row side. The circuit example shown in FIG. 43 includes 14 latch circuits 56a and 14 latch circuits 56b which correspond to the bits A0 to A13 of a row address, respectively. The outputs of the latch circuits are compared with the respective corresponding bits of the row address by the EXNOR circuits. The outputs of the EXNOR circuits corresponding to the latch circuits 56a are collected by an AND gate circuit and output as an optical fuse hit signal LFHIT. Similarly, the outputs of the EXNOR circuits corresponding to the latch circuits 56b are collected by an AND gate circuit and output as an electrical fuse hit signal AFHIT.

The optical fuse hit signal LFHIT and the electrical fuse hit signal AFHIT are supplied to the select circuit 56e, and either one of the signals is selected by a select signal SEL. The signal selected is output as a redundancy determination signal HIT. The select signal SEL is generated by an AND gate circuit 56f. The AND gate circuit 56f is supplied with the output of a latch circuit 56ae that latches an optical fuse enable signal LFEN, and the output of a latch circuit 56be that latches an electrical fuse enable signal AFEN. The electrical fuse enable signal AFEN indicates whether the corresponding electrical fuse set is enabled or not, i.e., whether used or not. The optical fuse enable signal LFEN indicates whether the corresponding optical fuse set is enabled or not, i.e., whether used or not.

The optical fuse enable signal LFEN turns to a high level when the optical fuse set is used. The electrical fuse enable signal AFEN turns to a high level when the electrical fuse set is used. Consequently, when the optical fuse set is in use, the select signal SEL remains at a low level. In such a case, the select circuit 56e selects the optical fuse hit signal LFHIT. On the other hand, when the optical fuse set is not in use and the electrical fuse set is in use, the select signal SEL turns to a high level and the select circuit 56e selects the electrical fuse hit signal AFHIT.

Figure 40:
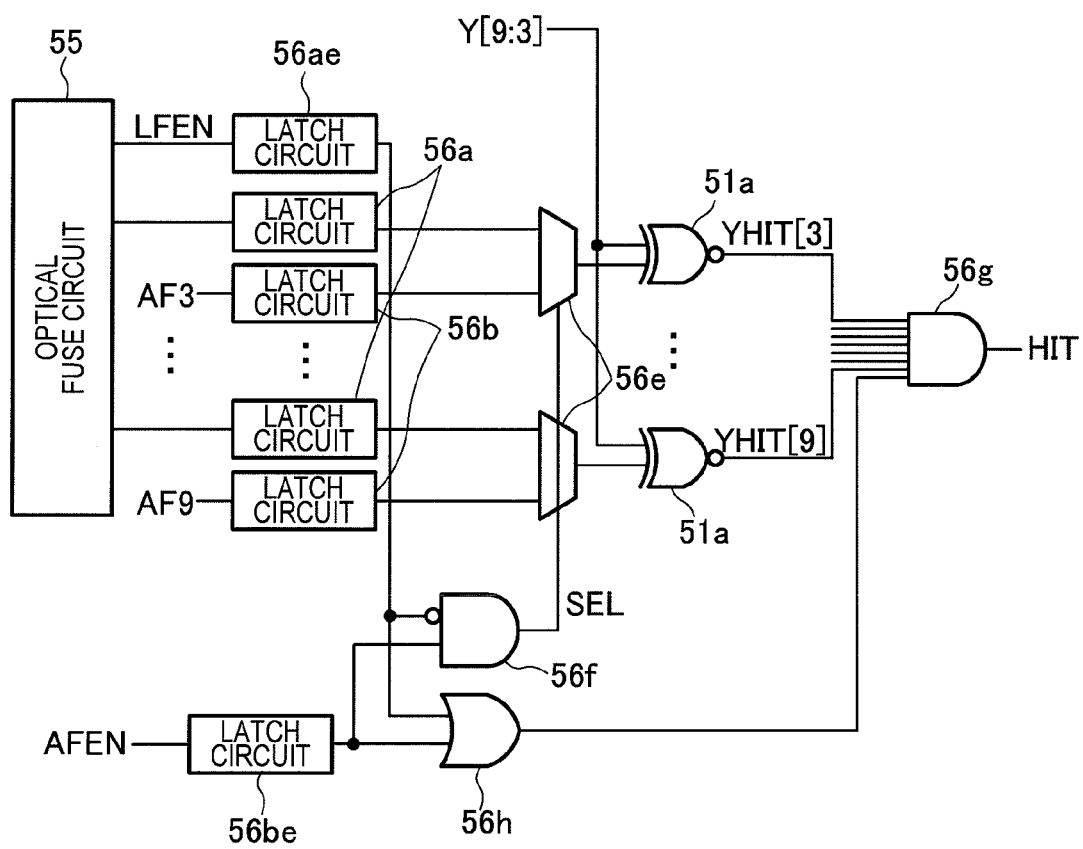
FIG. 40 is a circuit diagram indicative of another example of the address comparison circuit 51a and the select circuit 56e.

Turning to FIG. 40, the circuit example is suitably applied to the column side. The circuit example shown in FIG. 40 includes seven latch circuits 56a and seven latch circuits 56b which correspond to the bits Y3 to Y9 of a column address, respectively. Unlike the circuit example shown in FIG. 39, the select circuit 56e is provided for each bit. The outputs of the seven select circuits 56e are compared with the respective corresponding bits by the EXNOR circuits. The outputs of the EXNOR circuits are collected by an AND gate circuit 56g and output as a redundancy determination signal HIT.

The select signal SEL is supplied in common to the seven select circuits 56e. The select signal SEL is generated by the AND gate circuit 56f. As has been described with reference to FIG. 39, the select signal SEL remains at the low level when the optical fuse set is in use. In such a case, the select circuits 56e select the optical-fuse side. On the other hand, when the optical fuse set is not in use and the electrical fuse set is in use, the select signal SEL turns to the high level and the select circuits 56e select the electrical-fuse side.

The output of the latch circuit 56ae that latches the optical fuse enable signal LFEN and the output of the latch circuit 56be that latches the electrical fuse enable signal AFEN are supplied to an OR gate circuit 56h. The output of the OR gate circuit 56h is input to the AND gate circuit 56g. Consequently, when neither of the optical fuse set and the electrical fuse set is in use, the redundancy determination signal HIT is fixed to an inactive state.

It is apparent that the present invention is not limited to the above embodiments, but may be modified and changed without departing from the scope and spirit of the invention.

The technical concept of the present invention may be applied to a semiconductor device that includes a core chip or core chips pertaining to volatile and nonvolatile memory cells and an interface chip for controlling the core chip(s). It should be noted that the forms of the circuits in the circuit blocks disclosed in the drawings and other circuits for generating control signals are not limited to the circuit forms disclosed in the embodiment.

The technical concept of the voltage level shift circuit of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
    a memory cell array;
    a redundancy circuit that replaces defective memory cells included in the memory cell array;
    an electrical fuse circuit that stores addresses of at least part of the defective memory cells;
    a data determination circuit that activates a determination signal when test data read from the memory cell array is incorrect; and
    an analysis circuit that supplies, in a first operation mode when the determination signal is activated, an address of the test data to the electrical fuse circuit and supplies, in a second operation mode when a select signal supplied from outside is activated irrespective of the determination signal, the address of the test data to the electrical fuse circuit,
    wherein an access speed during the first operation mode is less than an access speed during the second operation mode.

2. The semiconductor device as claimed in claim 1, further comprising an optical fuse circuit that stores addresses of at least other part of defective memory cells.

3. The semiconductor device as claimed in claim 2, wherein
    the memory cell array includes a plurality of word lines and a plurality of bit lines, and
    the redundancy circuit replaces defective memory cells in units of word line or bit line.

4. The semiconductor device as claimed in claim 3, wherein the analysis circuit, in the first operation mode, analyzes the address of the test data and updates error pattern information and error address information to identify a word line or a bit line to replace each time the determination signal is activated, the error pattern information indicating relative arrangement relationship of one or more defective memory cells, the error address information indicating an address of at least a part of the defective memory cells.

5. The semiconductor device as claimed in claim 2, wherein
    the memory cell array, the redundancy circuit, the optical fuse circuit, and the data determination circuit are integrated in a memory chip,
    the analysis circuit and the electrical fuse circuit are integrated in a control chip, and
    the memory chip and the control chip are stacked and packaged in a same package.

6. The semiconductor device as claimed in claim 5, wherein
    the package packs a plurality of the memory chips,
    at least one of the memory chips includes a plurality of through silicon vias, and
    the plurality of memory chips are electrically connected in common to the control chip through the through silicon vias.

7. The semiconductor device as claimed in claim 6, wherein
    the control chip includes a transfer circuit that transfers the addresses stored in the electrical fuse circuit to the plurality of memory chips through the through silicon vias, and
    each of the memory chips includes a select circuit that selects either the addresses read from the optical fuse circuit or the addresses transferred from the transfer circuit of the control chip.

8. A semiconductor device comprising:
    a memory cell array that includes a plurality of word lines including first to third defective word lines, a plurality of bit lines including first to third defective bit lines, a plurality of redundant word lines replacing the first to third defective word lines, and a plurality of redundant bit lines replacing the first to third defective bit lines;
    an optical fuse circuit that stores an address of the first defective word line and an address of the first defective bit line;
    an electrical fuse circuit that stores an address of the second defective word line and an address of the second defective bit line; and
    an analysis circuit that analyzes the addresses of the second defective word line and the second defective bit line based on test data read from the memory cell array with the first defective word line replaced with one of the redundant word lines and the first defective bit line replaced with one of the redundant bit lines,
    wherein the analysis circuit receives an address of the third defective word line or an address of the third defective bit line from outside and supplies the address of the third defective word line or an address of the third defective bit line to the electrical fuse circuit with the first and second defective word lines replaced with ones of the redundant word lines and the first and second defective bit lines replaced with ones of the redundant bit lines.

9. The semiconductor device as claimed in claim 8, wherein the third defective word line or the third defective bit line appears to be defective when the memory cell array is accessed at relatively high speed, and appears to be not defective when the memory cell array is accessed at relatively low speed.

10. A method of manufacturing a semiconductor device, comprising:
    performing a first operation test on a memory device formed on a semiconductor wafer;
    analyzing addresses of defective memory cells detected by the first operation test to identify first defective word lines and first defective bit lines;
    performing primary replacement to replace the first defective word lines and the first defective bit lines with first redundant word lines and first redundant bit lines, respectively;
    dicing the semiconductor wafer after performing the primary replacement to obtain a memory chip on which the memory device is integrated;
    packaging one or more semiconductor chips including at least the memory chip to obtain a packaged semiconductor device;
    performing a second operation test on the packaged semiconductor device;

analyzing addresses of defective memory cells detected by the second operation test to identify second defective word lines and second defective bit lines;

performing secondary replacement to replace the second defective word lines and the second defective bit lines with second redundant word lines and second redundant bit lines, respectively;

performing a third operation test on the packaged semiconductor device after performing the secondary replacement;

analyzing an address of a defective memory cell detected by the third operation test to identify a third defective word line or a third defective bit line; and performing tertiary replacement to replace the third defective word line or the third defective bit line with a third redundant word line or a third redundant bit line, respectively, wherein the addresses of the defective memory cells detected by the second operation test are analyzed by an analysis circuit integrated into the packaged semiconductor device, and the address of the defective memory cell detected by the third operation test is analyzed by an external tester connected to the packaged semiconductor device.

11. The method of manufacturing a semiconductor device as claimed in claim 10, wherein the second operation test is performed by accessing at relatively low speed, and the third operation test is performed by accessing at relatively high speed.

12. The method of manufacturing a semiconductor device as claimed in claim 10, wherein, in the analyzing the addresses of the defective memory cells detected by the second operation test, error pattern information and error address information are updated each time the defective memory cell is detected, the error pattern information indicating layout of defective memory cells, the error address information indicating addresses of at least a part of the defective memory cells.

13. A semiconductor device comprising:

a memory cell array;

a redundancy circuit that replaces defective memory cells included in the memory cell array;

an electrical fuse circuit that stores addresses of at least part of the defective memory cells;

a data determination circuit that activates a determination signal when test data read from the memory cell array is incorrect;

an analysis circuit that supplies, in a first operation mode when the determination signal is activated, an address of the test data to the electrical fuse circuit and supplies, in a second operation mode when a select signal supplied from outside is activated irrespective of the determination signal, the address of the test data to the electrical fuse circuit; and an optical fuse circuit that stores addresses of at least other part of defective memory cells, wherein the memory cell array, the redundancy circuit, the optical fuse circuit, and the data determination circuit are integrated in a memory chip, the analysis circuit and the electrical fuse circuit are integrated in a control chip, and0 the memory chip and the control chip are stacked and packaged in a same package.

* * * * *